United States Patent
Wachi et al.

(10) Patent No.: US 6,830,863 B2
(45) Date of Patent: Dec. 14, 2004

(54) MULTICOLOR IMAGE-FORMING MATERIAL AND METHOD FOR FORMING MULTICOLOR IMAGE

(75) Inventors: Naotaka Wachi, Shizuoka (JP);
Akihiro Shimomura, Shizuoka (JP);
Kazuhito Miyake, Shizuoka (JP);
Yasutomo Goto, Shizuoka (JP);
Mitsuru Yamamoto, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/054,891

(22) Filed: Jan. 25, 2002

(65) Prior Publication Data

US 2002/0177062 A1 Nov. 28, 2002

(30) Foreign Application Priority Data

| Jan. 25, 2001 | (JP) | ................................ P.2001-017018 |
| Mar. 15, 2001 | (JP) | ................................ P.2001-074274 |
| Mar. 19, 2001 | (JP) | ................................ P.2001-079362 |
| Mar. 19, 2001 | (JP) | ................................ P.2001-079364 |
| Jan. 16, 2002 | (JP) | ................................ P.2002-007637 |

(51) Int. Cl.$^7$ .............................. G03F 7/34; G03F 9/00
(52) U.S. Cl. ..................... 430/200; 430/201; 430/952
(58) Field of Search .............................. 430/200, 201, 430/271.1, 952

(56) References Cited

U.S. PATENT DOCUMENTS

| 5,053,381 | A |  | 10/1991 | Chapman et al. |
| 5,126,760 | A |  | 6/1992 | DeBoer |
| 5,300,398 | A |  | 4/1994 | Kaszczuk |
| 5,352,562 | A | * | 10/1994 | Takahashi et al. .......... 430/253 |
| 5,512,931 | A |  | 4/1996 | Nakajima et al. |
| 5,580,693 | A |  | 12/1996 | Nakajima et al. |
| 5,593,808 | A |  | 1/1997 | Ellis |
| 5,611,881 | A |  | 3/1997 | Kimura et al. |
| 5,935,902 | A | * | 8/1999 | Imamura ..................... 430/200 |
| 6,027,850 | A | * | 2/2000 | Kawakami et al. .......... 430/200 |
| 6,235,445 | B1 | * | 5/2001 | Nakamura et al. .......... 430/200 |
| 6,326,121 | B1 | * | 12/2001 | Takahashi .................... 430/200 |
| 6,458,504 | B2 | * | 10/2002 | Wachi et al. ................ 430/200 |
| 6,468,634 | B1 | * | 10/2002 | Miyake et al. ............... 428/195 |
| 2002/0009664 | A1 | * | 1/2002 | Wachi et al. ................ 430/200 |
| 2002/0187418 | A1 | * | 12/2002 | Nakamura et al. .......... 430/200 |

FOREIGN PATENT DOCUMENTS

| JP | 4-296594 |  | 10/1992 |
| JP | 5-286257 |  | 11/1993 |
| JP | 11-321099 |  | 11/1999 |
| JP | 11-334230 |  | 12/1999 |
| JP | 2000-71634 |  | 3/2000 |
| JP | 2000-168252 |  | 6/2000 |
| JP | 2000-225776 | A | 8/2000 |
| JP | 2000-338652 | A | 12/2000 |
| JP | 2000-351279 | A | 12/2000 |
| JP | 2001/355177 | * | 12/2000 |
| JP | 2001-10244 |  | 1/2001 |
| JP | 2001/310491 | * | 11/2001 |
| JP | 2001/328287 | * | 11/2001 |

* cited by examiner

Primary Examiner—Richard L. Schilling
(74) Attorney, Agent, or Firm—Sughrue Mion, PLLC

(57) ABSTRACT

A multicolor image-forming material comprises: an image-receiving sheet having an image-receiving layer; and at least four thermal transfer sheets each including a support, a light-to-heat converting layer and an image-forming layer, in which each of the thermal transfer sheets has a different color, wherein an image is formed by: superposing the image-forming layer in each of the at least four thermal transfer sheets on the image-receiving layer in the image-receiving sheet, in which the image-forming layer is opposed to the image-receiving layer; irradiating the image-forming layer in the thermal transfer sheet with a laser beam; and transferring the irradiated area of the image-forming layer onto the image-receiving layer in the image-receiving sheet, and each of the light-to-heat converting layers in the at least four thermal transfer sheets has a ratio of an optical density (OD) to a layer thickness: OD/layer thickness ($\mu$m unit) of 0.57 or more.

32 Claims, 11 Drawing Sheets

ENLARGED VIEW OF DOTS IN PRINTED MATTER

MULTICOLOR IMAGE-FORMING MATERIAL AND METHOD FOR FORMING MULTICOLOR IMAGE

FIELD OF THE INVENTION

The present invention relates to a multicolor image-forming material for forming a full color image of high definition with a laser beam, and a method for forming a multicolor image. In particular, the present invention relates to a multicolor image-forming material which is useful for forming a color proof (DDCP: direct digital color proof) or a mask image from digital image signals by laser recording in the field of printing, and a method for forming a multicolor image.

BACKGROUND OF THE INVENTION

In the field of graphic arts, printing of a printing plate is performed by using a set of color separation films formed from a color original by lith films. In general, color proofs are formed from color separation films before real printing work for checking an error in the color separation step and the necessity for color correction. Color proofs are desired to realize high definition which makes it possible to surely reproduce a half tone image and have performances such as high stability of processing. Further, for obtaining color proofs closely approximating to an actual printed matter, it is preferred to use the materials which are used in actual printing as the materials for making color proofs, e.g., the actual printing paper as the substrate and the actual pigments as the coloring materials. As the method for forming color proofs, a dry method not using a developing solution is strongly desired.

As the dry method for forming color proofs, a recording system of directly forming color proofs from digital signals has been developed with the spread of electronized system in preprocessing of printing (pre-press field) in recent years. Such electronized system aims at forming in particular high quality color proofs, generally reproduces a dot image of 150 lines/inch or higher. For recording a proof of high image quality from digital signals, laser beams capable of modulation by digital signals and capable of finely diaphragming recording light are used as recording heads. Therefore, the development of an image-forming material having high recording sensitivity to laser beams and exhibiting high definition property capable of reproducing highly minute dots is required.

As the image-forming material for use in a transfer image-forming method using laser beams, a heat fusion transfer sheet comprising in the order of a support having a light-to-heat converting layer which absorbs laser beams and generates heat, and an image-forming layer which contains a pigment dispersed in components such as a heat fusion type wax and a binder is known (JP-A-5-58045 (the term "JP-A" as used herein means an "unexamined published Japanese patent application")). In the image-forming method using such an image-forming material, an image-forming layer corresponding to the area of a light-to-heat converting layer irradiated with laser beams is fused by heat generated in that area and transferred onto an image-receiving sheet arranged on the transfer sheet by lamination, thus a transferred image is formed on the image-receiving sheet.

Further, a heat transfer sheet (thermal transfer sheet) comprising a support having provided thereon a light-to-heat converting layer containing a light-to-heat converting material, an extremely thin heat-releasing layer (from 0.03 to 0.3 μm), and an image-forming layer containing a coloring material in this order is disclosed in JP-A-6-219052. In this heat transfer sheet, the bonding strength between the image-forming layer and the light-to-heat converting layer bonded through the intervening heat-releasing layer is reduced by laser beam irradiation, as a result, a highly minute image is formed on an image-receiving sheet arranged on the heat transfer sheet by lamination. The image-forming method by the heat transfer sheet utilizes so-called ablation, specifically the heat-releasing layer partially decomposes at the area irradiated with laser beams and vaporizes, thereby the bonding strength of the image-forming layer and the light-to-heat converting layer at that area is reduced and the image-forming layer at that area is transferred to the image-receiving sheet laminated thereon.

These image-forming methods have various advantages that an actual printing paper provided with an image-receiving layer (an adhesion layer) can be used as the material of an image-receiving sheet and a multicolor image can be easily obtained by transferring images different in colors in sequence on the image-receiving sheet, in particular, the image-forming method utilizing ablation has the advantage that highly minute image can be easily obtained, and so these methods are useful for forming a color proof (DDCP: direct digital color proof) or a highly minute mask image.

DTP is prevailing more and more and the intermediate process using films is omitted when CTP (computer to plate) is used, and the need for proof is shifting from analog proof to DDCP. In recent years the demand for large sized high grade DDCP highly stable and excellent in coincidence in printing has increased. High definition printing can be effected according to a heat transfer method by laser irradiation, and as the laser heat transfer methods, (1) a laser sublimation method, (2) a laser ablation method, and (3) a laser fusion method are conventionally used, but any of these methods has a drawback such that the shape of a recorded dots are not sharp. In (1) a laser sublimation method, since dyes are used as the coloring material, the approximation of proofs to printed matters is not sufficient, further, since this is a method of sublimating coloring materials, the outline of a dot is fuzzy, and so definition is not sufficiently high. On the other hand, since pigments are used as the coloring materials in (2) a laser ablation method, the approximation to printed matters is good, but since this is a method of sputtering coloring materials, the outline of a dot is also fuzzy as in the sublimation method, and so definition is not sufficiently high. Further, in (3) a laser fusion method, a molten substance flows, and so the outline of a dot is not also clear.

SUMMARY OF THE INVENTION

Accordingly, the subject of the present invention is to solve the above-described problems of the prior art techniques and to accomplish the following objects. That is, an object of the present invention is to provide a large sized high grade DDCP which is highly stable and excellent in coincidence in printing. Specifically, the present invention is characterized in that: 1) a heat transfer sheet is a membrane of coloring material which is not influenced by light sources of illumination as compared with pigment material and printed matters, and excellent in sharpness of dots and stability, 2) an image-receiving sheet can surely receive the image-forming layer in a heat transfer sheet by laser energy, 3) transfer to actual printing paper can be effected corresponding to the range of at least from 64 to 157 g/m² such as art paper (coat paper), mat paper and finely coated paper, delicate texture can be imaged, and a high-key part can be reproduced accurately, and 4) extremely stable transfer releasability can be obtained. A further object of the present invention is to provide a method for forming a multicolor image which can form an image having good image quality and stable transfer image density on an image-receiving sheet even when recording is performed by multi-beam laser beams of high energy under different temperature conditions.

The present invention has been attained by the following means (1) to (46).

(1) A multicolor image-forming material comprising:
an image-receiving sheet having an image-receiving layer; and
at least four thermal transfer sheets each including a support, a light-to-heat converting layer and an image-forming layer, in which each of the thermal transfer sheets has a different color,
wherein an image is formed by: superposing the image-forming layer in each of the at least four thermal transfer sheets on the image-receiving layer in the image-receiving sheet, in which the image-forming layer is opposed to the image-receiving layer; irradiating the image-forming layer in each of the at least four thermal transfer sheets with a laser beam; and transferring the irradiated area of the image-forming layer onto the image-receiving layer in the image-receiving sheet, and
each of the light-to-heat converting layers in the at least four thermal transfer sheets has a ratio of an optical density (OD) to a layer thickness: OD/layer thickness (um unit) of 0.57 or more.

(2) The multicolor image-forming material as described in item (1), wherein the OD/layer thickness (um unit) is 1.95 or more.

(3) The multicolor image-forming material as described in item (1), wherein the OD/layer thickness ($\mu$m unit) is 4.01 or more.

(4) The multicolor image-forming material as described in item (1), wherein the light-to-heat converting layer contains a light-to-heat converting material and the light-to-heat converting material is at least one of an organic dye and a carbon black, in which the organic dye is selected from the group consisting of a cyanine dye, an anthraquinone dye, an azulene dye and a phthalocyanine dye.

(5) The multicolor image-forming material as described in item (4), wherein the cyanine dye is an indolenine dye.

(6) The multicolor image-forming material as described in item (4), wherein the organic dye has a structure represented by formula:

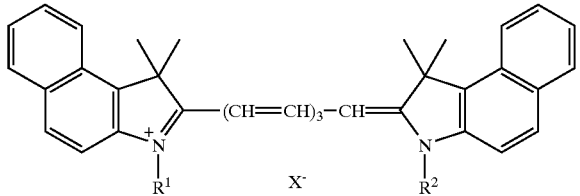

wherein $R^1$ and $R^2$, which are the same or different, each independently represents an alkyl group, an alkenyl group, or an aryl group; X represents an anion; and the naphthalene ring may be substituted or unsubstituted.

(7) The multicolor image-forming material as described in item (1), wherein the at least four thermal transfer sheets have four or more colors including yellow, magenta, cyan and black, and each of the at least four thermal transfer sheets has a different color, and each of the light-to-heat converting layers in the at least four thermal transfer sheets has a different optical density per the light-to-heat converting layer, in which each of the light-to-heat converting layers in the at least four thermal transfer sheets each having a different color has the same optical density per unit thickness of the light-to-heat converting layer and has a different layer thickness.

(8) The multicolor image-forming material as described in item (7), wherein each of the light-to-heat converting layers in the at least four thermal transfer sheets each having a different color is formed with the same coating solution.

(9) The multicolor image-forming material as described in item (7), wherein the light-to-heat converting layer in the black thermal transfer sheet has the lowest optical density in the at least four thermal transfer sheets.

(10) The multicolor image-forming material as described in item (7), wherein the image-receiving sheet includes a support, and each of the light-to-heat converting layers in the at least four thermal transfer sheets each having a different color contains a matting agent in a different amount.

(11) The multicolor image-forming material as described in item (10), wherein each of the light-to-heat converting layers in the at least four thermal transfer sheets each having a different color has the same content of the matting agent per unit thickness of the light-to-heat converting layer and has a different layer thickness.

(12) The multicolor image-forming material as described in item (10), wherein each of the light-to-heat converting layers in the at least four thermal transfer sheets each having a different color is formed with the same coating solution.

(13) The multicolor image-forming material as described in item (10), wherein the light-to-heat converting layer in the black thermal transfer sheet has the lowest content of the matting agent in the at least four thermal transfer sheets.

(14) The multicolor image-forming material as described in item (7), wherein the light-to-heat converting layer has an optical density of from 0.80 to 1.49 at peak wavelength of the laser beam.

(15) The multicolor image-forming material as described in item (7), wherein the light-to-heat converting layer contains a light-to-heat converting agent and the light-to-heat converting agent is a compound other than carbon black, graphite and colloidal silver.

(16) The multicolor image-forming material as described in item (15), wherein the light-to-heat converting agent is a cyanine dye.

(17) The multicolor image-forming material as described in item (1), wherein the light-to-heat converting layer contains a light-to-heat converting material and a resin, and the half value width of the maximum absorbance at wavelength of 700 to 1,200 nm of the light-to-heat converting layer is 200 nm or less.

(18) The multicolor image-forming material as described in item (17), wherein the thermal transfer sheet includes an intermediate layer between the light-to-heat converting layer and the image-forming layer.

(19) The multicolor image-forming material as described in item (17), wherein the light-to-heat converting material is an infrared absorbing dye.

(20) The multicolor image-forming material as described in item (19), wherein the infrared absorbing dye is a cyanine dye.

(21) The multicolor image-forming material as described in item (17), wherein irradiation is performed with a laser having an output of 50 mW or more at linear velocity of 7 m/s or more.

(22) The multicolor image-forming material as described in item (1), wherein each of the light-to-heat converting layer and the image-forming layer contains a water-insoluble resin and the recorded image has a resolution of 2,400 dpi or more.

(23) The multicolor image-forming material as described in item (22), wherein the resin in the light-to-heat converting layer is soluble in a hydrophobic solvent having an SP value of from 16 to 22.

(24) The multicolor image-forming material as described in item (22), wherein the resin in the image-forming layer is soluble in a nonaqueous solvent having an SP value of from 16 to 30.

(25) The multicolor image-forming material as described in item (22), wherein a hydrophobic solvent is used for dissolving the resin when the light-to-heat converting layer is provided, and a nonaqueous solvent is used for solving the resin when the image-forming layer is provided.

(26) The multicolor image-forming material as described in item (22), wherein the light-to-heat converting material in the light-to-heat converting layer has the solubility of 1 weight % or less in a coating solvent for forming the image-forming layer.

(27) The multicolor image-forming material as described in item (22), wherein the resin in the light-to-heat converting layer has the solubility of 1 weight % or less in a coating solvent for forming the image-forming layer.

(28) The multicolor image-forming material as described in item (22), wherein the resin in the light-to-heat converting layer has the solubility of 0.1 weight % or more in the coating solvent for forming the light-to-heat converting layer.

(29) The multicolor image-forming material as described in item (22), wherein the light-to-heat converting material has the solubility of 0.1 weight % or more in the coating solvent for forming the light-to-heat converting layer.

(30) The multicolor image-forming material as described in item (22), wherein the light-to-heat converting material is an infrared absorbing dye.

(31) The multicolor image-forming material as described in item (22), wherein the resin of the image-forming layer has the solubility of 0.1 weight % or more in the coating solvent for forming the image-forming layer.

(32) The multicolor image-forming material as described in item (22), wherein the thermal transfer sheet includes an intermediate layer between the light-to-heat converting layer and the image-forming layer.

(33) The multicolor image-forming material as described in item (1), wherein the transferred image has a resolution of 2,400 dpi or more.

(34) The multicolor image-forming material as described in item (33), wherein the transferred image has a resolution of 2,600 dpi or more.

(35) The multicolor image-forming material as described in item (1), wherein the recording area of the multicolor image is a size of 515 mm or more multiplying 728 mm or more.

(36) The multicolor image-forming material as described in item (35), wherein the recording area of the multicolor image is a size of 594 mm or more multiplying 841 mm or more.

(37) The multicolor image-forming material as described in item (1), wherein each of the image-forming layers in the at least four thermal transfer sheets has a ratio of an optical density (OD) to a layer thickness: OD/layer thickness ($\mu$m unit) of 1.50 or more.

(38) The multicolor image-forming material as described in item (37), wherein the OD/layer thickness ($\mu$m unit) is 1.80 or more.

(39) The multicolor image-forming material as described in item (38), wherein the OD/layer thickness (um unit) is 2.50 or more.

(40) The multicolor image-forming material as described in item (1), wherein the image-forming layer in each of the at least four thermal transfer sheets and the image-receiving layer in the image-receiving sheet each has a contact angle with water of from 7.0 to 120.0°.

(41) The multicolor image-forming material as described in item (1), wherein the ratio of an optical density (OD) of the image-forming layer in each of the at least four thermal transfer sheets to a thickness of the image-forming layer: OD/layer thickness ($\mu$m unit) is 1.80 or more and the image-receiving layer in the image-receiving sheet has a contact angle with water of 86° or less.

(42) A method for manufacturing the multicolor image-forming material as described in item (1), which comprises performing a successive coating.

(43) A method for forming a multicolor image, which comprises the steps of:

preparing: an image-receiving sheet having an image-receiving layer; and at least four thermal transfer sheets each including a support, a light-to-heat converting layer and an image-forming layer, in which each of the at least four thermal transfer sheets has a different color and each of the light-to-heat converting layers in the at least four thermal transfer sheets has a ratio of an optical density (OD) to a layer thickness: OD/layer thickness ($\mu$m unit) of 0.57 or more;

superposing the image-forming layer in each of the at least four thermal transfer sheets on the image-receiving layer in the image-receiving sheet, in which the image-forming layer is opposed to the image-receiving layer;

irradiating the image-forming layer in each of the at least four thermal transfer sheets from the side of the support with a laser beam; and transferring the irradiated area of the image-forming layer onto the image-receiving layer in the image-receiving sheet to record an image, wherein the irradiated area of the image-forming layer is transferred onto the image-receiving sheet in a thin film.

(44) The method for forming a multicolor image as described in item (43), wherein the laser beam is a semiconductor laser beam.

(45) The method for forming a multicolor image as described in item (43), wherein the laser beam comprises multi-beams of two-dimensional array.

(46) A method for preparing a color proof, which comprises:

preparing: an image-receiving sheet having an image-receiving layer; and at least four thermal transfer sheets each including a support, a light-to-heat converting layer and an image-forming layer, in which each of the at least four thermal transfer sheets has a different color and each of the light-to-heat converting layers in the at least four thermal transfer sheets has a ratio of an optical density (OD) to a layer thickness: OD/layer thickness ($\mu$m unit) of 0.57 or more;

superposing the image-forming layer in each of the at least four thermal transfer sheets on the image-receiving layer in the image-receiving sheet, in which the image-forming layer is opposed to the image-receiving layer;

irradiating the image-forming layer in each of the at least four thermal transfer sheets from the side of the support with a laser beam;

transferring the irradiated area of the image-forming layer onto the image-receiving layer in the image-receiving sheet to record a full color image, wherein the irradiated area of the image-forming layer is transferred onto the image-receiving sheet in a thin film; and transferring the full color image on the image-receiving layer onto an actual printing paper.

DESCRIPTION OF REFERENCE CHARACTERS

Figure 1:
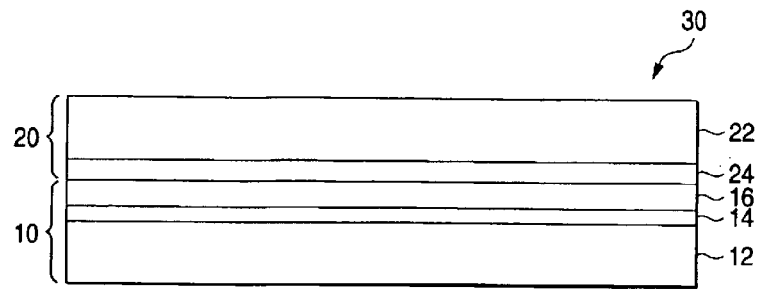
FIG. 1 is a drawing showing the scheme of multicolor image-forming by membrane heat transfer by a laser.
Figure 1:
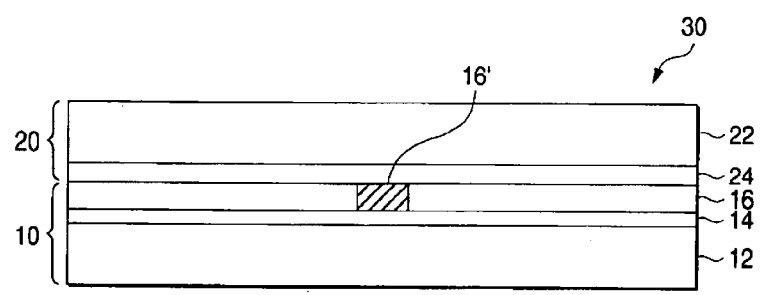
Figure 1:
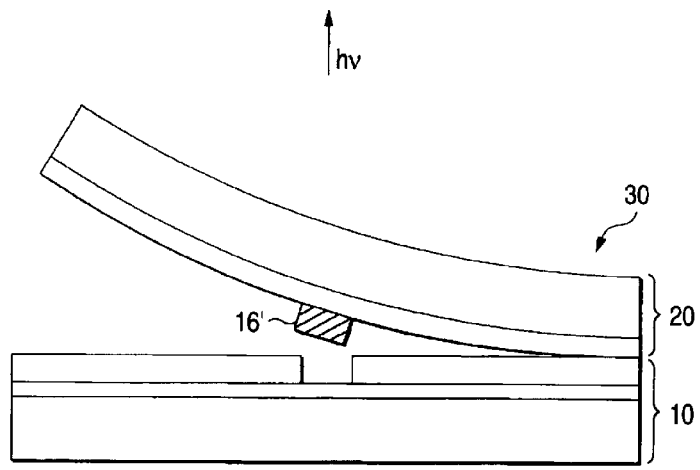

1: Recording unit
2: Recording head
3: By-scan rail
4: Recording drum
5: Heat transfer sheet-loading unit
6: Image-receiving sheet roll
7: Carrier roller
8: Squeeze roller
9: Cutter
10: Heat transfer sheet
10K, 10C, 10M, 107: Heat transfer sheet rolls
12: Support
14: Light-to-heat converting layer
16: Image-forming layer
20: Image-receiving sheet
22: Support for image-receiving sheet
24: Image-receiving layer
30: Laminate
31: Discharge platform
32: Discard port
33: Discharge port
34: Air
35: Discard box
42: Actual paper
43: Heat roller
44: Insert platform
45: Mark showing the position of placement
46: Insert roller
47: Guide made of heat resisting sheet
48: Releasing claw
49: Guide plate
50: Discharge port

DETAILED DESCRIPTION OF THE INVENTION

As a result of eager investigation to provide a B2/ A2 to B1/A1 or larger sized high grade DDCP which is highly stable and excellent in coincidence in printing, the present inventors have developed a heat transfer recording system by laser irradiation for DDCP which comprises an image-forming material of B2 size or larger having performances of transfer to actual printing paper, reproduction of actual dots and of a pigment type, output driver, and high grade CMS software.

The characteristics of the heat transfer recording system by laser irradiation which has been developed by the present inventors, the constitution of the system and the outline of technical points are as follows. As the characteristic performances, (1) since the dot shapes are sharp, dots which are excellent in approximation to the printed matter can be reproduced, (2) the approximation of hue to the printed matter is good, and (3) since the recorded quality is hardly influenced by the environmental temperature and humidity and repeating reproducibility is good, a stable proof can be formed. The technical points of the material capable of obtaining such characteristic performances are the establishment of the technique of membrane transfer, and the improvement of the retentivity of vacuum adhesion of the material required of a laser heat transfer system, following up of high definition recording, and the improvement of heat resistance. Specifically, (1) thinning of a light-to-heat converting layer by the introduction of an infrared absorbing dye, (2) strengthening of the heat resistance of a light-to-heat converting layer by the introduction of a polymer having a high Tg, (3) stabilization of hue by the introduction of a heat resisting pigment, (4) control of the adhesive strength and the cohesive strength of the material by the addition of low molecular weight components, such as a wax and an inorganic pigment, and (5) the provision of vacuum adhesion property to the material not being accompanied by the deterioration of an image quality by the addition of a matting agent to a light-to-heat converting layer, can be exemplified. As the technical points of the system, (1) carrying by air for continuous accumulation of multi sheets of film in a recording unit, (2) insert of a heat transfer unit on an actual paper for reducing curling after transfer, and (3) connection of output driver of a wide use having system connecting extendability, can be exemplified. The laser irradiation heat transfer recording system developed by the present inventors consists of diverse characteristics, system constitution and technical points as described above, but these are exemplifications and the present invention is not limited thereto.

The present inventors have performed development of the laser irradiation heat transfer recording system on the basis of thoughts that individual material, each coating layer such as a light-to-heat converting layer, a heat transfer layer and an image-receiving layer, and each heat transfer sheet (thermal transfer sheet) and image-receiving sheet are not present individually separately but they must function organically and synthetically, further these image-forming materials exhibit the highest possible performances when combined with a recording unit and a heat transfer unit. The present inventors have sufficiently examined each coating layer and the constituting materials of an image-forming material and prepared each coating solution bringing out the best of their characteristics to make the image-forming material, and found proper ranges of various physical properties so that the image-forming material can exhibit the best performance. As a result, the relationships between each material, each coating layer and each sheet with the physical properties have been investigated thoroughly, and by functioning them organically and synthetically with the recording unit and the heat transfer unit, a high performance image-forming material could be found unexpectedly. The present invention is important invention such that the positioning is directly related to item (1) thinning of a light-to-heat converting layer by the introduction of an infrared absorbing dye as described above in the technical points of the material in the system developed by the present inventors.

The present invention relates to a heat transfer multicolor image-forming material by laser irradiation (hereinafter also referred to as an image-forming material) which is preferably used in the above system.

An image-forming material comprises a heat transfer sheet and an image-receiving sheet.

The present invention restricts the ratio of the optical density ($OD_{LH}$) of the light-to-heat converting layer in the heat transfer sheet to the layer thickness of the light-to-heat converting layer ($T_{LH}$), $OD_{LH}/T_{LH}$ ($\mu$m unit) to 0.57 or more, preferably 1.95 or more, and more preferably 4.01 or more. The upper limit of $OD_{LH}/T_{LH}$ is not particularly limited but the larger, the more preferred. Taking the balance with other characteristics into consideration, the limit is about 10.

$OD_{LH}$ means the absorbance of the light-to-heat converting layer at peak wavelength of the laser beams to be used when the image-forming material of the present invention is subjected to recording, and $OD_{LH}$ can be measured with well-known spectrophotometers. UV-spectrophotometer UV-240 (manufactured by Shimadzu Seisakusho Co. Ltd.) was used in the present invention. The value obtained by subtracting the optical density of the support alone from the optical density including the support is taken as the above optical density ($OD_{LH}$). $T_{LH}$ is an average thickness of the values obtained by observing the cross section of the light-to-heat converting layer with a scanning electron microscope.

$OD_{LH}/T_{LH}$ concerns a heat conducting property at recording and which is a barometer largely affecting the temperature and humidity dependency of sensitivity and recording.

By restricting $OD_{LH}/T_{LH}$ within the above range in the present invention, the transfer sensitivity to the image-receiving sheet at recording time can be increased and at the same time the temperature dependency at recording time can be decreased.

That is, by setting $OD_{LH}/T_{LH}$ high, an image can be recorded to obtain a transferred image having definition of preferably 2,400 dpi or more, more preferably 2,600 dpi or more, with the recording area of a size of preferably 515 mm or more multiplying 728 mm or more, more preferably 594 mm or more multiplying 841 mm or more.

Further, when the light-to-heat converting layer has $OD_{LH}$ of from 0.80 to 1.49 to the peak wavelength of a laser beam, e.g., a beam having wavelength of 808 nm, transfer sensitivity of the image-forming layer is improved, more preferably the light-to-heat converting layer has $OD_{LH}$ of from 1.10 to 1.35. When the optical density at peak wavelength of laser beam is less than 0.80, irradiated light cannot be sufficiently converted to heat and sometimes transfer sensitivity is reduced. Contrary to this, when it exceeds 1.26, the function of the light-to-heat converting layer is affected and sometimes fog is generated.

The light-to-heat converting layer preferably has a thickness of from 0.03 to 1.0 $\mu$m, more preferably from 0.05 to 0.5 $\mu$m.

The ratio of the optical density ($OD_I$) of the image-forming layer in the heat transfer sheet to the layer thickness of the image-forming layer ($T_I$), $OD_I/T_I$ ($\mu$m unit) is preferably 1.5 or more, more preferably 1.8 or more, and especially preferably 2.50 or more. The upper limit of $OD_I/T_I$ is not particularly limited but the larger, the more preferred. Taking the balance with other characteristics into consideration, the limit is about 6.

$OD_I/T_I$ is a barometer of the transfer density of the image-forming layer and the definition of the transferred image. By restricting $OD_I/T_I$ within the above range in the present invention, an image having high transfer density and good definition can be obtained. Further, by thinning the image-forming layer, the hue reproduction can be improved.

$OD_I$ is the reflection optical density obtained by transferring the image having been transferred from a heat transfer sheet to an image-receiving sheet further to Tokuryo art paper, and measuring by color mode of each color such as yellow (Y), magenta (M), cyan (C) or black (K) with a densitometer (X-rite 938, manufactured by X-rite Co.).

It is preferred that the layer thickness of the image-forming layer in the black heat transfer sheet is larger than the layer thickness of each image-forming layer in yellow, magenta and cyan heat transfer sheets, preferably from 0.5 to 0.7 $\mu$m. By restricting the layer thickness of the image-forming layer in the black heat transfer sheet to this range, the reduction of density due to transfer unevenness can be prevented from occurring when irradiated with a laser beam.

By making the layer thickness of the image-forming layer in the black heat transfer sheet 0.5 $\mu$m or more, image density required as the proof of printing can be attained without generating transfer unevenness with maintaining image density when recording is performed by high energy. This tendency becomes more conspicuous under high humidity conditions, and so density variation due to circumferential conditions can be prevented. On the other hand, by making the layer thickness 0.7 $\mu$m or less, transfer sensitivity can be maintained at recording time by laser and touching of dots and fine lines can be improved. This tendency becomes more conspicuous under low humidity conditions. Definition can also be improved by the layer thickness of this range. The layer thickness of the image-forming layer in the black heat transfer sheet is more preferably from 0.55 to 0.65 μm and particularly preferably 0.60 μm.

Further, it is preferred that the layer thickness of the image-forming layer in the black heat transfer sheet is from 0.5 to 0.7 μm, and the layer thickness of each image-forming layer in yellow, magenta and cyan heat transfer sheets is 0.2 μm or more and less than 0.5 μm.

By making the layer thickness of each image-forming layer in yellow, magenta and cyan heat transfer sheets 0.2 μm or more, image density can be maintained without generating transfer unevenness when recording is performed by laser irradiation. On the other hand, when the layer thickness is 0.5 μm or less, transfer sensitivity and definition can be improved. The layer thickness of the image-forming layer in yellow, magenta and cyan heat transfer sheets is more preferably from 0.3 to 0.45 μm.

Further, the contact angle with water of the image-forming layer in each heat transfer sheet and the image-receiving layer in the image-receiving sheet is preferably from 7.0 to 120.0°. The contact angle is a barometer of the compatibility of the image-forming layer and the image-receiving layer, i.e., transferability, and the contact angle is more preferably from 30.0 to 100.0. Further, the contact angle with water of the image-receiving layer is more preferably 86° or less. With the above range of the contact angle, transfer sensitivity can be enhanced, and the temperature dependency of recording characteristics can be decreased.

The contact angle with water of each layer surface in the present invention is the value obtained by measuring by using contact angle meter CA-A (manufactured by Kyowa Kaimen Kagaku Co., Ltd.).

As described above, the present invention is characterized in that a large sized recording image can be formed by restricting $OD_{LH}/T_{LH}$ and $OD_I/T_I$ to the above range of the present invention. The recording area of the multicolor image is preferably a size of 515 mm or more multiplying 728 mm or more, more preferably 594 mm or more multiplying 841 mm or more. The size of the image-receiving sheet is 465 mm or more multiplying 686 mm or more.

A light-to-heat converting material is a material having a function of converting irradiated light energy to heat energy. A light-to-heat converting material is in general a dye (inclusive of a pigment, hereinafter the same) capable of absorbing a laser beam.

The light-to-heat converting materials which can be used in the present invention are not particularly limited so long as the light-to-heat converting layer has the above-described half value width, but when image-recording is performed by infrared laser irradiation, it is preferred to use an infrared absorbing dye as the light-to-heat converting material.

The solubility of the light-to-heat converting material in a coating solvent for forming an image-forming layer is preferably 1 mass % or less, and the solubility of the light-to-heat converting material in a coating solvent for forming a light-to-heat converting layer is preferably 0.1 mass % or more. When the solubility of the light-to-heat converting material in each coating solvent is within the above range, the migration of the light-to-heat converting material to the image-forming layer can be prevented at the time of image-forming layer coating. Further, in the present invention, "solubility" means the value at the time when the temperature of a solvent is 25° C.

As the examples of the dyes, black pigments, e.g., carbon black, pigments of macrocyclic compounds having absorption in the visible region to the near infrared region, e.g., phthalocyanine and naphthalocyanine, organic dyes which are used as the laser-absorbing material in high density laser recording such as photo-disc, e.g., a cyanine dye such as an indolenine dye, an anthraquinone dye, an azulene dye and a phthalocyanine dye, and organic metallic compound dyes, e.g., dithiol nickel complex, can be exemplified.

Of the above compounds, cyanine dyes are particularly preferably used, since they show a high absorption coefficient to the lights in the infrared region, and the thickness of a light-to-heat converting layer can be thinned when used as the light-to-heat converting material, as a result, the recording sensitivity of a heat transfer sheet can be further improved.

As the light-to-heat converting material, particulate metallic materials such as blackend silver and inorganic materials can also be used besides dyes.

An indolenine dye represented by the following formula is particularly preferred:

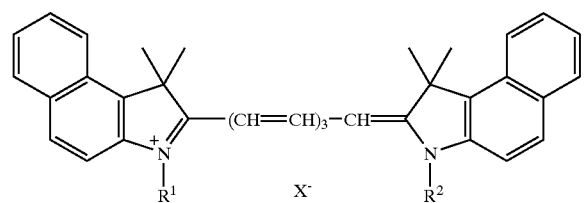

wherein $R^1$ and $R^2$, which may be the same or different, each represents an alkyl group, an alkenyl group, or an aryl group; X represents an anion; and the naphthalene ring may be substituted or unsubstituted.

$R^1$ and $R^2$ are described below.

As the alkyl group, an alkyl group having from 1 to 18 carbon atoms is preferably used, and as the alkenyl group, an alkenyl group having from 2 to 18 carbon atoms is preferably used.

As the aryl group, an aryl group having from 6 to 18 carbon atoms is preferably used. The alkyl, alkenyl and aryl groups each may have a substituent, e.g., they may have one or more of a heterocyclic residue, a halogen atom, an alkoxyl group, an aryloxy group, an alkylthio group, an arylthio group, a carbonyl group, an amido group, a carbamoyl group, an amino group, a carboxyl group, a sulfonyl group, a sulfonamido group, a sulfamoyl group, a cyano group, and a nitro group.

The substituents which can substitute on the naphthalene ring having the above structure can be selected from the same groups as those which can substitute on the above alkyl, alkenyl or aryl group.

If the amount of the binder in the light-to-heat converting layer is not sufficient, the cohesive strength of the light-to-heat converting layer lowers and the light-to-heat converting layer is liable to be transferred together, which causes color mixture. While when the amount of the binder is too much, the layer thickness of the light-to-heat converting layer becomes large for achieving a definite thickness, thereby sensitivity is liable to be decreased. The mass ratio of the solid content of the light-to-heat converting material to the binder in the light-to-heat converting layer is preferably 1/20 to 2/1, particularly preferably 1/10 to 2/1.

The binder is a resin which makes the half value width of the maximum absorbance at wavelength of 700 to 1,200 nm of the light-to-heat converting layer 200 nm or less, which has at least the strength capable of forming a layer on a support and preferably has high heat conductivity. It is more preferred to select a light-to-heat converting material and a binder so that the half value width of the maximum absorbance at wavelength of 700 to 1,200 nm of the light-to-heat converting layer is 180 nm or less, and it is particularly preferred to select them so that the half value width becomes 170 nm or less.

As the particularly preferred combinations of resins and dyes for making the half value width of the maximum absorbance at wavelength of 700 to 1,200 nm of the light-to-heat converting layer 200 nm or less, combinations of phthalocyanine dyes with acrylic resins such as PMMA and copolymers of them, and combinations of cyanine dyes with resins having a benzene ring, resins having a polar bond such as a urethane bond and a urea bond, resins having halogen such as Cl, or resins having a polar group such as a hydroxyl group can be exemplified.

The half value width of the maximum absorbance at wavelength of 700 to 1,200 nm of the light-to-heat converting layer in the present invention can be obtained by measuring the absorption spectrum, and the wavelength giving maximum absorbance is not particularly limited but the wavelength in the range of from 750 to 1,100 nm is preferred.

Nonaqueous resins are used as the binder to be contained in the light-to-heat converting layer, which have at least the strength capable of forming a layer on a support and preferably have high heat conductivity. "Nonaqueous resins" herein means the resins having the solubility in water at 50° C. of 0.5 wt % or less.

The nonaqueous resins are preferably resins having the solubility of 0.1 mass % or more in a hydrophobic solvent having an SP value of from 16 to 22, particularly preferably 1 mass % or more, for improving the humidity dependency of the heat transfer sheet. The specific examples of the solvents of a wide use having the above-defined SP value include the following compounds, and SP values are shown in parentheses, e.g., cyclohexane (16.8), xylene (18.0), toluene (18.2), ethyl acetate (18.6), tetrahydrofuran (18.6), methyl ethyl ketone (19.0), acetone (20.3), cyclohexanone (20.3), 1,4-dioxane (20.5), and 1,3-dioxane (20.9).

It is preferred that the solubility of a resin contained in the light-to-heat converting layer in the coating solvent for forming the image-forming layer is 1 mass % or less, more preferably 0.1 mass % or less. The solubility of a resin contained in the light-to-heat converting layer in the coating solvent for forming the light-to-heat converting layer is 0.1 mass % or more, more preferably 1 mass % or more.

Heat resisting resins which are not decomposed by heat generated from the light-to-heat converting material at image recording are preferably used as the binder resin, since the surface smoothness of the light-to-heat converting layer can be maintained after irradiation even when light irradiation is performed with high energy. Specifically, resins having heat decomposition temperature (temperature at which the mass decreases by 5% in air current at temperature increasing velocity of 10° C./min by TGA method (thermal mass spectrometry)) of 400° C. or more are preferably used, more preferably 500° C. or more. Binders preferably have glass transition temperature of from 200 to 400° C., more preferably from 250 to 350° C. When the glass transition temperature is lower than 200° C., there is a case where fog is generated on the image to be formed, while when it is higher than 400° C., the solubility of the resin is decreased, followed by the reduction of the productivity in some cases.

Further, the heat resistance (e.g., heat deformation temperature and heat decomposition temperature) of the binder in the light-to-heat converting layer is preferably higher than the heat resistance of the materials used in other layers provided on the light-to-heat converting layer.

Specifically, acrylic resins, e.g., polymethyl methacrylate, vinyl resins, e.g., polycarbonate, polystyrene, vinyl chloride/vinyl acetate copolymer and polyvinyl alcohol, polyvinyl butyral, polyester, polyvinyl chloride, polyamide, polyimide, polyether imide, polysulfone, polyether sulfone, aramid, polyurethane, epoxy resin and urea/melamine resin are exemplified as the binder resins for use in the light-to-heat converting layer. Of these resins, polyimide resin is preferred.

Polyimide resins represented by the following formulae (I) to (VII) are soluble in an organic solvent and the productivity of the heat transfer sheet is improved when they are used. Further, these polyimide resins are preferred in view of capable of improving the stability of viscosity, long term storage stability and moisture resistance of the coating solution for the light-to-heat converting layer.

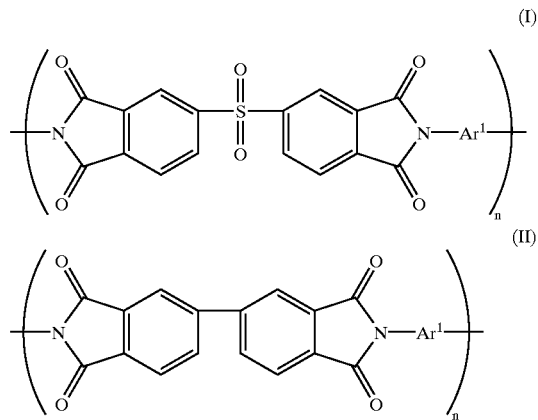

In formulae (I) and (II), $Ar^1$ represents an aromatic group represented by the following formula (1), (2) or (3), and n represents an integer of from 10 to 100.

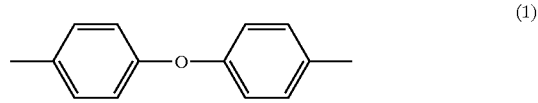

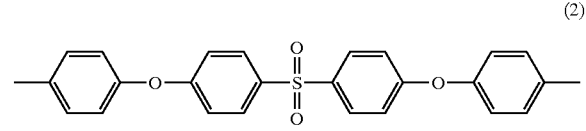

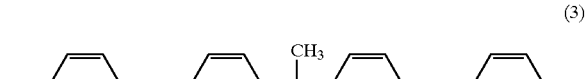

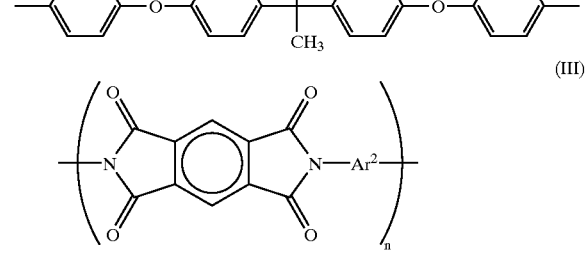

-continued

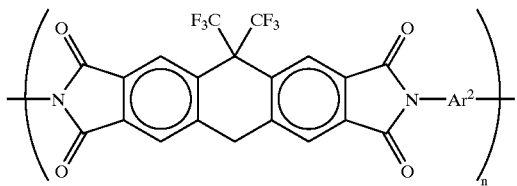
(IV)

In formulae (III) and (IV), Ar² represents an aromatic group represented by the following formula (4), (5), (6) or (7), and n represents an integer of from 10 to 100.

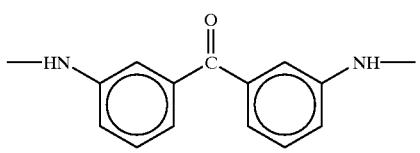
(4)

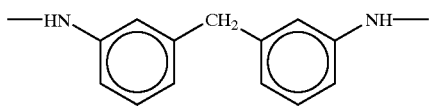
(5)

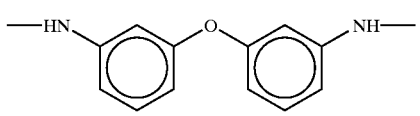
(6)

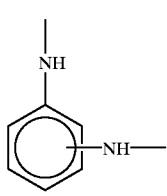
(7)

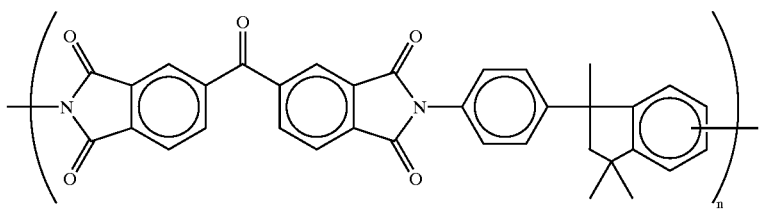
(V)

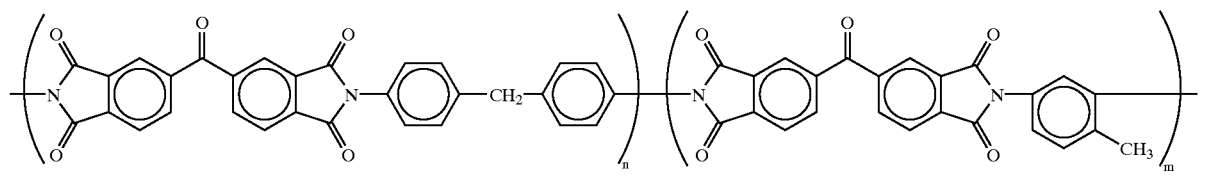
(VI)

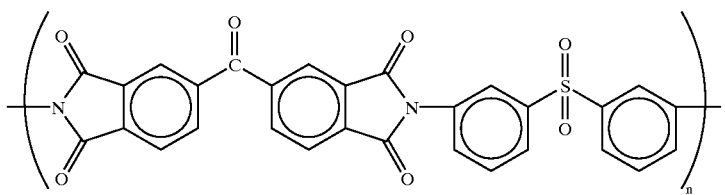
(VII)

In formulae (V), (VI) and (VII), n and m each represents an integer of from 10 to 100. In formula (VI), the ratio of n/m is from 6/4 to 9/1.

As the criterion whether a resin is soluble in an organic solvent or not, when 10 mass parts or more of the resin is dissolved in 100 mass parts of N-methylpyrrolidone at 25° C., the resin can be preferably used in the light-to-heat converting layer, more preferably 100 mass parts is dissolved in 100 mass parts of N-methylpyrrolidone.

It is preferred for the light-to-heat converting layer to contain a matting agent. As the matting agent, inorganic and organic fine particles can be exemplified. The examples of the inorganic fine particles include metal salts, e.g., silica, titanium oxide, aluminum oxide, zinc oxide, magnesium oxide, barium sulfate, magnesium sulfate, aluminum hydroxide, magnesium hydroxide and boron nitride, kaolin, clay, talc, zinc flower, lead white, zeeklite, quartz, diatomaceous earth, pearlite, bentonite, mica, and synthetic mica. The examples of the organic fine particles include resin particles, e.g., fluorine resin particles, guanamine resin particles, acrylic resin particles, styrene/acryl copolymer resin particles, silicone resin particles, malamine resin particles and epoxy resin particles.

Matting agents generally have a particle size of from 0.3 to 30 μm, preferably from 0.5 to 20 μm, and the addition amount of matting agents is preferably from 0.1 to 100 mg/m².

The light-to-heat converting layer may contain a surfactant, a thickener, and an antistatic agent, if necessary.

The light-to-heat converting layer can be provided by dissolving a light-to-heat converting material and a binder, adding, if necessary, a matting agent and other components thereto to thereby prepare a coating solution, coating the coating solution on a support and drying. As the organic solvents for dissolving a binder, e.g., n-hexane, cyclohexane, diglyme, xylene, toluene, ethyl acetate, tetrahydrofuran, methyl ethyl ketone, acetone, cyclohexanone, 1,4-dioxane, 1,3-dioxane, dimethyl acetate, N-methyl-2-pyrrolidone, dimethyl sulfoxide, dimethylformamide, dimethylacetamide, γ-butyrolactone, ethanol and methanol can be exemplified. Coating and drying can be performed according to ordinary coating and drying methods. Drying is generally performed at 300° C. or less, preferably 200° C. or less. When polyethylene terephthalate is used as the support, the drying temperature is preferably from 80 to 150° C.

In another embodiment of the present invention, the optical density per each light-to-heat converting layer is different in the heat transfer sheet of each color, such that each light-to-heat converting layer provided in the heat transfer sheet of each color is the same in the optical density per unit layer by laser irradiation and different in the layer thickness (hereinafter referred to as "the present invention 1"), and in the present invention 1, the amount of the matting agent contained in the light-to-heat converting layer is preferably different in the heat transfer sheet of each color (hereinafter referred to as "the present invention 2").

In the first place, the present invention 1 is described below.

The optical density ($OD_{LH}$) per each light-to-heat converting layer by laser irradiation of the light-to-heat converting layer differs in the heat transfer sheet of each color, which means that at least one combination of the assemblies different in $OD_{LH}$ is present in each color. Accordingly, when each color comprises the assembly of black (K), yellow (Y), magenta (M) and cyan (C), the number of assemblies different in $OD_{LH}$ is from 2 to 4. For example, when the number of the assemblies is 2, there are combinations of assembly (K) and assembly (Y, M, C), assembly (K, Y) and assembly (M, C), and assembly (K, M) and assembly (Y, C). This combination is designated group. Here, for example, assembly (Y, M, C) means that $OD_{LH}$ of Y, M, C are all the same. In the case where the number of assemblies different in $OD_{LH}$ is 4, $OD_{LH}$ are different in all the heat transfer sheets. In the present invention 1, it follows that $OD_{LH}$ are different among assemblies in a group.

In the present invention, it is preferred that $OD_{LH}$ in a black (K) heat transfer sheet is different from those in heat transfer sheets of other colors, it is more preferred to set appropriate $OD_{LH}$ in every color. That the optical densities differ between assemblies in a group means that the optical densities differ by 0.1% or more, preferably from 1 to 20%, in relative intensity (100× difference in optical density/larger optical density). Where there are a plurality of combinations of assemblies in a group, it is necessary that the above relationship is formed in every combination. Further, the wavelength of the laser beam irradiated to the light-to-heat converting layer must be constant between assemblies in a group.

A means for obtaining the above relative intensity in the present invention 1 is to make the optical density per unit layer in the heat transfer sheet of every color equal, irrespective of between the assemblies in a group, and the layer thickness different between assemblies in a group. This is advantageous in the reduction of manufacturing processes and manufacturing costs, since the same coating layer can be used for forming the light-to-heat converting layer in the manufacture of each color heat transfer sheet. The optical density per unit layer is the value obtained by dividing $OD_{LH}$ by irradiation of the light-to-heat converting layer with laser beam by the layer thickness of the light-to-heat converting layer $T_{LH}$ (μm unit). When unevenness is generated in thickness by the addition of additives, e.g., a matting agent, the layer thickness is an average layer thickness in plane areas where additives, e.g., a matting agent, are not present.

In the present invention 1, the optical density of the light-to-heat converting layer in a black heat transfer sheet is preferably the lowest as compared with those in the heat transfer sheets of other colors. This is due to the fact that when carbon black is used in the black image-forming layer, carbon black itself also absorbs laser beam and generates heat, and so the black image-forming layer becomes high temperature as compared with the heat transfer sheets of other colors.

In the next place, the present invention 2 is described below.

The content of a matting agent contained in a light-to-heat converting layer is different in a heat transfer sheet of each color. This means that at least one combination of the assemblies different in the contents of a matting agent is present in each color. In this case, the concepts of assembly and group are the same as in the present invention 1. In the present invention, it is preferred that the content of a matting agent in a black (K) heat transfer sheet is different from those in heat transfer sheets of other colors. In the present invention 2, the content of a matting agent is different between the assemblies in a group. This means that the content of a matting agent between the assemblies in a group differs by 0.1% or more, preferably from 1 to 20%, in a relative amount (100× difference in the content of a matting agent/larger matting agent content). Where there are a plurality of combinations of assemblies in a group, it is necessary that the above relationship is formed in every combination.

A means for obtaining the above relative content is to make the content of a matting agent per unit layer in the heat transfer sheet of every color equal, irrespective of between the assemblies in a group, and the layer thickness different between assemblies in a group. This is advantageous, the same as in the present invention 1, in the reduction of manufacturing processes and manufacturing costs, since the same coating layer can be used for forming the light-to-heat converting layer in the manufacture of each color heat transfer sheet. The matting agent content per unit layer is the value obtained by dividing the content of a matting agent present in the light-to-heat converting layer by the layer thickness of the light-to-heat converting layer (μm unit). The layer thickness is an average layer thickness in plane areas where a matting agent is not present.

Also in the present invention 2, the content of a matting agent in the light-to-heat converting layer in a black heat transfer sheet is preferably the lowest as compared with the contents in the heat transfer sheets of other colors.

In the present invention 1, the condition of the present invention 2 needs or does not need to be satisfied, and in the present invention 2, the condition of the present invention 1 needs or does not need to be satisfied, but it is preferred in the present invention that both conditions are satisfied.

In the present invention, the optical density of the light-to-heat converting layer at peak wavelength of laser beam is from 0.80 to 1.49.

A method for forming a multicolor image of the present invention comprises the steps of superposing the image-forming layer in each heat transfer sheet of the multicolor image-forming material of the present invention and the image-receiving layer in the image-receiving sheet of the multicolor image-forming material vis-a-vis, and irradiating the heat transfer sheet from the support side with laser beam and transferring the area of the image-forming layer subjected to laser beam irradiation onto the image-receiving layer in the image-receiving sheet, to thereby effect image-recording. The laser beam is preferably a semiconductor laser beam, and preferably comprises multi-beams of two-dimensional array.

A method for preparing a color proof in the present invention uses the multicolor image forming method of the present invention and comprises re-transferring the full color image formed on the image-receiving layer in the image-receiving sheet to a printing paper.

In general, materials having a low melting point, such as a wax, are liable to ooze to the surface of an image-forming layer or to be crystallized and cause a problem in image quality and the aging stability of a heat transfer sheet in some cases.

To cope with this problem, it is preferred to use a low melting point material having no great difference from the polymer of an image-forming layer in an SP value, by which the compatibility with the polymer can be increased and the separation of the low melting point material from the image-forming layer can be prevented. It is also preferred to mix several kinds of low melting point materials to prevent crystallization by eutectic mixture. As a result, an image showing a sharp dot shape and free of unevenness can be obtained.

Further, in general, the dynamic properties and thermal properties of the coated layers of a heat transfer sheet are varied by moisture absorption and the humidity dependency of recording condition is caused.

For reducing the temperature and humidity dependency, it is preferred that the dye/binder system of a light-to-heat converting layer and the binder system of an image-forming layer are organic solvents. Further, it is preferred to use polyvinyl butyral as the binder of an image-receiving layer and to introduce a hydrophobitization technique of polymers for the purpose of lowering water absorption properties of polymers. As the hydrophobitization technique of polymers, the technique of reacting a hydroxyl group with a hydrophobic group, or crosslinking two or more hydroxyl groups with a hardening agent as disclosed in JP-A-8-238858 can be exemplified.

About 500° C. or more heat is generally applied to an image-forming layer by laser exposure, and so some of conventionally used pigments are heat-decomposed, but this problem can be prevented by using highly heat resisting pigments in an image-forming layer.

For preventing the variation of hue due to migration of an infrared absorbing dye from a light-to-heat converting layer to an image-forming layer by high heat at exposure, it is preferred to design a light-to-heat converting layer by combination of an infrared absorbing dye having high retentivity and a binder as described above.

Shortage of energy generally occurs in high speed printing and, in particular, time lag is caused in by-scanning intervals by laser and gaps are generated. As described above, using a dye of high concentration in a light-to-heat converting layer and thinning of a light-to-heat converting layer and an image-forming layer can improve the efficiency of generation and conduction of heat. It is also preferred to add a low melting point material to an image-forming layer for the purpose of slightly fluidizing the image-forming layer at heating to thereby fill the gaps and improving the adhesion with the image-receiving layer. Further, for enhancing the adhesion of the image-receiving layer and the image-forming layer and sufficiently strengthening a transferred image, it is preferred to use polyvinyl butyral used in the image-forming layer as the binder in the image-receiving layer.

In the next place, the system at large developed by the present inventors will be described below. By adopting a membrane heat transfer system developed by the present inventors, high definition and high image quality has been attained in the present invention. The system of the present invention is capable of obtaining a transferred image having definition of 2,400 dip or more, preferably 2,600 dip or more. The membrane heat transfer system is a system of transferring a thin image-forming layer having a layer thickness of from 0.01 to 0.9 μm to an image-receiving sheet in the state of partially not melting or hardly melting. That is, since the recorded part is transferred as a membrane, extremely high definition can be attained by the heat transfer system. A preferred method of efficiently performing membrane heat transfer is to deform the inside of a light-to-heat converting layer to a dome-like form by heat-recording, push up the image-forming layer, to thereby enhance the adhesion of the image-forming layer and the image-receiving layer to make transferring easy. When the deformation is large, transferring becomes easy, since the force of pressing the image-forming layer against the image-receiving layer is great. While when the deformation is small, sufficient transferring cannot be effected in part, since the force of pressing the image-forming layer against the image-receiving layer is small. Deformation preferred for the membrane transfer can be observed by a laser microscope (VK8500, manufactured by Keyence Corporation) and the size of deformation can be evaluated by a deformation factor obtained by dividing [increased cross-sectional area of the recording area of the light-to-heat converting layer after heat recording (a) plus cross-sectional area of the recording area of the light-to-heat converting layer before heat recording (b)] by [cross-sectional area of the recording area of the light-to-heat converting layer before heat recording (b)] and multiplying 100. That is, deformation factor= [(a+b)/(b)]×100. The deformation factor is generally 110% or more, preferably 125% or more, and more preferably 150% or more. The deformation factor maybe greater than 250% when the breaking elongation is made large but it is preferred to restrict the deformation factor to about 250% or less.

The technical points of the image-forming material in membrane transfer are as follows.

1. Compatibility of high heat responsibility and storage stability

For obtaining high image quality, transferring of a membrane of submicron order is necessary, but for obtaining desired density, it is necessary to form a layer dispersed therein a pigment in high concentration, which is reciprocal to heat responsibility. Heat responsibility is also in the relationship reciprocal to storage stability (adhesion). By the development of novel polymer-additive, this reciprocal relationship has been solved.

2. Security of high vacuum adhesion

In membrane transfer pursuing high definition, the interface of transfer is preferably smooth, by which, however, sufficient vacuum adhesion cannot be obtained. Vacuum adhesion could be obtained by adding a little much amount of a matting agent having a relatively small particle size to the under layer of the image-forming layer, departing from general knowledge of obtaining vacuum adhesion, with maintaining proper gap uniform between the light-to-heat converting layer and the image-receiving layer, without causing image dropout and securing the characteristics of membrane transfer.

3. Use of heat resisting organic material

A light-to-heat converting layer which converts laser beam to heat at laser recording attains the temperature of about 700° C. and an image-forming layer containing pigment materials reaches about 500° C. The present inventors have developed, as the material of a light-to-heat converting layer, modified polyimide capable of organic solvent coating, and at the same time pigments which are higher heat resisting than pigments for printing, safe and coincident in hue, as the pigment materials.

4. Security of surface cleanliness

In membrane transfer, dust between a light-to-heat converting layer and an image-receiving sheet causes an image defect, which is a serious problem. There are dust coming from the outside of the apparatus, or generated by cutting of materials, therefore dust cannot be excluded by only material control, and it is necessary that apparatus must be provided with a dust removing device. However, we found a material capable of maintaining appropriate viscosity and capable of cleaning the surface of a transfer material and realized the removal of dust by changing the material of the transfer roller without reducing the productivity.

In the next place, the system at large of the present invention will be described in detail below.

The present invention is a system which makes it possible to realize a heat transfer image having sharp dots, to transfer an image to actual printing paper, and to record a recording size of B2 size or larger (515 mm or more multiplying 728 mm or more), more preferably B2 size is 543 mm or more multiplying 765 mm or more, and recording of larger than this size is possible.

One characteristic of the performance of the system of the present invention is that sharp dot shape can be obtained. A heat transfer image obtained by this system can form a dot image corresponding to print line number of definition of 2,400 dpi or more. Since individual dot obtained according to this system is very sharp and almost free of blur and chip, dots of a wide range from highlight to shadow can be clearly formed. As a result, output of dots of high grade having the same definition as obtained by an image setter and CTP setter is possible, and dots and gradation which are excellent in approximation to the printed matter can be reproduced.

The second characteristic of the performance of the system of the present invention is that repeating reproducibility is good. Since a heat transfer image obtained by this system is sharp in dot shape, dots corresponding to laser mean can be faithfully reproduced, further recording characteristics are hardly influenced by the environmental temperature and humidity, repeating reproducibility stable in hue and density can be obtained under wide circumstances of temperature and humidity.

The third characteristic of the performance of the system of the present invention is that color reproduction is good. A heat transfer image obtained by this system is formed with coloring pigments used in printing inks and since excellent in repeating reproducibility, highly minute CMS (color management system) can be realized.

The heat transfer image can almost coincide with the hues of Japan color and SWOP color, i.e., the hues of printed matters, and the colors appear similarly to the printed matter even when light sources of illumination are changed, such as a fluorescent lamp, an incandescent lamp.

The fourth characteristic of the performance of the system of the present invention is that the quality of characters is good. Since a heat transfer image obtained by this system is sharp in dot shape, the fine line of a fine character can be reproduced sharply.

The characteristic technical points of the material for use in the system of the present invention are further described in detail below. As the heat transfer methods for DDCP, there are (1) a sublimation method, (2) an ablation method, and (3) a fusion method. Methods (1) and (2) are systems using sublimation or sputtering, the outline of a dot becomes fuzzybut.

On the other hand, in method (3), a molten substance flows, and so the outline of a dot is not also clear. On the basis of a membrane transfer technique, the present inventors incorporated the following techniques to the system of the present invention for solving the new problems in laser transfer systems and obtaining further high image quality. The first characteristic of the technique of materials is sharpening of dot shape. Image recording is performed by converting laser beams to heat in a light-to-heat converting layer and conducting the heat to the image-forming layer contiguous to the light-to-heat converting layer, and adhering the image-forming layer to an image-receiving layer. For sharpening dot shape, heat generated by laser beams is not diffused in the surface direction but conducted to the transfer interface, and the image-forming layer ruptures sharply at interface of heating area/non-heating area. The thickness of the light-to-heat converting layer in the heat transfer sheet is thinned and dynamic properties of the image-forming layer are controlled for this sake.

The first technique of sharpening of dot shape is thinning of the light-to-heat converting layer. The light-to-heat converting layer is presumed from simulation to reach about 700° C. in a moment, and a thin film is liable to be deformed and ruptured. When deformation and rupturing occur, the light-to-heat converting layer is transferred to an image-receiving layer together with the image-forming layer or a transferred image becomes uneven. On the other hand, a light-to-heat converting material must be present in the light-to-heat converting layer in high concentration for obtaining a desired temperature, which results in a problem of precipitation of the light-to-heat converting material or migration of the material to the contiguous layer. When an infrared absorbing dye is used as the light-to-heat converting material, the use amount can be decreased as compared with carbon black. Polyimide compounds having sufficient dynamic strength even at high temperature and high retentivity of an infrared absorbing dye were introduced as the binder.

In this manner, it is preferred to thin the light-to-heat converting layer up to about 0.5 $\mu$m or less by selecting an infrared absorbing dye excellent in light-to-heat converting property and a heat-resisting binder such as polyimide compounds.

The second technique of sharpening of dot shape is the improvement of the characteristics of an image-forming layer. When a light-to-heat converting layer is deformed or an image-forming layer itself is deformed due to high temperature, thickness unevenness is caused in an image-forming layer transferred to an image-receiving layer corresponding to the by-scanning pattern of laser beams, as a result, the image becomes uneven and apparent transfer density is reduced. The thinner the thickness of an image-forming layer, the more conspicuous is this tendency. On the other hand, when the thickness of an image-forming layer is thick, dot sharpness is impaired and sensitivity decreases.

To reconcile these reciprocal properties, it is preferred to improve transfer unevenness by adding a low melting point material to an image-forming layer, e.g., a wax. Transfer unevenness can be improved with maintaining dot sharpness and sensitivity by adding inorganic fine particles in place of a binder to adjust the layer thickness of an image-forming layer properly so that the image-forming layer ruptures sharply at interface of heating area/non-heating area.

In general, materials having a low melting point, such as a wax, are liable to ooze to the surface of an image-forming layer or to be crystallized and cause a problem in image quality and the aging stability of a heat transfer sheet in some cases.

To cope with this problem, it is preferred to use a low melting point material having no great difference from the polymer of an image-forming layer in an SP value, by which the compatibility with the polymer can be increased and the separation of the low melting point material from the image-forming layer can be prevented. It is also preferred to mix several kinds of low melting point materials to prevent crystallization by eutectic mixture. As a result, an image showing a sharp dot shape and free of unevenness can be obtained.

The second characteristic of the technique of materials is that the present inventors found that recording sensitivity has temperature and humidity dependency. In general, the dynamic properties and thermal properties of the coated layers of a heat transfer sheet are varied by moisture absorption and the humidity dependency of recording condition is caused.

For reducing the temperature and humidity dependency, it is preferred that the dye/binder system of a light-to-heat converting layer and the binder system of an image-forming layer are organic solvents. Further, it is preferred to use polyvinyl butyral as the binder of an image-receiving layer and to introduce a hydrophobitization technique of polymers for the purpose of lowering water absorption properties of polymers. As the hydrophobitization technique of polymers, the technique of reacting a hydroxyl group with a hydrophobic group, or crosslinking two or more hydroxyl groups with a hardening agent as disclosed in JP-A-8-238858 can be exemplified.

The third characteristic of the technique of materials is the improvement of the approximation of hue to the printed matter. In addition to color matching of pigments by thermal head system color proof (First Proof, manufactured by Fuji Photo Film Co., Ltd.) and the technique of stable dispersion, a problem newly occurred in the laser heat transfer system was solved. That is, technique 1 of the improvement of the approximation of hue to the printed matter is to use a highly heat resisting pigment. About 500° C. or more heat is generally applied to an image-forming layer by laser exposure, and so some of conventionally used pigments are heat-decomposed, but this problem can be prevented by using highly heat resisting pigments in an image-forming layer.

Technique 2 of the improvement of the approximation of hue to the printed matter is the diffusion prevention of a light-to-heat converting material, in particular, an infrared absorbing material. For preventing the variation of hue due to migration of an infrared absorbing dye from a light-to-heat converting layer to an image-forming layer by high heat at exposure, it is preferred to design a light-to-heat converting layer by combination of an infrared absorbing dye having high retentivity and a binder as described above.

The fourth characteristic of the technique of materials is to increase sensitivity. Shortage of energy generally occurs in high speed printing and, in particular, time lag is caused in by-scanning intervals by laser and gaps are generated. As described above, using a dye of high concentration in a light-to-heat converting layer and thinning of a light-to-heat converting layer and an image-forming layer can improve the efficiency of generation and conduction of heat. It is also preferred to add a low melting point material to an image-forming layer for the purpose of slightly fluidizing the image-forming layer at heating to thereby fill the gaps and improving the adhesion with the image-receiving layer. Further, for enhancing the adhesion of the image-receiving layer and the image-forming layer and sufficiently strengthening a transferred image, it is preferred to use polyvinyl butyral used in the image-forming layer as the binder in the image-receiving layer.

The fifth characteristic of the technique of materials is the improvement of vacuum adhesion. It is preferred that an image-receiving sheet and a heat transfer sheet are retained on a drum by vacuum adhesion. Since an image is formed by the adhesion control of both sheets, image transfer behavior is very sensitive to the clearance between the image-receiving layer surface of an image-receiving sheet and the image-forming layer surface of a transfer sheet, hence vacuum adhesion is important. If the clearance between the materials is widened with foreign matter, e.g., dust, as a cue, image defect and image transfer unevenness come to occur.

For preventing such image defect and image transfer unevenness, it is preferred to give uniform unevenness to a heat transfer sheet to thereby improve the air passage, to obtain uniform clearance.

Technique 1 of the improvement of vacuum adhesion is the provision of unevenness to the surface of a heat transfer sheet. For obtaining sufficient effect of vacuum adhesion even in superposed printing of two or more colors, unevenness is provided to a heat transfer sheet. For providing unevenness to a heat transfer sheet, a method of post treatment such as embossing treatment and a method of addition of a matting agent to a coating layer are generally used, but in view of the simplification of manufacturing process and stabilization of materials with the lapse of time, addition of a matting agent is preferred. The particle size of a matting agent must be larger than the thickness of the coating layer. When a matting layer is added to an image-forming layer, there arises a problem of coming out of the image of the part where the matting layer is present, accordingly, it is preferred to add a matting agent having an optimal particle size, thereby the layer thickness of the image-forming layer becomes almost uniform and an image free of defect can be obtained on the image-receiving sheet.

The characteristics of the technique of systematization of the system of the present invention are described below. The first characteristics of the technique of systematization is the constitution of a recording unit. For surely reproducing sharp dots as described above, highly precise design is required also for a recording unit. The recording unit for use in the system of the present invention is the same as conventionally used recording units for laser heat transfer in fundamental constitution. The constitution is a so-called heat mode outer drum recording system and recording is performed such that a recording head provided with a plurality of high power lasers emit laser rays on a heat transfer sheet and an image-receiving sheet fixed on a drum. A preferred embodiment is as follows.

Constitution 1 of a recording unit is to prevent mixing of dust. Feeding of an image-receiving sheet and a heat transfer sheet is performed by full automatic roll feeding. Mixture of dusts generated from the human body cannot be helped by sheet feeding of a small number, thus roll feeding is adopted.

Since heat transfer sheet comprises four colors each one roll, a roll of each color is switched to another by a rotating loading unit. Each film is cut to a prescribed length by a cutter during loading and fixed on a drum. Constitution 2 of a recording unit is to enhance the adhesion of an image-receiving sheet and a heat transfer sheet on a recording drum. The adhesion of an image-receiving sheet and a heat transfer sheet on a recording drum is vacuum adhesion, since the adhesion of an image-receiving sheet and a heat transfer sheet cannot be strengthened by mechanical fixing. Many vacuum suction holes are formed on a recording drum, and a sheet is sucked by a drum by reducing the pressure in a drum with a blower or a decompression pump. Since a heat transfer sheet is further sucked over the sucked image-receiving sheet, the size of the heat transfer sheet is made larger than the size of the image-receiving sheet. The air between the heat transfer sheet and the image-receiving sheet which most affects recording performance is sucked from the area outside of the image-receiving sheet where the heat transfer sheet is alone.

Constitution 3 of a recording unit is accumulation of multi sheets of a film on a discharge platform stably. In the apparatus of the present invention, a multi sheets of a large sized film of B2 size or larger can be accumulated on the discharge platform. When sheet B is discharged on the image-receiving layer of the already accumulated heat-adhesive film A, sometimes both cleave to each other. When the previous sheet cleaves to the previous of the previous sheet, the next sheet cannot be discharged correctly, which leads to the problem of jamming. For preventing cleaving, the prevention of the contact of film A and film B is the best. Some means are known as the contact preventing method, e.g., (a) a method of making difference in discharge platform level to make a gap between films by making film shape not plane, (b) a method of providing discharge port at higher position than discharge platform and dropping a discharged film, and (c) a method of floating the film discharged later by blasting air between two films. In the system of the present invention, as the sheet size is very big (B2), the structures of units are large scaled when methods (a) and (b) are used, accordingly, (c) a method of floating the film discharged later by blasting air between two films is adopted.

Figure 2:
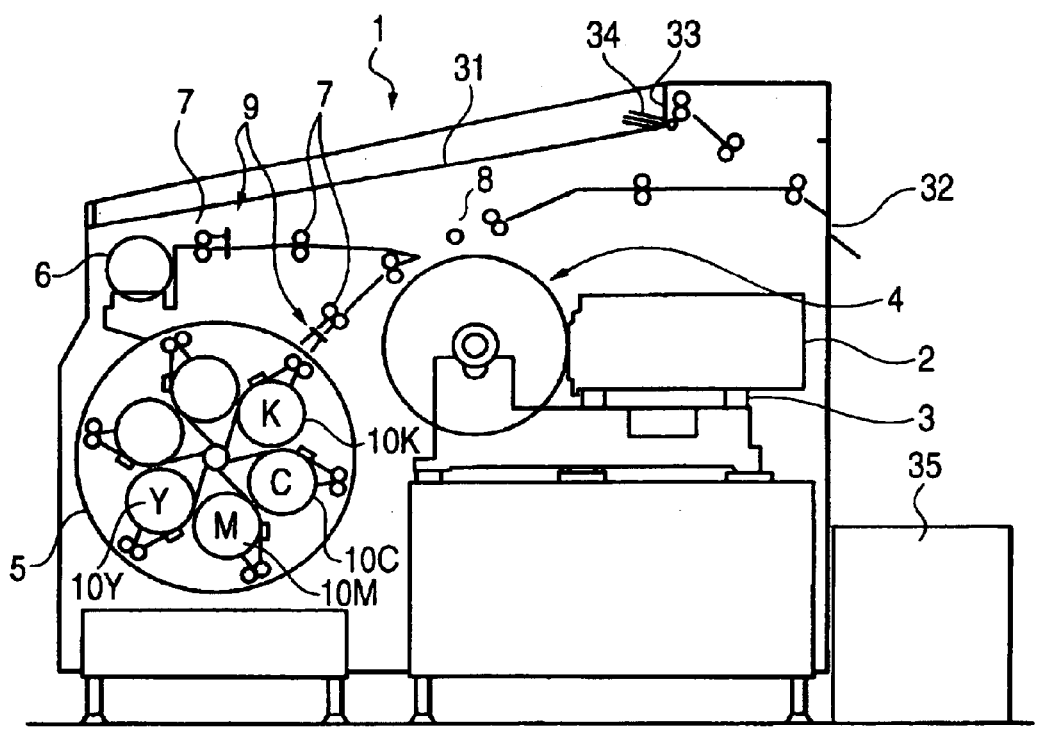
FIG. 2 is a drawing showing an example of constitution of a recording unit for heat transfer by a laser.

An example of constitution of the apparatus of the present invention is shown in FIG. 2.

The sequence of forming a full color image by applying an image-forming material to the apparatus of the present invention (hereinafter referred to as image-forming sequence of the system of the present invention) is described below.

1) By-scan axis of recording head 2 of recording unit 1 is reset by by-scan rail 3, main scan rotation axis of recording drum 4 and heat transfer sheet loading unit 5 are respectively reset at origin.
2) Image-receiving sheet roll 6 is unrolled by carrier roller 7, and the tip of the image-receiving roll is fixed on recording drum 4 by vacuum suction via suction holes provided on the recording drum.
3) Squeeze roller 8 comes down on recording drum 4 and presses the image-receiving sheet, and when the prescribed amount of the image-receiving sheet is conveyed by the rotation of the drum, the sheet is stopped and cut by cutter 9 in a prescribed length.
4) Recording drum 4 further makes a further round, thus the loading of the image-receiving sheet is finished.
5) In the next place, in the same sequence as the image-receiving sheet, heat transfer sheet K of the first color, black, is drawn out from heat transfer sheet roll 10K, cut and loaded.
6) Recording drum 4 starts high speed rotation, recording head 2 on by-scan rail 3 starts to move and when reaches the start position of recording, recording laser is emitted on recording drum 4 by recording head 2 according to recording signals. Irradiation is finished at finishing position of recording, operation of by-scan rail and drum rotation are finished. The recording head on the by-scan rail is reset.
7) Only heat transfer sheet K is released with the image-receiving sheet remaining on the recording drum. For the releasing, the tip of heat transfer sheet K is caught by the claw, pulled out in the discharge direction, and discarded from discard port 32 to discard box 35.
8) The procedures of 5) to 7) are repeated for the remaining three colors. Recording is performed in the order of black, cyan, magenta and yellow. That is, heat transfer sheet C of the second color, cyan, is drawn out from heat transfer sheet roll 10C, heat transfer sheet M of the third color, magenta, is from heat transfer sheet roll 10M, and heat transfer sheet Y of the fourth color, yellow, is from heat transfer sheet roll 10Y in order. This is the inverse of general printing order, since the order of the colors on actual paper becomes inverse by the later process of transfer to actual paper.
9) After recording of four colors, the recorded image-receiving sheets are discharged to discharge platform 31. The releasing method from the drum is the same as that of the heat transfer sheet in above 7), but since these image-receiving sheets are not discarded differently from the heat transfer sheet, they are returned to the discharge platform by switch back when conveyed to discard port 32. When they are discharged to the discharge platform, air 34 is blasted from under discharge port 33 to make it possible to accumulate a plurality of sheets.

It is preferred to use an adhesive roller provided with an adhesive material on the surface as carrier roller 7 of either feeding part or carrying part of the heat transfer sheet roll and the image-receiving sheet roll.

The surfaces of the heat transfer sheet and the image-receiving sheet can be cleaned by providing an adhesive roller.

As the adhesive materials provided on the surface of the adhesive roller, ethylene-vinyl acetate copolymer, ethylene-ethyl acrylate copolymer, polyolefin resin, polybutadiene resin, styrene-butadiene copolymer (SBR), styrene-ethylene-butene-styrene copolymer (SEBS), acrylonitrile-butadiene copolymer (NBR), polyisoprene resin (IR), styrene-isoprenecopolymer (SIS), acrylic ester copolymer, polyester resin, polyurethane resin, acryl resin, butyl rubber, and polynorbornene can be exemplified.

An adhesive roller can clean the surfaces of the heat transfer sheet and the image-receiving sheet by being brought into contact with the surfaces of them, and the contact pressure is not particularly limited so long as they are in contact with the adhesive roller.

Vickers hardness Hv of the material having viscosity used in the adhesive roller is preferably 50 kg/mm$^2$ (=about 490 MPa) or less in view of capable of sufficiently removing foreign matters and suppressing image defect.

Vickers hardness is hardness obtained by measurement with applying static load to a pyramid indenter of diamond having the angle between the opposite faces of 136°, and Vickers hardness Hv can be obtained by the following equation:

$$\text{Hardness } Hv = 1.854 \, P/d^2 \, (kg/mm^2) = \text{about } 18.1692 \, P/d^2$$

(Mpa)
wherein P: load (kg), d: the length of diagonal line of the square of depressed area (mm).

Also in the present invention, the modulus of elasticity at 20° C. of the material having viscosity used in the adhesive roller is preferably 200 kg/cm$^2$ (about 19.6 MPa) or less in view of capable of sufficiently removing foreign matters and suppressing image defect similarly to the above.

The second characteristics of the technique of systematization is the constitution of the heat transfer unit.

The heat transfer unit is used for the steps of transferring the image-receiving sheet on which an image has been printed with a recording unit to a printing paper (hereinafter referred to as "actual paper"). This step is completely the same with First Proof™. When the image-receiving sheet and an actual paper are superposed and heat and pressure are applied thereto, both are adhered, and then the image-receiving film is released from the actual paper, an image and the adhesion layer remain on the actual paper, and the support of the image-receiving sheet and the cushioning layer are peeled off. Accordingly, it can be said that the image is transferred from the image-receiving sheet to the actual paper in practice.

Figure 3:
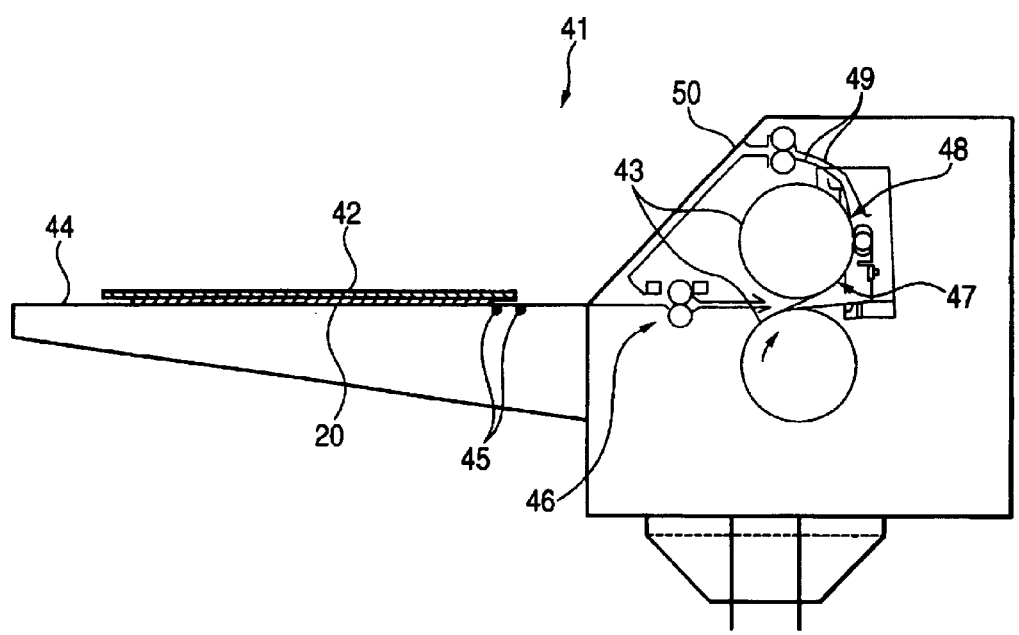
FIG. 3 is a drawing showing an example of constitution a heat transfer unit.

In First Proof™, transferring is performed by superposing an actual paper and an image-receiving sheet on an aluminum guide plate and passing them through a heat roller. The aluminum guide plate is for preventing the deformation of the actual paper. However, when this is adopted in the system of the present invention of B2 size, an aluminum guide plate larger than B2 size is necessary, which results in the problem that a large installation space is required. Accordingly, the system of the present invention does not use an aluminum guide plate and adopts structure such that a carrier path rotates in a 180° arc and sheets are discharged on the side of insertion, thus the installation space can be largely saved (FIG. 3). However, there arises a problem of the deformation of an actual paper, since an aluminum guide plate is not used. Specifically, a pair of an actual paper and an image-receiving sheet curl with the image-receiving sheet inside and roll on the discharge platform. It is very difficult work to release the image-receiving sheet from the curled actual paper.

Accordingly, curling prevention is tried by bimetallic effect making use of the difference in shrinking amount between an actual paper and an image-receiving sheet and ironing effect of winding them around a hot roller. In the case where an image-receiving sheet is superposed on an actual paper and inserted as in conventional way, since the thermal shrinkage of an image-receiving sheet in the direction of insertion is larger than that of an actual paper, curling by bimetallic effect is such that the upper tends inward, which is the same direction as in the ironing effect and curling becomes serious by synergistic effect. Contrary to this, when an image-receiving sheet is superposed under an actual paper, curling by bimetallic effect tends downward and curling by ironing effect tends upward, thus curls are offset each other.

The sequence of an actual paper transfer is as follows (hereinafter referred to as the transfer method of an actual paper for use in the system of the present invention). Heat transfer unit 41 for use in this method as shown in FIG. 3 is a manual apparatus differently from a recording unit.

1) In the first place, the temperature of heat rollers 43 (from 100 to 110° C.) and the carrying velocity at transferring are set by dials (not shown) according to the kind of actual paper 42.
2) In the next place, image-receiving sheet 20 is put on an insert platform with the image being upward, and the dust on the image is removed by an antistatic brush (not shown). Actual paper 42 from which dust has been removed is superposed thereon. At that time, since the size of actual paper 42 put upper side is larger than image-receiving sheet 20 put lower side, the position of image-receiving sheet 20 is not seen and alignment is difficult to do. For improving this work, marks showing the positions of placement of an image-receiving sheet and an actual paper 45 are marked on insert platform 44. The reason the actual paper is larger than image-receiving sheet 20 is to prevent image-receiving sheet 20 from deviating and coming out from actual paper 42 and prevent the image-receiving layer of image-receiving sheet 20 from smearing heat rollers 43.
3) Image-receiving sheet 20 and actual paper 42 with being superposed are inserted into an insert port, and insert roller 46 rotates and feeds them to heat rollers 43.
4) When the tip of the actual paper comes to the position of heat rollers 43, the heat rollers nip them and transfer is started. The heat rollers are heat resisting silicone rubber rollers. Pressure and heat are applied simultaneously to the image-receiving sheet and the actual paper, thereby they are adhered. Guide 47 made of heat resisting sheet is installed on the down stream of the heat rollers, and the image-receiving sheet and the actual paper are carried upward through the upper heat roller and guide 47 with heating, they are released from the heat roller at releasing claw 48 and guided to discharge port 50 along guide plate 49.
5) The image-receiving sheet and the actual paper coming out of discharge port 50 are discharged on the insert platform. Thereafter, image-receiving sheet 20 is released from actual paper 42 manually.

The second characteristics of the technique of systematization is the constitution of the system.

By connecting the above units with a plate-making system, the function as color proof can be exhibited. As the system, it is necessary that a printed matter having an image quality approximating as far as possible to the printed matter outputted from certain plate-making data must be outputted. Therefore, a software for approximating dots and colors to the printed matter is necessary. The specific example of connection is described below.

When the proof of a printed matter is taken from the plate-making system Celebra™ (manufactured by Fuji Photo Film Co., Ltd.), the system connection is as follows. CTP (computer to plate) system is connected with Celebra. The final printed matter can be obtained by mounting the printing plate outputted from this system on a printing machine. As a color proof, the above recording unit Luxel FINALPROOF 5600 (manufactured by Fuji Photo Film Co., Ltd.) (hereinafter sometimes also referred to as "FINALPROOF") is connected with Celebra, and as proof drive software for approximating dots and colors to the printed matter, PD SYSTEM™ (manufactured by Fuji Photo Film Co., Ltd.) is also connected with Celebra.

Figure 4:
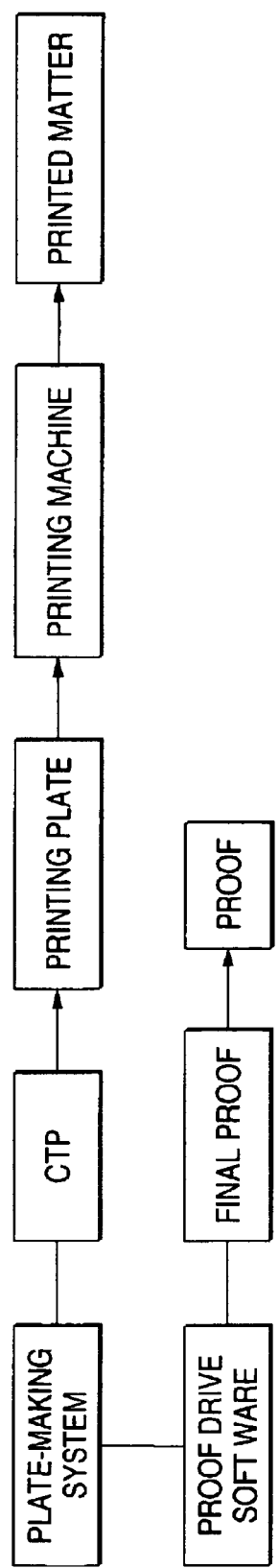
FIG. 4 is a drawing showing the scheme of a system using a recording unit for heat transfer by a laser FINALPROOF.
Figure 5:
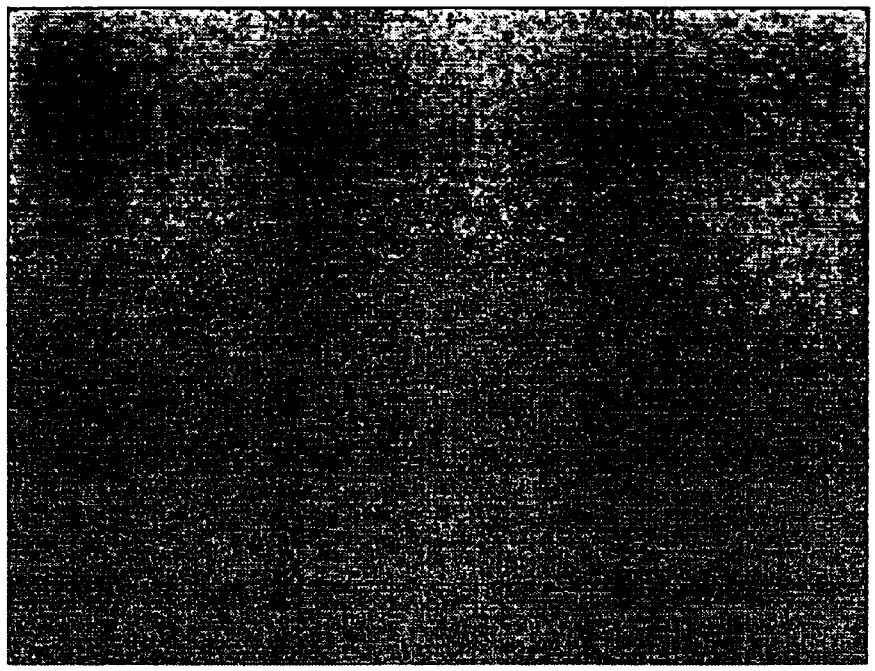
FIG. 5 shows the shapes of the dots of the image obtained in the Example below. The center distance of dots is 125 μm.
Figure 6:
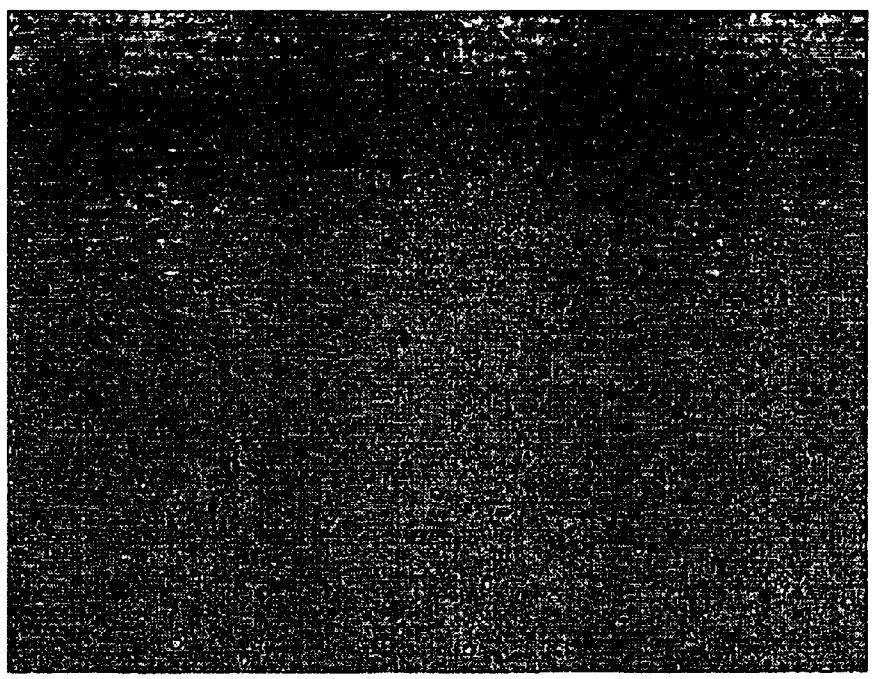
FIG. 6 shows the shapes of the dots of the image obtained in the Example below. The center distance of dots is 125 μm.
Figure 7:
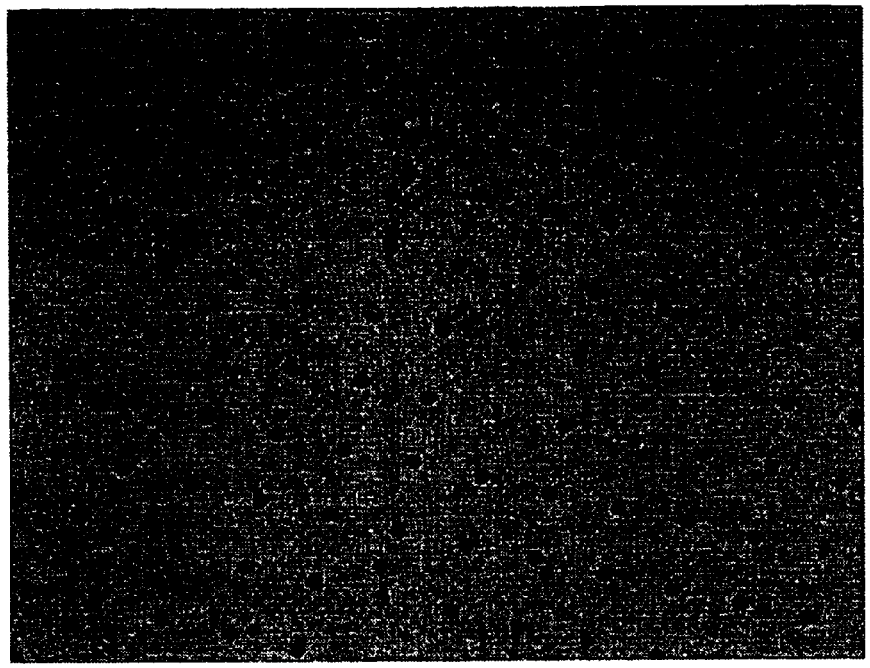
FIG. 7 shows the shapes of the dots of the image obtained in the Example below. The center distance of dots is 125 μm.
Figure 8:
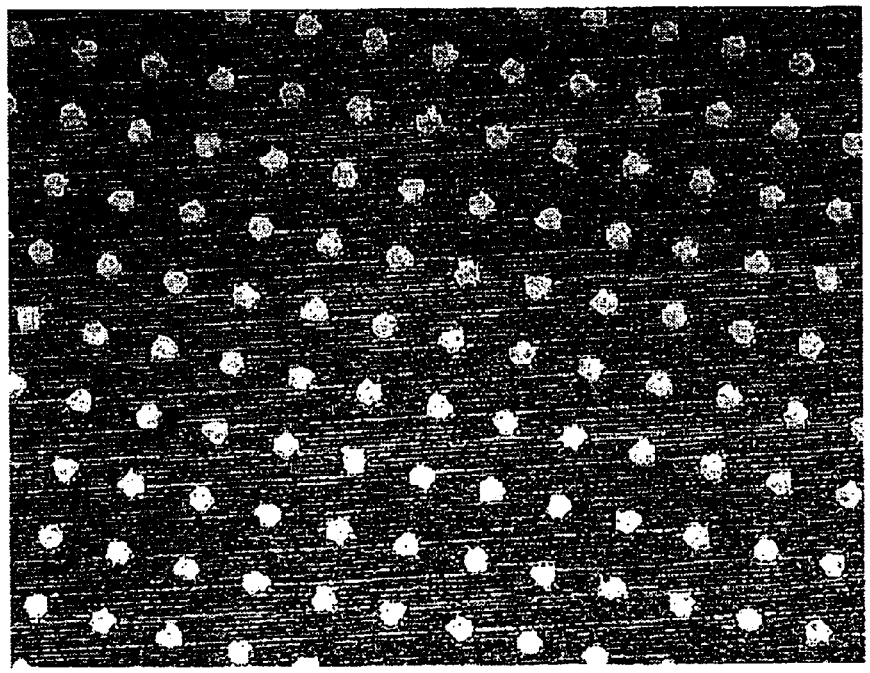
FIG. 8 shows the shapes of the dots of the image obtained in the Example below. The center distance of dots is 12μm.
Figure 9:
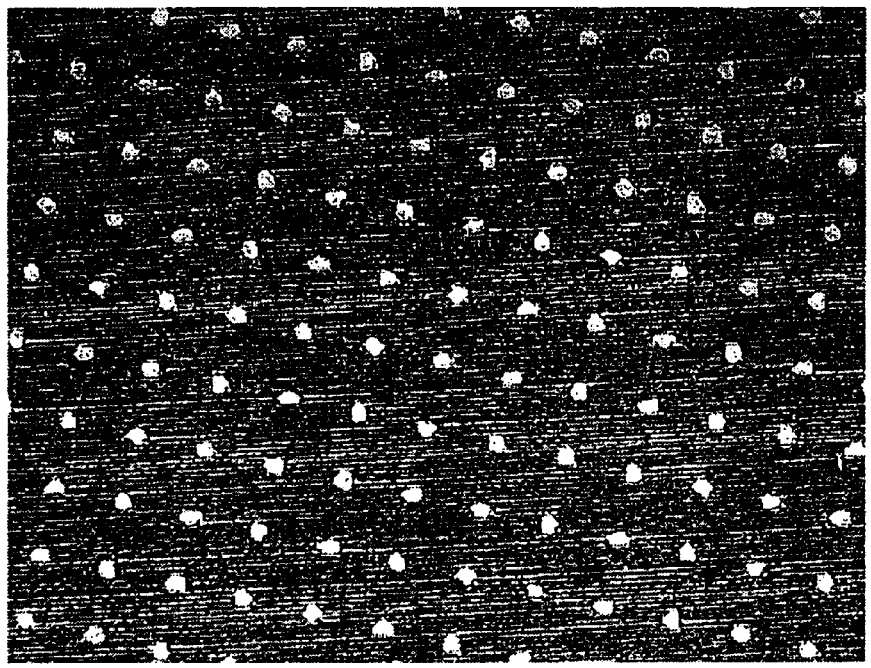
FIG. 9 shows the shapes of the dots of the image obtained in the Example below. The center distance of dots is 125 μm.
Figure 10:
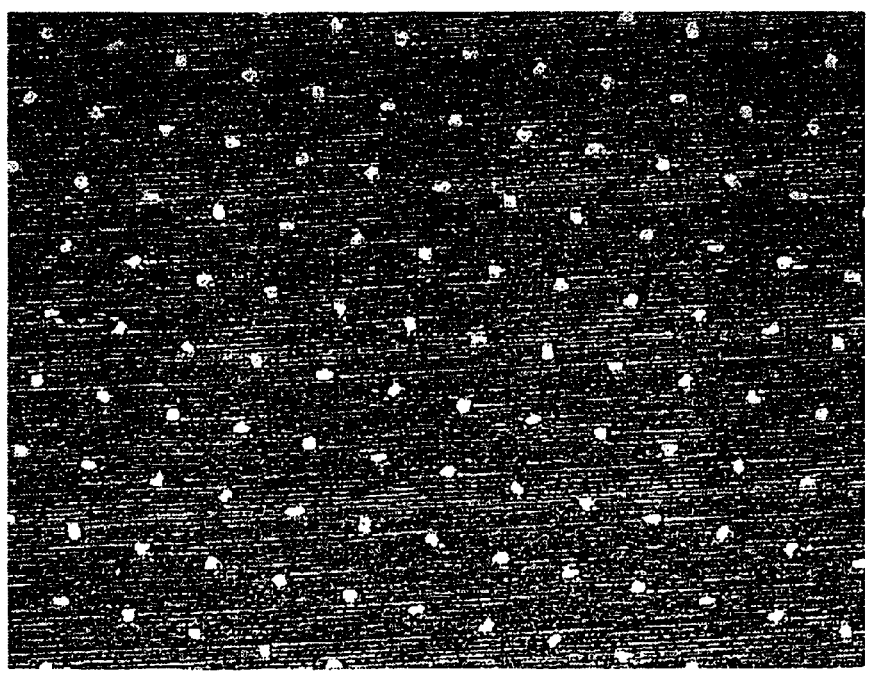
FIG. 10 shows the shapes of the dots of the image obtained in the Example below. The center distance of dots is 125 μm.
Figure 11:
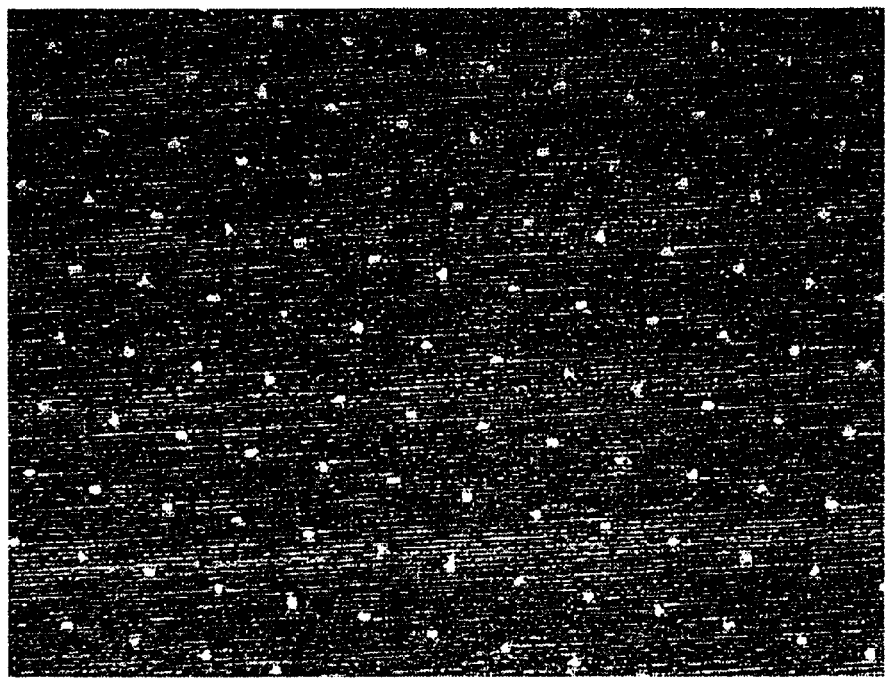
FIG. 11 shows the shapes of the dots of the image obtained in the Example below. The center distance of dots is 125 μm
Figure 12:
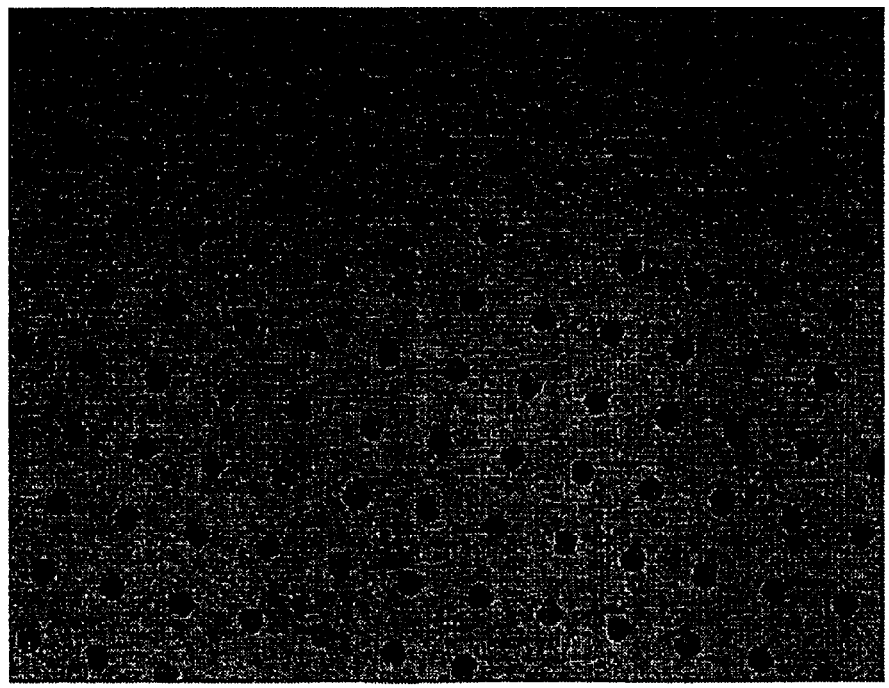
FIG. 12 shows the shapes of the dots of the image obtained in the Example below. The center distance of dots is 125 μm.

Contone data (continuous data) converted to raster data by Celebra are converted to binary data for dots and outputted to CTP system and finally printed. On the other hand, the same contone data are also outputted to PD system. PD system converts the received data according to four dimensional (black, cyan, magenta and yellow) table so that the colors coincide with the printed matter, and finally converts to binary data for dots so that the dots coincide with the dots of the printed matter and the data is outputted to FINAL-PROOF (FIG. 4).

The four dimensional table is experimentally prepared in advance and saved in the system. The experiment for the preparation of the four dimensional table is as follows. The printed image of important color data via CTP system and the outputted image of important color data from FINAL-PROOF via PD system are prepared, the measured color values of these images are compared and the table is formed so that the difference becomes minimum.

Thus, the present invention has realized the system constitution which can sufficiently exhibit the performance of the image-forming material having high definition.

The material of the heat transfer system for use in the system of the present invention is described below.

It is preferred that the absolute value of the difference between the surface roughness Rz of the front surface of the image-forming layer in the heat transfer sheet and the surface roughness Rz of the back surface of the image-forming layer is 3.0 or less, and absolute value of the difference between the surface roughness Rz of the front surface of the image-receiving layer in the image-receiving sheet and the surface roughness Rz of the back surface of the image-receiving layer is 3.0 or less. By such constitution of the present invention, conjointly with the above cleaning means, image defect can be prevented, jamming in carrying can be done away with, and dot gain stability can be improved.

The surface roughness Rz in the present invention means ten point average surface roughness corresponding to Rz of JIS (maximum height). The surface roughness is obtained by inputting and computing the distance between the average value of the altitudes of from the highest peak to the fifth peak and the average value of the depths of from the deepest valley to the fifth valley. A feeler type three dimensional roughness meter (Surfcom 570A-3DF, manufactured by Tokyo Seimitsu Co., Ltd.) is used in measurement. The measurement is performed in machine direction, the cutoff value is 0.08 mm, the measured area is 0.6 mm×0.4 mm, the feed pitch is 0.005 mm, and the speed of measurement is 0.12 mm/sec.

For further improving the above-described effects, it is more preferred that the absolute value of the difference between the surface roughness Rz of the front surface of the image-forming layer in the heat transfer sheet and the surface roughness Rz of the back surface of the image-forming layer is 1.0 or less, and absolute value of the difference between the surface roughness Rz of the front surface of the image-receiving layer in the image-receiving sheet and the surface roughness Rz of the back surface of the image-receiving layer is 1.0 or less.

Further, as another embodiment, it is preferred that the surface roughness Rz of the front surface and the back surface of the heat transfer sheet and/or the surface roughness Rz of the front surface and the back surface of the image-receiving sheet is from 2 to 30 µm. By such constitution of the present invention, conjointly with the above cleaning means, image defect can be prevented, jamming in carrying can be done away with, and dot gain stability can be improved.

It is also preferred that the glossiness of the image-forming layer in the heat transfer sheet is from 80 to 99.

The glossiness largely depends upon the surface smoothness of the image-forming layer and can affect the uniformity of the layer thickness of the image-forming layer. When the glossiness is higher, the image-forming layer becomes more uniform and more preferred for highly minute use, but when the smoothness is high, the resistance at conveying becomes larger, thus they are in relationship of trade off. When the glossiness is from 80 to 99, both are compatible and well-balanced.

The scheme of multicolor image-forming by membrane heat transfer using a laser is described with referring to FIG. 1.

Laminate 30 for image formation comprising image-receiving sheet 20 laminated on image-forming layer 16 containing pigment black (K), cyan (C), magenta (M) or yellow (Y) in heat transfer sheet 10 is prepared. Heat transfer sheet 10 comprises support 12, having provided thereon light-to-heat converting layer 14 and further thereon image-forming layer 16, image-receiving sheet 20 comprises support 22 and having provided thereon image-receiving layer 24, and image-receiving layer 24 is laminated on the surface of image-forming layer 16 in heat transfer sheet 10 in contact therewith (FIG. 1(a)) When laser beams are emitted imagewise in time series from the side of support 12 in heat transfer sheet 10 of laminate 30, the irradiated area with laser beams of light-to-heat converting layer 14 in heat transfer sheet 10 generates heat, thereby the adhesion with image-forming layer 16 is reduced (FIG. 1(b)). Thereafter, when image-receiving sheet 20 and heat transfer sheet 10 are peeled off, the area irradiated with laser beams 16' of image-forming layer 16 is transferred to image-receiving layer 24 in image-receiving sheet 20 (FIG. 1(c)).

In multicolor image formation, the laser beam for use in irradiation preferably comprises multi-beams, particularly preferably comprises multi-beams of two-dimensional array. Multi-beams of two-dimensional array means, when recording by irradiation with laser beam is performed, a plurality of laser beams are used, and the spot array of these laser beams comprises two-dimensional array comprised of a plurality of rows along the main scanning direction and a plurality of rows along the by-scanning direction.

The time required in laser recording can be shortened by using multi-beams of two-dimensional array.

Any laser beam can be used in recording with no limitation, such as gas laser beams, e.g., argon ion laser beam, helium neon laser beam, and helium cadmium laser beam, solid state laser beams, e.g., YAG laser beam, and direct laser beams, e.g., semiconductor laser beam, dye laser beam and eximer laser beam, can be used. Alternatively, laser beams obtained by converting these laser beams to half the wavelength through second harmonic generation elements can also be used. In multicolor image formation, semiconductor laser beams are preferably used taking the output power and easiness of modulation into consideration. In multicolor image formation, it is preferred that laser beam emission is performed on conditions that the beam diameter of laser beam on the light-to-heat converting layer is from 5 to 50 µm (in particular from 6 to 30 µm), and scanning speed is preferably 1 m/second or more (in particular 3 m/second).

In addition, it is preferred in multicolor image formation that the layer thickness of the image-forming layer in the black heat transfer sheet is larger than the layer thickness of the image-forming layer in each of yellow, magenta and cyan heat transfer sheet, and is preferably from 0.5 to 0.7 µm. By adopting this constitution, the reduction of density due to transfer unevenness by the irradiation of the black heat transfer sheet with laser beams can be suppressed.

By restricting the layer thickness of the image-forming layer in the black heat transfer sheet to 0.5 µm or more, transfer unevenness is not generated by high energy recording, image density is maintained, thus required image density as the proof of printing can be attained. This tendency becomes more conspicuous under high humidity conditions, and so density variation due to circumferential conditions can be prevented. On the other hand, by making the layer thickness 0.7 µm or less, transfer sensitivity can be maintained at recording time by laser and touching of dots and fine lines can be improved. This tendency becomes more conspicuous under low humidity conditions. Definition can also be improved by the layer thickness of this range. The layer thickness of the image-forming layer in the black heat transfer sheet is more preferably from 0.55 to 0.65 µm and particularly preferably 0.60 µm.

Further, it is preferred that the layer thickness of the image-forming layer in the above black heat transfer sheet is from 0.5 to 0.7 µm, and the layer thickness of the image-forming layer in each of the above yellow, magenta and cyan heat transfer sheets is from 0.2 to less than 0.5 μm.

By making the layer thickness of each image-forming layer in yellow, magenta and cyan heat transfer sheets 0.2 μm or more, image density can be maintained without generating transfer unevenness when recording is performed by laser irradiation. On the other hand, by making the layer thickness 0.5 μm or less, transfer sensitivity and definition can be improved. The layer thickness of the image-forming layer in yellow, magenta and cyan heat transfer sheets is more preferably from 0.3 to 0.45 μm.

It is preferred for the image-forming layer in the black heat transfer sheet to contain carbon black, and the carbon black preferably comprises at least two carbon blacks having different tinting strength from the viewpoint of capable of controlling reflection density with maintaining P/B (pigment/binder) ratio in a specific range.

The tinting strength of carbon black can be represented variously, e.g., PVC blackness disclosed in JP-A-10-140033, can be exemplified. PVC blackness is the evaluation of blackness, i.e., carbon black is added to PVC resin, dispersed by a twin roll mill and made to a sheet, and the blackness of a sample is evaluated by visual judgment, and Carbon Black #40 and #45 (manufactured by Mitsubishi Chemicals Co., Ltd.) are taken as 1 point and 10 points respectively as the standard values. Two or more carbon blacks having different PVC blackness can be used arbitrarily according to purposes.

The specific producing method of a sample is described below.

Producing Method of Sample

In a banbury mixer having a capacity of 250 ml, 40 mass % of sample carbon black was compounded to LDPE (low density polyethylene) resin and kneaded at 115° C. for 4 minutes.

| Compounding condition | |
|---|---|
| LDPE resin | 101.89 g |
| Calcium stearate | 1.39 g |
| Irganox ® | 0.87 g |
| Sample carbon black | 69.43 g |

In the next place, dilution was performed in a twin roll mill at 120° C. so as to reach the concentration of carbon black of 1 mass %.

| Preparation condition of diluted compound | |
|---|---|
| LDPE resin | 58.3 g |
| Calcium stearate | 0.2 g |
| Resin compounded with 40 mass % of carbon black | 1.5 g |

The above-prepared product was made to s sheet having a slit width of 0.3 mm, the sheet was cut to chips, and a film having a thickness of 65±3 μm was formed on a hot plate of 240° C.

A multicolor image may be formed, as described above, by the method of using the heat transfer sheet, and repeatedly superposing many image layers (an image-forming layer on which an image is formed) on the same image-receiving sheet, alternatively a multicolor image may be formed by the method and then transferring these images to actual paper.

With the latter case, for example, heat transfer sheets each having image-forming layer containing coloring material mutually different in hue, independently four kinds (cyan, magenta, yellow, black) of laminates for image-forming comprising the above heat transfer sheet combined with an image-receiving sheet. Laser emission according to digital signals on the basis of the image is performed to each laminate through a color separation filter, subsequently the heat transfer sheet and the image-receiving sheet are peeled off, to thereby form independently a color separated image of each color on each image-receiving sheet. Thereafter, the thus-formed each color separated image is laminated in sequence on an actual support, such as actual printing paper prepared separately, or on a support approximates thereto, thus a multicolor image can be formed.

It is preferred for the heat transfer sheet utilizing laser irradiation to form an image by the system of converting laser beams to heat and membrane transferring the image-forming layer containing a pigment on the image-receiving sheet using the above converted heat energy. However, these techniques used for the development of the image-forming material comprising the heat transfer sheet and the image-receiving sheet can be arbitrarily applied to the development of the heat transfer sheets of a heat fusion transfer system, an ablation transfer system, and sublimation system and/or the development of an image-receiving sheet, and the system of the present invention may include image-forming materials used in these systems.

A heat transfer sheet and an image-receiving sheet are described below in detail.

Heat Transfer Sheet

A heat transfer sheet comprises a support having thereon at least a light-to-heat converting layer and an image-receiving layer, and, if necessary, other layers.

Support

The materials of the support of the heat transfer sheet are not particularly restricted, and various supports can be used according to purposes. The support preferably has stiffness, good dimensional stability, and heat resistance capable of resisting the heat at image formation. The preferred examples of the support include synthetic resins, e.g., polyethylene terephthalate, polyethylene-2,6-naphthalate, polycarbonate, polymethyl methacrylate, polyethylene, polypropylene, polyvinyl chloride, polyvinylidene chloride, polystyrene, styrene-acrylonitrile copolymer, polyamide (aromatic and aliphatic), polyimide, polyamideimide, and polysulfone. Biaxially stretched polyethylene terephthalate is preferred above all from the viewpoint of mechanical strength and dimensional stability against heat. When resins are used in the preparation of color proofs utilizing laser recording, it is preferred to form the support of a heat transfer sheet from transparent synthetic resins which transmit laser beams. The thickness of the support is preferably from 25 to 130 μm, particularly preferably from 50 to 120 μm. The central line average surface roughness Ra of the support of the side on which an image-forming layer is provided is preferably less than 0.1 μm (the value obtained by measurement using Surfcom, manufactured by Tokyo Seiki Co., Ltd., according to JIS B0601) The Young's modulus of the support in the machine direction is preferably from 200 to 1,200 kg/mm$^2$ (=about 2 to 12 GPa), and the Young's modulus of the support in the transverse direction is preferably from 250 to 1,600 kg/mm$^2$ (=about 2.5 to 16 GPa) The F-5 value of the support in the machine direction is preferably from 5 to 50 kg/mm$^2$ (=about 49 to 490 MPa), and the F-5 value of the support in the transverse direction is preferably from 3 to 30 kg/mm$^2$ (=about 29.4 to 294 MPa), and the F-5 value of the support in the machine direction is generally higher than the F-5 value of the support in the transverse direction, but when it is necessary to make the strength in the transverse direction high, this rule does not apply to the case. Further, the heat shrinkage at 100° C. for 30 minutes of the support in the machine direction is preferably 3% or less, more preferably 1.5% or less, the heat shrinkage at 80° C. for 30 minutes is preferably 1% or less, more preferably 0.5% or less. The breaking strength is from 5 to 100 kg/mm$^2$ (=about 49 to 980 MPa) in both directions, and the modulus of elasticity is preferably from 100 to 2,000 kg/mm$^2$ (=about 0.98 to 19.6 GPa).

The support of the heat transfer sheet may be subjected to surface activation treatment and/or one or two or more undercoat layers may be provided on the support for the purpose of improving the adhesion with the light-to-heat converting layer which is provided on the support. As the examples of the surface activation treatments, glow discharge treatment and corona discharge treatment can be exemplified. As the materials of the undercoat layer, materials having high adhering property to both surfaces of the support and the light-to-heat converting layer, low heat conductivity, and excellent heat resisting property are preferably used. As the materials of such an undercoat layer, styrene, styrene-butadiene copolymer and gelatin can be exemplified. The thickness of the undercoat layer is generally from 0.01 to 2 μm as a whole. If necessary, various functional layers such as a reflection-preventing layer and an antistatic layer may be provided on the surface of the heat transfer sheet of the side opposite to the side on which a light-to-heat converting layer is provided, or the support may be subjected to various surface treatments.

Backing Layer

It is preferred to provide a backing layer on the surface of the heat transfer sheet of the side opposite to the side on which a light-to-heat converting layer is provided. The backing layer preferably comprises the first backing layer contiguous to the support and the second backing layer provided on the side of the support opposite to the side on which the first backing layer is provided. In the present invention, the mass A of the antistatic agent contained in the first backing layer to the mass B of the antistatic agent contained in the second backing layer, B/A is preferably less than 0.3. When B/A is 0.3 or more, a sliding property and powder dropout resistance of the backing layer are liable to be deteriorated.

The layer thickness C of the first backing layer is preferably from 0.01 to 1 μm, more preferably from 0.01 to 0.2 μm. The layer thickness D of the second backing layer is preferably from 0.01 to 1 μm, more preferably from 0.01 to 0.2 μm. The ratio of the layer thickness of the first backing layer to that of the second backing layer, C/D is preferably from 1/2 to 5/1.

As the antistatic agents for use in the first and second backing layers, a nonionic surfactant, e.g., polyoxyethylene alkylamine, and glycerol fatty acid ester; a cationic surfactant, e.g., quaternary ammonium salt; an anionic surfactant, e.g., alkylphosphate; an ampholytic surfactant and electrically conductive resin can be exemplified.

Electrically conductive fine particles can also be used as antistatic agents. The examples of such electrically conductive fine particles include oxides, e.g., ZnO, TiO$_2$, SnO$_2$, Al$_2$O$_3$, In$_2$O$_3$, MgO, BaO, CoO, CuO, Cu$_2$O, CaO, SrO, BaO$_2$, PbO, PbO$_2$, MnO$_3$, MoO$_3$, SiO$_2$, ZrO$_2$, Ag$_2$O, Y$_2$O$_3$, Bi$_2$O$_3$, Ti$_2$O$_3$, Sb$_2$O$_3$, Sb$_2$O$_5$, K$_2$Ti$_6$O$_{13}$, NaCaP$_2$O$_{18}$, and MgB$_2$O$_5$; sulfide, e.g., CuS and ZnS; carbide, e.g., SiC, TiC, ZrC, VC, NbC, MoC and WC; nitride, e.g., Si$_3$N$_4$, TiN, ZrN, VN, NbN and Cr$_2$N; boride, e.g., TiB$_2$, ZrB$_2$, NbB$_2$, TaB$_2$, CrB, MoB, WB and LaB$_5$; silicide, e.g., TiSi$_2$, ZrSi$_2$, NbSi$_2$, TaSi$_2$, CrSi$_2$, MoSi$_2$ and WSi$_2$; metal salts, e.g., BaCO$_3$, CaCO$_3$, SrCO$_3$, BaSO$_4$ and CaSO$_4$; and complex, e.g., SiN$_4$—SiC and 9Al$_2$O$_3$-2B$_2$O$_3$. These electrically conductive fine particles may be used alone or in combination of two or more. Of these fine particles, SnO$_2$, ZnO, Al$_2$O$_3$, TiO$_2$, In$_2$O$_3$, MgO, BaO and MoO$_3$ are preferred, SnO$_2$, ZnO, In$_2$O$_3$ and TiO$_2$ are more preferred, and SnO$_2$ is particularly preferred.

When the heat transfer sheet of the present invention is used in a laser heat transfer system, the antistatic agent used in the backing layer is preferably substantially transparent so that laser beams can be transmitted.

When electrically conductive metallic oxides are used as the antistatic agent, their particle size is preferably smaller to make light scattering as small as possible, but the particle size should be determined using the ratio of the refractive indices of the particle and the binder as parameter, which can be obtained according to the theory of Mie. The average particle size of the electrically conductive metallic oxides is generally from 0.01 to 0.5 μm, preferably from 0.03 to 0.2 μm. The average particle size used herein is the value of the particle size of not only the primary particles of the electrically conductive metallic oxides but the particle size of the particles having higher structure is included.

Besides an antistatic agent, the first and second backing layers may contain various additives, such as a surfactant, a sliding agent and a matting agent. The amount of the antistatic agent contained in the first backing layer is preferably from 10 to 1,000 mass parts per 100 mass parts of the binder, more preferably from 200 to 800 mass parts. The amount of the antistatic agent contained in the second backing layer is preferably from 0 to 300 mass parts per 100 mass parts of the binder, more preferably from 0 to 100 mass parts.

As the binders for use for forming the first and second backing layers, homopolymers and copolymers of acrylic acid-based monomers, e.g., acrylic acid, methacrylic acid, acrylic ester and methacrylic ester, cellulose-based polymers, e.g., nitrocellulose, methyl cellulose, ethyl cellulose and cellulose acetate, vinyl-based polymers and copolymers of vinyl compounds, e.g., polyethylene, polypropylene, polystyrene, vinyl chloride-based copolymer, vinyl chloride-vinyl acetate copolymer, polyvinyl pyrrolidone, polyvinyl butyral and polyvinyl alcohol, condensed polymers, e.g., polyester, polyurethane and polyamide, rubber-based thermoplastic polymers, e.g., butadiene-styrene copolymer, polymers obtained by polymerization or crosslinking of photopolymerizable or heat polymerizable compounds, e.g., epoxy compounds, and melamine compounds can be exemplified.

Image-forming Layer

An image-forming layer contains at least a pigment which is transferred to an image-receiving sheet and forms an image, in addition, a binder for forming the layer and, if necessary, other components.

Pigments are broadly classified to organic pigments and inorganic pigments, and they have respectively characteristics such that the former are particularly excellent in the transparency of the film, and the latter are excellent in shielding property, thus they may be used arbitrarily according to purpose. When the heat transfer sheet is used for the proofs of printing colors, organic pigments which are coincident with yellow, magenta, cyan and black generally used in printing ink or near to them in hue are preferably used. Further, metallic powder and fluorescent pigments are also used in some cases. The examples of the pigments which are preferably used include azo pigments, phthalocyanine pigments, anthraquinone pigments, dioxazine pigments, quinacridone pigments, isoindolinone pigments and nitro pigments. The pigments for use in an image-forming layer are listed below by colors, but the present invention is not limited thereto.

1) Yellow Pigment
Pigment Yellow 12 (C.I. No. 21090)
Example:
  Permanent Yellow DHG (manufactured by Clariant Japan, K.K.), Lionol Yellow 1212B (manufactured by Toyo Ink Mfg. Co., Ltd.), Irgalite Yellow LCT (manufactured by Ciba Specialty Chemicals), Symuler Fast Yellow GTF 219 (manufactured by Dainippon Chemicals and Ink Co., Ltd.)
Pigment Yellow 13 (C.I. No. 21100)
Example:
  Permanent Yellow GR (manufactured by Clariant Japan, K.K.), Lionol Yellow 1313 (manufactured by Toyo Ink Mfg. Co., Ltd.)
Pigment Yellow 14 (C.I. No. 21095)
Example:
  Permanent Yellow G (manufactured by Clariant Japan, K.K.), Lionol Yellow 1401-G (manufactured by Toyo Ink Mfg. Co., Ltd.), Seika Fast Yellow 2270 (manufactured by Dainichi Seika K.K.), Symuler Fast Yellow 4400 (manufactured by Dainippon Chemicals and Ink Co., Ltd.)
Pigment Yellow 17 (C.I. No. 21105)
Example:
  Permanent Yellow GG02 (manufactured by Clariant Japan, K.K.), Symuler Fast Yellow SGF (manufactured by Dainippon Chemicals and Ink Co., Ltd.)
Pigment Yellow 155
Example:
  Graphtol Yellow 3GP (manufactured by Clariant Japan, K.K.)
Pigment Yellow 180 (C.I. No. 21290)
Example:
  Novoperm Yellow P-HG (manufactured by Clariant Japan, K.K.), PV Fast Yellow HG (manufactured by Clariant Japan, K.K.)
Pigment Yellow 139 (C.I. No. 56298)
Example:
  Novoperm Yellow M2R 70 (manufactured by Clariant Japan, K.K.)

2) Magenta Pigment
Pigment Red 57:1 (C.I. No. 15850:1)
Example:
  Graphtol Rubine L6B (manufactured by Clariant Japan, K.K.), Lionol Red 6B-4290G (manufactured by Toyo Ink Mfg. Co., Ltd.), Irgalite Rubine 4BL (manufactured by Ciba Specialty Chemicals), Symuler Brilliant Carmine 6B-229 (manufactured by Dainippon Chemicals and Ink Co., Ltd.)
Pigment Red 122 (C.I. No. 73915)
Example:
  Hosterperm Pink E (manufactured by Clariant Japan, K.K.), Lionogen Magenta 5790 (manufactured by Toyo Ink Mfg. Co., Ltd.), Fastogen Super Magenta RH (manufactured by Dainippon Chemicals and Ink Co., Ltd.)
Pigment Red 53:1 (C.I. No. 15585:1)
Example:
  Permanent Lake Red LCY (manufactured by Clariant Japan, K.K.), Symuler Lake Red C conc (manufactured by Dainippon Chemicals and Ink Co., Ltd.)
Pigment Red 48:1 (C.I. No. 15865:1)
Example:
  Lionol Red 2B-3300 (manufactured by Toyo Ink Mfg. Co., Ltd.), Symuler Red NRY (manufactured by Dainippon Chemicals and Ink Co., Ltd.)
Pigment Red 48:2 (C.I. No. 15865:2)
Example:
  Permanent Red W2T (manufactured by Clariant Japan, K.K.), Lionol Red LX235 (manufactured by Toyo Ink Mfg. Co., Ltd.), Symuler Red 3012 (manufactured by Dainippon Chemicals and Ink Co., Ltd.)
Pigment Red 48:3 (C.I. No. 15865:3)
Example:
  Permanent Red 3RL (manufactured by Clariant Japan, K.K.), Symuler Red 2BS (manufactured by Dainippon Chemicals and Ink Co., Ltd.)
Pigment Red 177 (C.I. No. 65300)
Example:
  Cromophtal Red A2B (manufactured by Ciba Specialty Chemicals)

3) Cyan Pigment
Pigment Blue 15 (C.I. No. 74160)
Example:
  Lionol Blue 7027 (manufactured by Toyo Ink Mfg. Co., Ltd.), Fastogen Blue BB (manufactured by Dainippon Chemicals and Ink Co., Ltd.)
Pigment Blue 15:1 (C.I. No. 74160)
Example:
  Hosterperm Blue A2R (manufactured by Clariant Japan, K.K.), Fastogen Blue 5050 (manufactured by Dainippon Chemicals and Ink Co., Ltd.)
Pigment Blue 15:2 (C.I. No. 74160)
Example:
  Hosterperm Blue AFL (manufactured by Clariant Japan, K.K.), IrgaliteBlueBSP (manufactured by Ciba Specialty Chemicals), Fastogen Blue GP (manufactured by Dainippon Chemicals and Ink Co., Ltd.)
Pigment Blue 15:3 (C.I. No. 74160)
Example:
  Hosterperm Blue B2G (manufactured by Clariant Japan, K.K.), Lionol Blue FG7330 (manufactured by Toyo Ink Mfg. Co., Ltd.), Cromophtal Blue 4GNP (manufactured by Ciba Specialty Chemicals), Fastogen Blue FGF (manufactured by Dainippon Chemicals and Ink Co., Ltd.)
Pigment Blue 15:4 (C.I. No. 74160)
Example:
  Hosterperm Blue BFL (manufactured by Clariant Japan, K.K.), Cyanine Blue 700-10FG (manufactured by Toyo Ink Mfg. Co., Ltd.), Irgalite Blue GLNF (manufactured by Ciba Specialty Chemicals), Fastogen Blue FGS (manufactured by Dainippon Chemicals and Ink Co., Ltd.)
Pigment Blue 15:6 (C.I. No. 74160)
Example:
  Lionol Blue ES (manufactured by Toyo Ink Mfg. Co., Ltd.) Pigment Blue 60 (C.I. No. 69800)
Example:
  Hosterperm Blue RL01 (manufactured by Clariant Japan, K.K.), Lionogen Blue 6501 (manufactured by Toyo Ink Mfg. Co., Ltd.)

4) Black Pigment
Pigment Black 7 (Carbon Black C.I. No. 77266)
Example:
  Mitsubishi Carbon Black MA100 (manufactured by Mitsubishi Chemicals Co., Ltd.), Mitsubishi Carbon Black

5 (manufactured by Mitsubishi Chemicals Co., Ltd.), Black Pearls 430 (manufactured by Cabot Co.)

As the pigments which can be used in the present invention, commercially available products can be arbitrarily selected by referring to Ganryo Binran (Pigment Handbook), compiled by Nippon Ganryo Gijutsu Kyokai, published by Seibundo-Shinko-Sha (1989), and COLOUR INDEX, THE SOCIETY OF DYES & COLOURIST, Third Ed. (1987).

The average particle size of the above pigments is preferably from 0.03 to 1 μm, more preferably from 0.05 to 0.5 μm.

When the particle size is 0.03 μm or more, the costs for dispersion are not increased and the dispersion solution does not cause gelation, while when it is 1 μm or less, since coarse particles are not contained in pigments, good adhesion of the image-forming layer and the image-receiving layer can be obtained, further, the transparency of the image-forming layer can also be improved.

As the binders for the image-forming layer, amorphous organic high polymers having a softening point of from 40 to 150° C. are preferably used. As the amorphous organic high polymers, homopolymers and copolymers of styrene, derivatives thereof, and substitution products thereof, e.g., butyral resin, polyamide resin, polyethyleneimine resin, sulfonamide resin, polyester polyol resin, petroleum resin, styrene, vinyl toluene, α-methylstyrene, 2-methylstyrene, chlorostyrene, vinylbenzoic acid, sodium vinylbenzenesulfonate, and aminostyrene, methacrylic esters and methacrylic acid, e.g., methyl methacrylate, ethyl methacrylate, butyl methacrylate, and hydroxyethyl methacrylate, acrylic esters and acrylic acid, e.g., methyl acrylate, ethyl acrylate, butyl acrylate, and α-ethylhexyl acrylate, dienes, e.g., butadiene and isoprene, homopolymers of vinyl monomers or copolymers of vinyl monomers with other monomers, e.g., acrylonitrile, vinyl ethers, maleic acid and maleic esters, maleic anhydride, cinnamic acid, vinyl chloride and vinyl acetate can be used. Two or more of these resins may be used as mixture.

Further, as the binders for the image-forming layer, non-aqueous resins are preferred, and resins soluble in a non-aqueous solvent having an SP value of from 16 to 30 in 0.1 mass % or more are preferred, more preferably 1 mass % or more. In addition to the above hydrophobic solvents, as the solvents of a wide use having the above SP value, the following compounds can be exemplified, and SP values are shown in parentheses, e.g., cyclohexanol (23.3), n-propyl alcohol (24.3), ethanol (26.0), and methanol (29.7). SP value is described in *Polymer Handbook*, 3rd Ed., VII/526–539.

The solubility of the binder in the image-forming layer in the coating solvent for forming the image-forming layer is also preferably 0.1 mass % or more, more preferably 1 mass % or more.

It is preferred for the image-forming layer to contain a pigment in an amount of from 30 to 70 mass %, more preferably from 30 to 50 mass %. It is also preferred for the image-forming layer to contain a resin in an amount of from 30 to 70 mass %, more preferably from 40 to 70 mass %.

The image-forming layer can contain the following components (1) to (3) as the above-described other components.
(1) Waxes The examples of waxes include mineral waxes, natural waxes and synthetic waxes. As the examples of the mineral waxes, paraffin wax, microcrystalline wax, ester wax, petroleum wax such as oxide wax, montan wax, ozokerite and ceresin can be exemplified. Paraffin wax is preferred above all. The paraffin wax is separated from petroleum, and various products are commercially available according to melting points.

As the examples of the natural waxes, vegetable wax, e.g., carnauba wax, Japan wax, wax and wax, animal wax, e.g., beeswax, insect wax, shellac wax and spermaceti can be exemplified.

The synthetic waxes are generally used as a lubricant and generally comprises higher fatty acid compounds. As the examples of the synthetic waxes, the following can be exemplified.
1) Fatty Acid-based Wax A straight chain saturated fatty acid represented by the following formula:

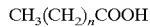

In the formula, n represents an integer of from 6 to 28. As the specific examples, stearic acid, behenic acid, palmitic acid, 12-hydroxystearic acid, and azelaic acid can be exemplified.

In addition, the metal salts of the above fatty acids (e.g., with K, Ca, Zn and Mg) can be exemplified.
2) Fatty Acid Ester-based Wax As the examples of the fatty acid esters, ethyl stearate, lauryl stearate, ethyl behenate, hexyl behenate and behenyl myristate can be exemplified.
3) Fatty Acid Amide-based Wax As the examples of the fatty acid amides, stearic acid amide and lauric acid amide can be exemplified.
4) Aliphatic Alcohol-based Wax A straight chain saturated aliphatic alcohol represented by the following formula:

In the formula, n represents an integer of from 6 to 28. As the specific examples, stearyl alcohol can be exemplified.

Of the above synthetic waxes, higher fatty acid amides such as stearic acid amide and lauric acid amide are preferred. Further, these wax compounds can be used alone or in arbitrary combination, as desired.
(2) Plasticizers As the plasticizers, ester compounds are preferred, and well-known plasticizers can be exemplified, such as phthalic acid esteers, e.g., dibutyl phthalate, di-n-octyl phthalate, di(2-ethylhexyl) phthalate, dinonyl phthalate, dilauryl phthalate, butyllauryl phthalate, and butylbenzyl phthalate, aliphatic dibasic acid esters, e.g., di(2-ethylhexyl) adipate, and di(2-ethylhexyl) disebacate, phosphoric acid triesters, e.g., tricresyl phosphate, and tri(2-ethylhexyl) phosphate, polyol polyesters, e.g., polyethylene glycol ester, and epoxy compounds, e.g., epoxy fatty acid ester. Of these, esters of vinyl monomers, in particular, acrylic acid esters and methacrylic acid esters are preferred in view of the improvement of transfer sensitivity, the improvement of transfer unevenness, and the big controlling effect of breaking elongation.

As the acrylic acid or methacrylic acid ester compounds, polyethylene glycol dimethacrylate, 1,2,4-butanetriol methacrylate, trimethylolethane triacrylate, pentaerythritol acrylate, pentaerythritol tetraacrylate, dipentaerythritol polyacrylate can be exemplified.

The above plasticizers may be high polymers, and polyesters are preferred above all, since the addition effect is large and they hardly diffuse under storage conditions. As the polyesters, e.g., sebacic acid polyester and adipic acid polyester are exemplified.

The additives contained in the image-forming layer are not limited thereto. The plasticizers may be used alone or in combination of two or more.

When the addition amount of these additives in the image-forming layer are too much, in some cases, the definition of the transferred image is deteriorated, the film strength of the image-forming layer itself is reduced, or the unexposed area is transferred to the image-receiving sheet due to the reduction of the adhesion of the light-to-heat converting layer and the image-forming layer. From the above viewpoint, the content of the waxes is preferably from 0.1 to 30 mass % of the entire solid content in the image-forming layer, more preferably from 1 to 20 mass %. The content of the plasticizers is preferably from 0.1 to 20 mass % of the entire solid content in the image-forming layer, more preferably from 0.1 to 10 mass %.

(3) Others

In addition to the above components, the image-forming layer may further contain a surfactant, inorganic or organic fine particles (metallic powder and silica gel), oils (e.g., linseed oil and mineral oil), a thickener and an antistatic agent. Except for the case of obtaining a black image, energy necessary for transfer can be reduced by containing the materials which absorb the wavelength of the light sources for use in image recording. As the materials which absorb the wavelength of the light sources, either pigments or dyes may be used, but in the case of obtaining a color image, it is preferred in view of color reproduction to use dyes having less absorption in visible region and large absorption in the wavelength of light sources and use infrared light sources such as a semiconductor laser in image recording. As the examples of infrared absorbing dyes, the compounds disclosed in JP-A-3-103476 can be exemplified.

The image-forming layer can be provided by dissolving or dispersing the pigment and the binder, to thereby prepare a coating solution, coating the coating solution on the light-to-heat converting layer (when the following heat-sensitive releasing layer is provided on the light-to-heat converting layer, on the layer) and drying. As the solvent for use in the preparation of the coating solution, n-propyl alcohol, methyl ethyl ketone, propylene glycol monomethyl ether (MFG), methanol and water can be exemplified. Coating and drying can be performed according to ordinary coating and drying methods.

A heat-sensitive releasing layer containing a heat-sensitive material which generates gas by the action of the heat generated in the light-to-heat converting layer or releases adhesive moisture to thereby lower the adhesion strength between the light-to-heat converting layer and the image-forming layer can be provided on the light-to-heat converting layer of the heat transfer sheet. As such heat-sensitive materials, compounds (polymers or low molecular compounds) which themselves are decomposed by heat, or properties of which are changed by heat, and generate gas, and compounds (polymers or low molecular compounds) which is absorbing, or is being adsorbed with, a considerable amount of easily-gasifying gases, such as moisture, can be used. These compounds may be used in combination.

As the examples of the polymers which themselves are decomposed by heat, or properties of which are changed by heat, and generate gas, self oxidizing polymers, e.g., nitrocellulose, halogen-containing polymers, e.g., chlorinated polyolefin, chlorinated rubber, poly-rubber chloride, polyvinyl chloride, and polyvinylidene chloride, acryl-based polymers, e.g., polyisobutyl methacrylate which is being adsorbed with gasifying compound such as moisture, cellulose esters, e.g., ethyl cellulose which is being adsorbed with gasifying compound such as moisture, and natural high molecular compounds, e.g., gelatin which is being adsorbed with gasifying compound such as moisture can be exemplified. As the examples of low molecular compounds which are decomposed by heat, or properties of which are changed by heat, and generate gas, diazo compounds and azide compounds which generate heat, decomposed and generate gas can be exemplified.

Decomposition and property change by heat of the heat-sensitive material as described above preferably occur at 280° C. or less, particularly preferably 230° C. or less.

When low molecular compounds are used as the heat-sensitive material of the heat-sensitive releasing layer, it is preferred to combine the material with the binder. As the binder, the polymers which themselves are decomposed by heat, or properties of which are changed by heat, and generate gas, can be used, but ordinary binders which do not have such property can also be used. When the heat-sensitive low molecular compound is used in combination with the binder, the mass ratio of the former to the latter is preferably from 0.02/1 to 3/1, more preferably from from 0.05/1 to 2/1. It is preferred that the heat-sensitive releasing layer cover the light-to-heat converting layer almost entirely and the thickness is generally from 0.03 to 1 $\mu$m, and preferably from 0.05 to 0.5 $\mu$m.

When the constitution of the heat transfer sheet comprises a support having provided thereon a light-to-heat converting layer, a heat-sensitive releasing layer and an image-forming layer in this order, the heat-sensitive releasing layer is decomposed by heat conducted from the light-to-heat converting layer, or properties of which are changed by heat, and generates gas. The heat-sensitive releasing layer is partially lost or cohesive failure is caused in the heat-sensitive releasing layer due to the decomposition or gas generation, as a result the adhesion strength between the light-to-heat converting layer and the image-forming layer is lowered and, according to the behavior of the heat-sensitive releasing layer, a part of the heat-sensitive releasing layer migrates to the surface of the image finally formed with the image-forming layer and causes color mixture of the image. Therefore, it is preferred that the heat-sensitive releasing layer is scarcely colored, i.e., the heat-sensitive releasing layer shows high transmittance to visible rays, so that color mixture does not appear visually on the image formed, even if such transfer of the heat-sensitive releasing layer occurs. Specifically, the absorptivity of the heat-sensitive releasing layer to visible rays is 50% or less, preferably 10% or less.

Further, instead of providing an independent heat-sensitive releasing layer, the heat transfer sheet may take the constitution such that the light-to-heat converting layer is formed by adding the heat-sensitive material to the coating solution of the light-to-heat converting layer, and the light-to-heat converting layer doubles as the heat-sensitive releasing layer.

It is preferred that the coefficient of static friction of the outermost layer of the heat transfer sheet of the side on which the image-forming layer is provided is 0.35 or less, preferably 0.20 or less. When the coefficient of static friction of the outermost layer is 0.35 or less, the contamination of the roll for carrying the heat transfer sheet can be suppressed and the quality of the image formed can be improved. The measurement of coefficient of static friction is according to the method disclosed in paragraph [0011] of Japanese Patent Application No. 2000-85759.

It is preferred that the image-forming layer surface has smooster value [means a value measured by apparatus called smooster: Digital Smooster DSM-2 Type manufactured by TOKYO ELECTRONIC INDUSTRY CO., LTD.] at 23° C., 55% RH of from 0.5 to 50 mmHg (=about 0.0665 to 6.65 kPa), and Ra of from 0.05 to 0.4 $\mu$m, which can reduce a great number of micro voids by which the image-receiving layer and the image-forming layer cannot be brought into contact with each other at the contact area, which is preferred in the point of transfer and image quality. The Ra value can be measured by a surface roughness meter (Surfcom, manufactured by Tokyo Seiki Co., Ltd.) according to JIS B0601. It is preferred that the surface hardness of the image-forming layer is 10 g or more when measured with a sapphire needle. The image-forming layer is electrically charged according to U.S. test standard 4046 and then grounded, the electrification potential 1 second after grounding of the image-forming layer is preferably from −100 to 100 V. It is preferred that the surface resistance of the image-forming layer at 23° C., 55% RH is $10^9$ Ω or less.

In the next place, the image-receiving sheet which can be used in combination with the heat transfer sheet is described below.

Image-Receiving Sheet

Layer Constitution

The constitution of the image-receiving sheet generally comprises a support having provided thereon one or more image-receiving layer(s) and, if necessary, any one or two or more layer(s) of a cushioning layer, a releasing layer and an intermediate layer is(are) provided between the support and the image-receiving layer. It is preferred in view of conveyance to provide a backing layer on the surface of the support opposite to the side on which the image-receiving layer is provided.

Support

A plastic sheet, a metal sheet, a glass sheet, a resin-coated paper, a paper, and ordinary sheet-like substrate materials, e.g., various compleses, are used as the support. As the examples of plastic sheets, a polyethylene terephthalate sheet, a polycarbonate sheet, a polyethylene sheet, a polyvinyl chloride sheet, a polyvinylidene chloride sheet, a polystyrene sheet, a styrene-acrylonitrile sheet, and a polyester sheet can be exemplified. As the examples of papers, an actual printing paper and a coated paper can be used.

It is preferred for the support to have minute voids in view of capable of improving the image quality. Such supports can be produced by mixing a thermoplastic resin and a filler comprising an inorganic pigment and a high polymer incompatible with the above thermoplastic resin to thereby prepare a mixed melt, extruding the mixed melt by a melt extruder to prepare a monolayer or multilayer film, and further monoaxially or biaxially stretching the film. In this step, the void ratio is determined by the selection of the resin and the filler, a mixing ratio and stretching condition.

As the thermoplastic resins, a polyolefin resin such as polypropylene and a polyethylene terephthalate resin are preferred, since they are excellent in crystallizability and orientation property and voids can be formed easily. It is preferred to use the polyolefin resin or the polyethylene terephthalate resin as the main component and use a small amount of other thermoplastic resin arbitrarily in combination. The pigments for use as the filler preferably have an average particle size of from 1 to 20 μm, e.g., calcium carbonate, clay, diatomaceous earth, titanium oxide, aluminum hydroxide and silica can be used. As the incompatible resins for use as the filler, when polypropylene is used as the thermoplastic resin, it is preferred to combine polyethylene terephthalate as the filler. The support having minute voids is disclosed in detail in Japanese Patent Application No. 11-290570.

The content of the filler, e.g., an inorganic pigment, in the support is generally from 2 to 30% or so by volume.

The thickness of the support in the image-receiving sheet is generally from 10 to 400 μm, preferably from 25 to 200 μm. For enhancing the adhesion with the image-receiving layer (or the cushioning layer) or with the image-forming layer in the heat transfer sheet, the surface of the support in the image-receiving sheet may be subjected to surface treatment, e.g., corona discharge treatment and glow discharge treatment.

Image-receiving Layer

It is preferred to provide one or more image-receiving layer(s) on support in the image-receiving sheet for transferring and fixing the image-forming layer on the image-receiving sheet. The image-receiving layer is preferably a layer formed with organic polymer binder as the main component. The binders are preferably thermoplastic resins, such as homopolymers and copolymers of acryl-based monomers, e.g., acrylic acid, methacrylic acid, acrylic ester, and methacrylic ester, cellulose-based polymers, e.g., methyl cellulose, ethyl cellulose, and cellulose acetate, homomonomers and copolymers of vinyl-based monomers, e.g., polystyrene, polyvinyl pyrrolidone, polyvinyl butyral, polyvinyl alcohol, and polyvinyl chloride, condensed polymers, e.g., polyester and polyamide, and rubber-based polymers, e.g., butadiene-styrene copolymer. The binder for use in the image-receiving layer is preferably a polymer having a glass transition temperature (Tg) of 90° C. or lower for obtaining appropriate adhesion with the image-forming layer. For that purpose, it is possible to added a plasticizer to the image-forming layer. The binder polymer preferably has Tg of 30° C. or more for preventing blocking between sheets. As the binder polymer of the image-receiving layer, it is particularly preferred to use the same or analogous binder polymer in the image-forming layer from the point of improving the adhesion with the image-forming layer at laser recording and improving sensitivity and image strength.

It is preferred that the image-receiving layer surface has smoother value at 23° C., 55% RH of from 0.5 to 50 mmHg (=about 0.0665 to 6.65 kPa), and Ra of from 0.05 to 0.4 μm, which can reduce a great number of micro voids by which the image-receiving layer and the image-forming layer cannot be brought into contact with each other at the contact area, which is preferred in the point of transfer and image quality. The Ra value can be measured by a surface roughness meter (Surfcom, manufactured by Tokyo Seiki Co., Ltd.) according to JIS B0601. The image-receiving layer is electrically charged according to U.S. test standard 4046and then grounded, the electrification potential 1 second after grounding of the image-receiving layer is preferably from −100 to 100 V. It is preferred that the surface resistance of the image-receiving layer at 23° C., 55% RH is $10^9$ Ω or less. It is preferred that the coefficient of static friction of the surface of the image-receiving layer is 0.2 or less. It is preferred that the surface energy of the surface of the image-receiving layer is from 23 to 35 mg/m².

When the image once formed on the image-receiving layer is re-transferred to the actual printing paper, it is also preferred that at least a part of the image-receiving layer is formed of a photo-setting material. As the composition of such a photo-setting material, combination comprising a) a photopolymerizable monomer comprising at least one kind of a polyfunctional vinyl or vinylidene compound which can form a photopolymer by addition polymerization, b) an organic polymer, and c) a photopolymerization initiator, and, if necessary, additives, e.g., a thermal polymerization inhibitor can be exemplified. As the above polyfunctional vinyl monomer, unsaturated ester of polyol, in particular, an acrylic or methacrylic ester (ethylene glycol diacrylate, pentaerythritol tetraacrylate) is used.

As the organic polymer, the polymers for use for forming the image-receiving layer can be exemplified. As the photopolymerization initiator, an ordinary photo-radical polymerization initiator, e.g., benzophenone and Michler's ketone, can be used in proportion of from 0.1 to 20 mass % in the layer.

The thickness of the image-receiving layer is generally from 0.3 to 7 μm, preferably from 0.7 to 4 μm. When the thickness is 0.3 μm or more, the film strength can be ensured at re-transferring to the actual printing paper. While when it is 4 μm or less, the glossiness of the image after re-transferring to the actual printing paper can be suppressed, thus the approximation to the printed matter can be improved.

Other Layers

A cushioning layer may be provided between the support and the image-receiving layer. When a cushioning layer is provided, it is possible to increase the adhesion of the image-forming layer and the image-receiving layer at heat transfer by laser and the image quality can be improved. Further, even if foreign matters enter between the heat transfer sheet and the image-receiving sheet during recording, the voids between the image-receiving layer and the image-forming layer are reduced by the deforming action of the cushioning layer, as a result the size of image defect such as blank area can be made small. Further, when the image formed by transfer is re-transferred to the actual printing paper, since the surface of the image-receiving layer is deformed according to the surface unevenness of the paper, the transferring property of the image-receiving layer can be improved. Further, by reducing the glossiness of the transferred image, the approximation to the printed matter can be improved.

The cushioning layer is liable to be deformed when stress is laid on the image-receiving layer, hence for obtaining the above effect, the cushioning layer preferably comprises materials having a low modulus of elasticity, materials having elasticity of a rubber, or thermoplastic resins easily softened by heat. The modulus of elasticity of the cushioning layer at room temperature is preferably from 0.5 MPa to 1.0 GPa, more preferably from 1 MPa to 0.5 GPa, and particularly preferably from 10 to 100 MPa. For burying foreign matters such as dust, the penetration according to JIS K2530 (25° C., 100 g, 5 seconds) is preferably 10 or more. The cushioning layer has a glass transition temperature of 80° C. or less, preferably 25° C. or less, and a softening point of preferably from 50 to 200° C. It is also preferred to add a plasticizer to the binder for controlling these physical properties, e.g., Tg.

As the specific materials for use as the binder of the cusioning layer, besides rubbers, e.g., urethane rubber, butadiene rubber, nitrile rubber, acryl rubber and natural rubber, polyethylene, polypropylene, polyester, styrene-butadiene copolymer, ethylene-vinyl acetate copolymer, ethylene-acryl copolymer, vinyl chloride-vinyl acetate copolymer, vinylidene chloride resin, vinyl chloride resin containing a plasticizer, polyamide resin and phenol resin can be exemplified.

The thickness of the cushioning layer varies according to the resins used and other conditions, but is generally from 3 to 100 μm, preferably from 10 to 52 μm.

It is necessary that the image-receiving layer and the cushioning layer are adhered to each other until the stage of laser recording, but it is preferred that they are designed to be releasable for transferring an image to the actual printing paper. For easy release, it is also preferred to provide a releasing layer having a thickness of from 0.1 to 2 μm between the cushioning layer and the image-receiving layer. When the thickness of the releasing layer is too thick, the properties of the cushioning layer are difficult to be exhibited, thus it is necessary to adjust the thickness by the kind of the releasing layer.

The specific examples of the binders of the releasing layer include polyolefin, polyester, polyvinyl acetal, polyvinyl formal, polyparabanic acid, methyl polymethacrylate, polycarbonate, ethyl cellulose, nitrocellulose, methyl cellulose, carboxymethyl cellulose, hydroxypropyl cellulose, polyvinyl alcohol, polyvinyl chloride, urrethane resin, fluorine resin, styrenes, e.g., styrene and acrylonitrile styrene, crosslinked products of these resins, polyamide, polyimide, polyether imide, polysulfone, polyether sulfone, thermo-setting resins having Tg of 65° C. or more, e.g., aramid, and hardened products of these resins. As the hardening agent, generally used hardening agents, e.g., isocyanate and melamine, can be used.

When the binders of the releasing layer is selected taking the above physical properties into consideration, polycarbonate, acetal and ethyl cellulose are preferred in view of the storage stability, and further, when acrylic resins are added to the image-receiving layer, releasability at re-transferring of the image after laser heat transfer becomes good and preferred.

Further, a layer whose adhesion with the image-receiving layer extremely lowers by cooling can be used as the releasing layer. Specifically, layers containing waxes, heat fusion compounds such as binder, and thermoplastic resins as the main component can be used as such a layer.

The examples of the heat fusion compounds are disclosed in JP-A-63-193886. In particular, micro crystalline wax, paraffin wax, and carnauba wax are preferably used. As the thermoplastic resins, ethylene-based copolymers, e.g., ethylene-vinyl acetate resins and cellulose-based resins are preferably used.

As the additives, higher fatty acid, higher alcohol, higher fatty acid ester, amides, and higher amine can be added to the releasing layer, according to necessity.

As another constitution of the releasing layer, there is a layer which has releasability by causing cohesive failure due to fusion or melting by heating. It is preferred to add a supercooling substance to such a releasing layer.

As the supercooling substance, poly-ε-caprolactone, polyoxyethylene, benzotriazole, tribenzylamine and vanillin can be exemplified.

Still another constitution of the releasing layer, a compound to reduce the adhesion with the image-receiving layer is added. As such compounds, silicone-based resins, e.g., silicone oil; fluorine-based resins, e.g., fluorine-containing acrylic resin; polysiloxane resins; acetal-based resins, e.g., polyvinyl butyral, polyvinyl acetal and polyvinyl formal; solid waxes, e.g., polyethylene wax and amide wax; fluorine-based and phosphoric ester-based surfactants can be exemplified.

The releasing layer can be prepared by dissolving the above materials in a solvent or dispersing the above materials in a latex state, and coating on the the cushioning layer by a blade coater, a roll coater, a bar coater, a curtain coater, or gravure coater, or extrusion lamination by hot melt. As another method, the solution or dispersion obtained by dissolving the above materials in a solvent or dispersing the above materials in a latex state is coated on a temporary base by the above coating method, the temporary base is adhered with the cushioning layer, and then the temporary base is released.

In the image-receiving sheet to be combined with the heat transfer sheet, image-receiving layer may double as the cushioning layer, and in that case, image-receiving sheet may take the constitution such as support/cushioning image-receiving layer, or support/undercoat layer/cushioning image-receiving layer. In this case, it is also preferred that cushioning image-receiving layer has releasability so as to be able to re-transfer to the actual printing paper. In this case, the image after being re-transferred to the actual printing paper becomes a glossy image.

The thickness of the cushioning image-receiving layer is from 5 to 100 μm, preferably from 10 to 40 μm.

To provide a backing layer on the side of the support of the image-receiving sheet opposite to the side on which the image-receiving layer is provided is preferred for improving the traveling property of the image-receiving sheet. When a surfactant, an antistatic agent, e.g., fine particles of tin oxide, and a matting agent, e.g., silicon oxide and PMMA particles, are added to the backing layer, the traveling property in the recording unit is improved.

These additives can be added not only to the backing layer but also to the image-receiving layer and other layers, if necessary. The kinds of the additives cannot be prescribed unconditionally according to purposes, but in the case of a matting agent, particles having an average particle size of from 0.5 to 10 μm can be added in an amount of from 0.5 to 80%. The antistatic agent can be added by selecting arbitrarily from among various surfactants and electrically conductive agents so that the surface rersistance of the layer at 23° C., 50% RH becomes preferably $10^{12}$ Ω or less, more preferably $10^9$ Ω or less.

As the binder for use in the backing layer, widely used polymers can be used, e.g., gelatin, polyvinyl alcohol, methyl cellulose, nitrocellulose, acetyl cellulose, aromatic polyamide resin, silicone resin, epoxy resin, alkyd resin, phenol resin, melamine resin, fluorine resin, polyimide resin, urethane resin, acryl resin, urethane-modified silicone resin, polyethylene resin, polypropylene resin, polyester resin, Feflon resin, polyvinyl butyral resin, vinyl chloride-based resin, polyvinyl acetate, polycarbonate, organic boron compounds, aromatic esters, polyurethane fluoride, and polyether sulfone can be used.

When crosslinkable water-soluble binder is used as the binder of the backing layer and crosslinked, dropout prevention of a matting agent and scratch resistance of the backing layer are improved, further it is effective for blocking during storage.

The crosslinking means can be selected with no limitation from heat, actinic rays and pressure, according to the characteristics of the crosslinking agent to be used, and these may be used alone or in combination. For providing an adhering property to the support, an arbitrary adhesion layer may be provdided on the same side of the support on which the backing layer is provided.

Organic or inorganic fine particles are preferably added to the backing layer as the matting agent. As the organic matting agent, polymethyl methacrylate (PMMA), polystyrene, polyethylene, polypropylene, fine particles of other radical polymers, polyester, condensed polymers such as polycarbonate are exemplified.

The backing layer is preferably provided in an amount of about 0.5 to 5 g/m². When the amount is less than 0.5 g/m², coating property is unstable and a problem of dropout of the amtting agent is liable to occur. While when the coating amount greatly exceeds 5 g/m², the particle size of the matting agent becomes extremely large and embossing of the image-receiving layer surface by the backing layer is caused, and in the heat transfer of thin image-forming layer, the dropout of the recorded image and unevenness are liable to occur.

The number average particle size of the matting agent is preferably larger than the layer thickness of the backing layer containing only a binder by 2.5 to 20 μm. Of the matting agents, particles having a particle size of 8 μm or more is necessary in an amount of 5 mg/m² or more, preferably from 6 to 600 mg/m², by which the defect by foreign matters can be improved. Further, when a matting agent of narrow particle distribution, i.e., when a matting agent having the value obtained by dividing the standard deviation of the particle size distribution by the number average particle size, σ/γn (the variation coefficient of particle size distribution) of 0.3 or less, the defect which occurs when particles having an extraordinary big particle size are used can be improved, and further, the desired performance can be obtained with the less addition amount. The variation coefficient is more preferably 0.15 or less.

It is preferred to add an antistatic agent to the backing layer for the purpose of preventing adhesion of foreign matters due to the friction with a carrier roller. As the antistatic agent, a cationic surfactant, an anionic surfactant, a nonionic surfactant, a high molecular antistatic agent, electrically conductive fine particles, in addition, the compounds described in 11290 no Kagaku Shohin, pp. 875 and 876, Kagaku Kogyo Nippo-Sha can be widely used.

As antistatic agents which can be used in the backing layer in combination, of the above compounds, metallic oxide, e.g., carbon black, zinc oxide, titanium oxide, tin oxide, and electrically conductive fine particles, e.g., organic semiconductors, are preferably used. In particular, when electrically conductive fine particles are used, the dissociation of the antistatic agent from the backing layer can be prevented, and stable antistatic effect can be obtained irrespective of the environment.

It is possible to add a mold-releasing agent, e.g., various activators, silicone oil, and flurorine resins, to the backing layer for giving a coating property and a mold-releasing property.

When the softening point of the cushioning layer and the image-receiving layer measured by TMA (Thermomechanical Analysis) is 70° C. or lower, it is particularly preferred for the backing layer.

TMA is obtained by observing the phase of the object with increasing the temperature of the object of observation at constant rate and applying a constant load to the object. In the present invention, the temperature when the phase of the object begins to change is defined as TMA softening point. In the measurement of a softening point by TMA, apparatus such as Thermoflex (manufactured by Rigaku Denki-Sha) can be used.

The heat transfer sheet and the image-receiving sheet can be used in image forming as the laminate superposing the image-forming layer in the heat transfer sheet and the image-receiving layer of the image-receiving sheet.

The laminate of the heat transfer sheet and the image-receiving sheet can be produced by various methods. For example, the laminate can be easily obtained by superposing the image-forming layer in the heat transfer sheet and the image-receiving layer of the image-receiving sheet and passing through a pressure and heating roller. The heating temperture at this time is 160° C. or less, preferably 130° C. or less.

The above-described vacuum adhesion method can also be preferably used for obtaining the laminate. The vacuum adhesion method is a method of winding the image-receiving sheet around the drum provided with suction holes for vacuum sucking, and then vacuum-adhering the heat transfer sheet of a little larger size than the image-receiving sheet on the image-receiving sheet with uniformly blasting air by a squeeze roller. As other method, a method of mechanically sticking the image-receiving sheet on the metal drum with pulling the image-receiving sheet, and further mechanically sticking the heat transfer sheet thereon with pulling in the same manner can also be used. Of these methods, the vacuum adhesion method is especially preferred in the point of requiring no temperature control and capable of effecting lamination rapidly and uniformly.

EXAMPLE

The present invention will be described in detail with reference to the examples below. In the examples, "parts" means "parts by mass" unless otherwise indicated.

EXAMPLE 1

Preparation of Heat Transfer Sheet K (Black)
Formation of Backing Layer
Preparation of First Backing Layer Coating Solution

| | |
|---|---|
| Water dispersion solution of acrylic resin (Julymer ET410, solid content: 20 mass %, manufactured by Nippon Junyaku Co., Ltd.) | 2 parts |
| Antistatic agent (water dispersion of tin oxide-antimony oxide, average particle size: 0.1 μm, 17 mass %) | 7.0 parts |
| Polyoxyethylenephenyl ether | 0.1 part |
| Melamine compound (Sumitic Resin M-3, manufactured by Sumitomo Chemical Industry Co., Ltd.) | 0.3 parts |
| Distilled water to make the total amount | 100 parts |

Formation of First Backing Layer

One surface (back surface) of a biaxially stretched polyethylene terephthalate support having a thickness of 75 μm was subjected to corona discharge treatment. The first backing layer coating solution was coated on the support in dry coating thickness of 0.03 μm, dried at 180° C. for 30 seconds, thereby the first backing layer was prepared. The Young's modulus of the support in the machine direction was 450 kg/mm$^2$ (=about 4.4 GPa), and the Young's modulus of the support in the transverse direction was 500 kg/mm$^2$ (=about 4.9 GPa). The F-5 value of the support in the machine direction was 10 kg/mm$^2$ (=about 98 MPa), and the F-5 value of the support in the transverse direction was 13 kg/mm$^2$ (=about 127.4 MPa), the heat shrinkage at 100° C. for 30 minutes of the support in the machine direction was 0.3%, and that in the transverse direction was 0.1%. The breaking strength was 20 kg/mm$^2$ (=about 196 MPa) in the machine direction, and that in the transverse direction was 25 kg/mm$^2$ (=about 245 MPa) in the transverse direction, and the modulus of elasticity was 400 kg/mm$^2$ (=about 3.9 GPa).

| Preparation of second backing layer coating solution | |
|---|---|
| Polyolefin (Chemipearl S-120, 27 mass %, manufactured by Mitsui Petrochemical Industries, Ltd.) | 3.0 parts |
| Antistatic agent (water dispersion of tin oxide-antimony oxide, average particle size: 0.1 μm, 17 mass %) | 2.0 parts |
| Colloidal silica (Snowtex C, 20 mass %, manufactured by Nissan Chemical Industries, Ltd.) | 2.0 parts |
| Epoxy resin (Dinacole EX-614B, manufactured by Nagase Kasei Co., Ltd.) | 0.3 parts |
| Distilled water to make the total amount | 100 parts |

Formation of Second Backing Layer

The second backing layer coating solution was coated on the first backing layer in dry coating thickness of 0.03 μm, dried at 170° C. for 30 seconds, thereby the second backing layer was prepared.

Formation of Light-to-heat Converting Layer
Preparation of Light-to-heat Converting Layer Coating Solution The following components were mixed with stirring by a stirrer and the light-to-heat converting layer coating solution was prepared.

Composition of Light-to-heat Converting Layer Coating Solution

| | |
|---|---|
| Infrared absorbing dye (NK-2014, manufactured by Nippon Kanko Shikiso Co., Ltd., cyanine dye having the following composition) | 7.6 parts |

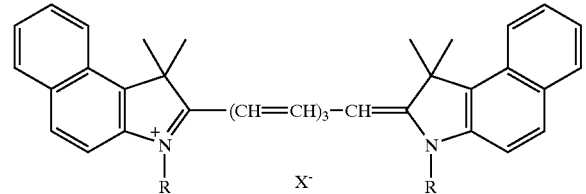

In the formula, R represents $CH_3$, and X represents $ClO_4$.

| | |
|---|---|
| Polyimide resin represented by the following formula (Rika Coat SN-20F, manufactured by Shin Nihon Rika K.K., heat decomposition temperature: 510° C.) | 29.3 parts |

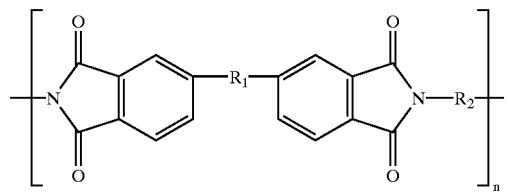

In the formula, $R_1$ represents $SO_2$, $R_2$ represents the following formula:

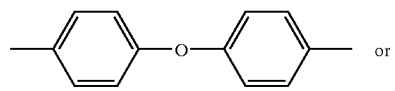 or

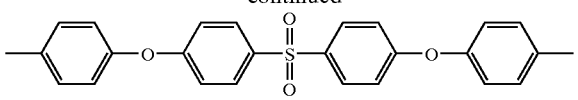

| | |
|---|---|
| Exson naphtha | 5.8 parts |
| N-Methylpyrrolidone (NMP) | 1,500 parts |
| Methyl ethyl ketone | 360 parts |
| Surfactant (Megafac F-176PF, manufactured by Dainippon Chemicals and Ink Co., Ltd., fluorine surfactant) | 0.5 parts |
| Dispersion of matting agent having the following composition | 14.1 parts |

Prepartion of Dispersion of Matting Agent

Ten parts of spherical silica fine particles having an average particle size of 1.5 μm (Sea Hoster-KE-P150, manufactured by Nippon Shokubai Co., Ltd.), 2parts of dispersion polymer (acrylate-styrene copolymer, Juncryl 611, manufactured by Johnson Polymer Co., Ltd.), 16 parts of methyl ethyl ketone and 64 parts of N-methylpyrrolidone were mixed, this mixture and 30 parts of glass beads having a diameter of 2 mm were put in a reaction vessel made of polyethylene having a capacity of 200 ml, and dispersed with a paint shaker (manufactured by Toyo Seiki Co., Ltd.) for 2 hours and silica fine particle dispersion was obtained.

Preparation of Light-to-heat Converting Layer on Support Surface

The above light-to-heat converting layer coating solution was coated with a wire bar coater on one surface of a polyethylene terephthalate film (support) having a thickness of 75 μm, and the coated product was dried in an oven at 120° C. for 2 minutes, thus a light-to-heat converting layer was formed on the support. The optical density $OD_{LH}$ of the thus-obtained light-to-heat converting layer at wavelength of 808 nm measured by UV-spectrophotometer UV-240 (manufactured by Shimadzu Seisakusho Co. Ltd.) was 1.03, and the layer thickness was 0.3 μm.

Formation of Image-forming Layer

Preparation of Coating Solution of Black Image-forming Layer

Each of the following components was put in a kneading mill, and pre-treatment was performed with adding a small amount of solvent and applying a shear force. A solvent was further added to the dispersion so as to reach the following composition, dispersion was performed for 2 hours in a sand mill, thereby the mother solution of a pigment dispersion was obtained.

| Composition of black pigment dispersion mother solution | |
|---|---|
| Composition 1 | |
| Polyvinyl butyral (Eslec B BL-SH, manufactured by Sekisui Chemical Industries, Ltd.) | 12.6 parts |
| Pigment Black 7 (carbon black, C.I. No. 77266, Mitsubishi Carbon Black #5, manufactured by Mitsubishi Chemicals Co. Ltd., PVC blackness: 1) | 4.5 parts |
| Dispersion assistant (Solspers S-20000, manufactured by ICI) | 0.8 parts |
| n-Propyl alcohol | 79.4 parts |

| Composition of black pigment dispersion mother solution | |
|---|---|
| Composition 2 | |
| Polyvinyl butyral (Eslec B BL-SH, manufactured by Sekisui Chemical Industries, Ltd.) | 12.6 parts |
| Pigment Black 7 (carbon black, C.I. No. 77266, Mitsubishi Carbon Black MA100, manufactured by Mitsubishi Chemicals Co., Ltd., PVC blackness: 10) | 10.5 parts |
| Dispersion assistant (Solspers S-20000, manufactured by ICI) | 0.8 parts |
| n-Propyl alcohol | 79.4 parts |

The following components were mixed with stirring by a stirrer to prepare a black image-forming layer coating solution.

| Composition of coating solution of black image-forming layer | |
|---|---|
| Above black pigment dispersion mother solution (composition 1/composition 2: 70/30 (parts)) | 185.7 parts |
| Polyvinyl butyral (Eslec B BL-SH, manufactured by Sekisui Chemical Industries, Ltd.) | 11.9 parts |
| Wax-based compound | |
| Stearic acid amide (Newtron 2, manufactured by Nippon Seika Co., Ltd.) | 3.4 parts |
| Lauric acid amide (Diamid Y, (manufactured by Nippon Kasei Co., Ltd.) | 1.7 parts |
| Palmitic acid amide (Diamid KP, (manufactured by Nippon Kasei Co., Ltd.) | 1.7 parts |
| Erucic acid amide (Diamid L-200, (manufactured by Nippon Kasei Co., Ltd.) | 1.7 parts |
| Oleic acid amide (Diamid O-200, (manufactured by Nippon Kasei Co., Ltd.) | 1.7 parts |
| Rosin (KE-311, (manufactured by Arakawa Kagaku Co., Ltd.) | 11.4 parts |
| (components: resin acid 80–97%, resin acid components: | |
| abietic acid: 30 to 40% neoabietic acid: 10 to 20% dihydroabietic acid: 14% tetrahydroabietic acid: 14%) | |
| Surfactant (Megafac F-176PF, solid content: 20%, manufactured by Dainippon Chemicals and Ink Co., Ltd.) | 2.1 parts |
| Inorganic pigment (MEK-ST, 30% methyl ethyl ketone solution, manufactured by Nissan Chemical Industries, Ltd.) | 7.1 parts |
| n-Propyl alcohol | 1,050 parts |
| Methyl ethyl ketone | 295 parts |

It was found that the particles in the thus-obtained black image-forming layer coating solution had an average particle size of 0.25 μm, and the ratio of the particles having a particle size of 1 μm or more was 0.5% from the measurement by particle size distribution measuring apparatus of laser scattering system.

Preparation of Black Image-forming Layer on Light-to-heat Converting Layer

The above black image-forming layer coating solution was coated for 1 minute with a wire bar coater on the light-to-heat converting layer, and the coated product was dried in an oven at 100° C. for 2 minutes, thus a black image-forming layer was formed on the light-to-heat converting layer. By the above procedure, a heat transfer sheet (hereinafter referred to as heat transfer sheet K, similarly, a heat transfer sheet provided with a yellow image-forming layer is referred to as heat transfer sheet Y, a heat transfer sheet provided with a magenta image-forming layer is referred to as heat transfer sheet M, and a heat transfer sheet provided with a cyan image-forming layer is referred to as heat transfer sheet C) comprising a support having thereon a light-to-heat converting layer and a black image-forming layer in this order was prepared.

The transmission optical density of the black image-forming layer of the thus-obtained heat transfer sheet K was 0.91 measured by Macbeth densitometer TD-904 (W filter), and the layer thickness of the black image-forming layer was 0.60 µm on average.

The obtained image-forming layer had the following physical properties.

The surface hardness of the image-forming layer is preferably 10 g or more, specifically 200 g or more.

The smooster value of the surface at 23° C., 55% RH is preferably from 0.5 to 50 mmHg (=about 0.0665 to 6.65 kPa), and specifically 9.3 mmHg (=about 1.24 kPa).

The coefficient of static friction of the surface is preferably 0.2 or less, and specifically 0.08.

The surface energy was 29 mJ/m$^2$, contact angle with water was 94.8°. The deformation rate of the light-to-converting layer was 168% when recorded at linear velocity of 1 m/sec with laser beams having light strength at exposure surface of 1,000 W/mm$^2$ or more.

Preparation of Heat Transfer Sheet Y

Heat transfer sheet Y was prepared in the same manner as in the preparation of heat transfer sheet K, except that the yellow image-forming layer coating solution having the following composition was used in place of the black image-forming layer coating solution. The layer thickness of the image-forming layer of the obtained heat transfer sheet Y was 0.42 µm.

| Composition of yellow pigment dispersion mother solution | |
|---|---|
| Composition of yellow pigment 1 | |
| Polyvinyl butyral (Eslec B BL-SH, manufactured by Sekisui Chemical Industries, Ltd.) | 7.1 parts |
| Pigment Yellow (pigment yellow 180, C.I. No. 21290) (Novoperm Yellow P-HG, manufactured by Clariant Japan, K.K.) | 12.9 parts |
| Dispersion assistant (Solspers S-20000, manufactured by ICI) | 0.6 parts |
| n-Propyl alcohol | 79.4 parts |

| Composition of yellow pigment dispersion mother solution | |
|---|---|
| Composition of yellow pigment 2 | |
| Polyvinyl butyral (Eslec B BL-SH, manufactured by Sekisui Chemical Industries, Ltd.) | 7.1 parts |
| Pigment Yellow 139 (carbon black, C.I. No. 56298) (Novoperm Yellow M2R 70, manufactured by Clariant Japan, K.K.) | 12.9 parts |
| Dispersion assistant (Solspers S-20000, manufactured by ICI) | 0.6 parts |
| n-Propyl alcohol | 79.4 parts |
| Composition of coating solution of yellow image-forming layer | |
| Above yellow pigment dispersion mother solution (yellow pigment composition 1/ yellow pigment composition 2: 95/5 (parts)) | 126 parts |
| Polyvinyl butyral (Eslec B BL-SH, manufactured by Sekisui Chemical Industries, Ltd.) | 4.6 parts |
| Wax-based compound | |
| Stearic acid amide (Newtron 2, manufactured by Nippon Seika Co., Ltd.) | 1.4 parts |
| Lauric acid amide (Diamid Y, (manufactured by Nippon Kasei Co., Ltd.) | 0.7 parts |
| Palmitic acid amide (Diamid KP, (manufactured by Nippon Kasei Co., Ltd.) | 0.7 parts |
| Erucic acid amide (Diamid L-200, (manufactured by Nippon Kasei Co., Ltd.) | 0.7 parts |
| Oleic acid amide (Diamid O-200, (manufactured by Nippon Kasei Co., Ltd.) | 0.7 parts |
| Nonionic surfactant (Chemistat 1100, manufactured by Sanyo Chemical Industries, Co., Ltd.) | 0.4 parts |
| Rosin (KE-311, (manufactured by Arakawa Kagaku Co., Ltd.) | 2.4 parts |
| Surfactant (Megafac F-176PF, solid content: 20%, manufactured by Dainippon Chemicals and Ink Co., Ltd.) | 0.8 parts |
| n-Propyl alcohol | 793 parts |
| Methyl ethyl ketone | 198 parts |

The obtained image-forming layer had the following physical properties.

The surface hardness of the image-forming layer is preferably 10 g or more, specifically 200 g or more.

The smooster value of the surface at 23° C., 55% RH is preferably from 0.5 to 50 mmHg (=about 0.0665 to 6.65 kPa), and specifically 2.3 mmHg (=about 0.31 kPa).

The coefficient of static friction of the surface is preferably 0.2 or less, and specifically 0.1.

The surface energy was 24 mJ/m$^2$, contact angle with water was 108.1°. The deformation rate of the light-to-converting layer was 150% when recorded at linear velocity of 1 m/sec with laser beams having light strength at exposure surface of 1,000 W/mm$^2$ or more.

Preparation of Heat Transfer Sheet M

Heat transfer sheet M was prepared in the same manner as in the preparation of heat transfer sheet K, except that the magenta image-forming layer coating solution having the following composition was used in place of the black image-forming layer coating solution. The layer thickness of the image-forming layer of the obtained heat transfer sheet M was 0.38 µm.

Composition of magenta pigment dispersion mother solution
Composition of magenta pigment 1

| | |
|---|---|
| Polyvinyl butyral (Denka Butyral #2000-L, manufactured by Denki Kagaku Kogyo Co., Ltd., Vicut softening point: 57° C.) | 12.6 parts |
| Pigment Red (pigment yellow 57:1, C.I. No. 15850:1) (Symuler Brilliant Carmine 6B-229, manufactured by Dainippon Chemicals and Ink Co., Ltd.) | 15.0 parts |
| Dispersion assistant (Solspers S-20000, manufactured by ICI) | 0.6 parts |
| n-Propyl alcohol | 80.4 parts |

Composition of magenta pigment dispersion mother solution
Composition of magenta pigment 2

| | |
|---|---|
| Polyvinyl butyral (Denka Butyral #2000-L, manufactured by Denki Kagaku Kogyo Co., Ltd., Vicut softening point: 57° C.) | 12.6 parts |
| Pigment Red 57:1 C.I. No. 15850) (Kionol Red 6B-4290G, manufactured by Toyo Ink Mfg. Co., Ltd.) | 12.9 parts |
| Dispersion assistant (Solspers S-20000, manufactured by ICI) | 0.6 parts |
| n-Propyl alcohol | 79.4 parts |

Composition of coating solution of magenta image-forming layer

| | |
|---|---|
| Above magenta pigment dispersion mother solution 1 (magenta pigment composition 1/ magenta pigment composition 2: 95/5 (parts)) | 163 parts |
| Polyvinyl butyral (Denka Butyral #2000-L, manufactured by Denki Kagaku Kogyo Co., Ltd., Vicut softening point: 57° C.) | 4.0 parts |
| Wax-based compound | |
| Stearic acid amide (Newtron 2, manufactured by Nippon Seika Co., Ltd.) | 2.0 parts |
| Lauric acid amide (Diamid Y, (manufactured by Nippon Kasei Co., Ltd.) | 1.0 parts |
| Palmitic acid amide (Diamid KP, (manufactured by Nippon Kasei Co., Ltd.) | 1.0 parts |
| Erucic acid amide (Diamid L-200, (manufactured by Nippon Kasei Co., Ltd.) | 1.0 parts |
| Oleic acid amide (Diamid O-200, (manufactured by Nippon Kasei Co., Ltd.) | 1.0 parts |
| Nonionic surfactant (Chemistat 1100, manufactured by Sanyo Chemical Industries, Co., Ltd.) | 0.7 parts |
| Rosin (KE-311, (manufactured by Arakawa Kagaku Co., Ltd.) | 4.6 parts |
| Pentaerythritol tetraacrylate (NK ester A-TMMT, manufactured by Shin-Nakamura Kagaku Co., Ltd.) | 2.5 parts |
| Surfactant (Megafac F-176PF, solid content: 20%, manufactured by Dainippon Chemicals and Ink Co., Ltd.) | 1.3 parts |
| n-Propyl alcohol | 848 parts |
| Methyl ethyl ketone | 246 parts |

The obtained image-forming layer had the following physical properties.

The surface hardness of the image-forming layer is preferably 10 g or more, specifically 200 g or more.

The smooster value of the surface at 23° C., 55% RH is preferably from 0.5 to 50 mmHg (=about 0.0665 to 6.65 kPa), and specifically 3.5 mmHg (=about 0.47 kPa).

The coefficient of static friction of the surface is preferably 0.2 or less, and specifically 0.08.

The surface energy was 25 mJ/m$^2$, contact angle with water was 98.8°. The deformation rate of the light-to-converting layer was 160% when recorded at linear velocity of 1 m/sec with laser beams having light strength at exposure surface of 1,000 W/mm$^2$ or more.

Preparation of Heat Transfer Sheet C

Heat transfer sheet C was prepared in the same manner as in the preparation of heat transfer sheet K, except that the cyan image-forming layer coating solution having the following composition was used in place of the black image-forming layer coating solution. The layer thickness of the cyan-forming layer of the obtained heat transfer sheet C was 0.45 μm.

Composition of cyan pigment dispersion mother solution
Composition of cyan pigment 1

| | |
|---|---|
| Polyvinyl butyral (Eslec B BL-SH, manufactured by Sekisui Chemical Industries, Ltd.) | 12.6 parts |
| Pigment Blue (pigment blue 54:7, C.I. No. 74160) (Cyanine Blue 700-l0FG, manufactured by Toyo Ink Mfg. Co., Ltd.)) | 15.0 parts |
| Dispersion assistant (PW-36, manufactured by Kusumoto Kasei Co., Ltd.) | 0.8 parts |
| n-Propyl alcohol | 110 parts |

Composition of cyan pigment dispersion mother solution
Composition of cyan pigment 2

| | |
|---|---|
| Polyvinyl butyral (Eslec B BL-SH, manufactured by Sekisui Chemical Industries, Ltd.) | 12.6 parts |
| Pigment Blue 15 (C.I. No. 74160, Lionol Blue 7027, manufactured by Toyo Ink Mfg. Co., Ltd.) | 15.0 parts |
| Dispersion assistant (PW-36, manufactured by Kusumoto Kasei Co., Ltd.) | 0.8 parts |
| n-Propyl alcohol | 110 parts |

Composition of coating solution of cyan image-forming layer

| | |
|---|---|
| Above cyan pigment dispersion mother solution 1 (cyan pigment composition 1/ cyan pigment composition 2: 90/10 (parts)) | 118 parts |
| Polyvinyl butyral (Eslec B BL-SH, manufactured by Sekisui Chemical Industries, Ltd.) | 5.2 parts |
| Inorganic pigment (MEK-ST) | 1.3 parts |
| Wax-based compound | |
| Stearic acid amide (Newtron 2, manufactured by Nippon Seika Co., Ltd.) | 2.0 parts |
| Lauric acid amide (Diamid Y, (manufactured by Nippon Kasei Co., Ltd.) | 1.0 parts |
| Palmitic acid amide (Diamid KP, (manufactured by Nippon Kasei Co., Ltd.) | 1.0 parts |
| Erucic acid amide (Diamid L-200, (manufactured by Nippon Kasei Co., Ltd.) | 1.0 parts |
| Oleic acid amide (Diamid O-200, (manufactured by Nippon Kasei Co., Ltd.) | 1.0 parts |

-continued

| | |
|---|---|
| Rosin (KE-311, (manufactured by Arakawa Kagaku Co., Ltd.) | 2.8 parts |
| Pentaerythritol tetraacrylate (NK ester A-TMMT, manufactured by Shin-Nakamura Kagaku Co., Ltd.) | 1.7 parts |
| Surfactant (Megafac F-176PF, solid content: 20%, manufactured by Dainippon Chemicals and Ink Co., Ltd.) | 1.7 parts |
| n-Propyl alcohol | 890 parts |
| Methyl ethyl ketone | 247 parts |

The obtained image-forming layer had the following physical properties.

The surface hardness of the image-forming layer is preferably 10 g or more, specifically 200 g or more.

The smooth value of the surface at 23° C., 55% RH is preferably from 0.5 to 50 mmHg (=about 0.0665 to 6.65 kPa), and specifically 7.0 mmHg (=about 0.93 kPa).

The coefficient of static friction of the surface is preferably 0.2 or less, and specifically 0.08.

The surface energy was 25 mJ/m$^2$, contact angle with water was 98.8°. The deformation rate of the light-to-converting layer was 165% when recorded at linear velocity of 1 m/sec with laser beams having light strength at exposure surface of 1,000 w/mm$^2$ or more.

Preparation of Image-receiving Sheet

The cushioning layer coating solution and the image-receiving layer coating solution each having the following composition were prepared.

| | |
|---|---|
| 1) Cushioning layer coating solution | |
| Vinyl chloride-vinyl acetate copolymer (main binder, MRP-TSL, manufactured by Nisshin Kagaku Co., Ltd.) | 20 parts |
| Plasticizer (Paraplex G-40, manufactured by CP. HALL. COMPANY) | 10 parts |
| Surfactant (fluorine surfactant, coating assistan, Megafac F-177, manufactured by Dainippon Chemicals and Ink Co., Ltd.) | 0.5 parts |
| Antistatic agent (quaternary ammonium salt, SAT-5 Supper (IC), manufactured by Nippon Junyaku Co., Ltd.) | 0.3 parts |
| Methyl ethyl ketone | 60 parts |
| Toluene | 10 parts |
| N, N-Dimethylformamide | 3 parts |
| 2) Image-receiving layer coating solution | |
| Polyvinyl butyral (Eslec B BL-SH, manufactured by Sekisui Chemical Industries, Ltd.) | 8 parts |
| Antistatic agent Sanstat 2012A, manufactured by Sanyo Chemical Industries, Co., Ltd.) | 0.7 parts |
| Surfactant (Megafac F-177, manufactured by Dainippon Chemicals and Ink Co., Ltd.) | 0.1 parts |
| n-Propyl alcohol | 20 parts |
| Methanol | 20 parts |
| 1-Methoxy-2-propanol | 50 parts |

The above-prepared cushioning layer coating solution was coated on a white PET support (Lumiler #130E58, manufactured by Toray Industries Inc., thickness: 130 μm) using a narrow-broad coater and the coated layer was dried, and then the image-receiving layer coating solution was coated and dried. The coating amounts were controlled so that the layer thickness of the cushioning layer after drying became about 20 μm and the layer thickness of the image-receiving layer became about 2 μm. The white PET support was a void-containing plastic support of a laminate (total thickness: 130 μm, specific gravity: 0.8) comprising a void-containing polyethylene terephthalate layer (thickness: 116 μm, void ratio: 20%), and titanium oxide-containing polyethylene terephthalate layers provided on both sides thereof (thickness: 7 μm, titanium oxide content: 2%). The prepared material was wound in a roll, stored at room temperature for one week, then used in the image recording by laser beam as shown below.

The obtained image-receiving layer had the following physical properties.

The surface roughness Ra is preferably from 0.4 to 0.01 μm, and specifically 0.02 μm.

The undulation of the image-receiving layer is preferably 2 μm or less, and specifically 1.2 μm.

The smooster value of the surface of the image-receiving layer at 23° C., 55% RH is preferably from 0.5 to 50 mmHg (=about 0.0665 to 6.65 kPa), and specifically 0.8 mmHg (=about 0.11 kPa).

The coefficient of static friction of the surface of the image-receiving layer is preferably 0.8 or less, and specifically 0.3.

The surface energy was 29 mJ/m$^2$, contact angle with water was 85.0°.

Formation of Transferred Image

A transferred image to actual paper was obtained by the image-forming system shown in FIG. 4 according to the image-forming sequence of the system and the transfer method of the system, and Luxel FINALPROOF 560 was used as the recording unit.

The above-prepared image-receiving sheet (56 cm×79 cm) was wound around the rotary drum having a diameter of 38 cm, provided with vacuum section holes having a diameter of 1 mm (surface density of 1 hole in the area of 3 cm×8 cm) and vacuum sucked. Subsequently, the above heat transfer sheet K (black) cut into a size of 61 cm×84 cm was superposed on the image-receiving sheet so as to deviate uniformly, squeezed by a squeeze roller, and adhered and laminated so that air was sucked by section holes. The degree of pressure reduction in the state of section holes being covered was −150 mmHg per 1 atm (=about 81.13 kPa). The drum was rotated and semiconductor laser beams of the wavelength of 808 nm were condensed from the outside on the surface of the laminate on the drum so that the laser beams became a spot of a diameter of 7 μm on the surface of the light-to-converting layer, and laser image recording (line image) was performed on the laminate by moving the laser beam at a right angle (by-scanning) to the rotary direction of the drum (main scanning direction). The condition of irradiation was as follows. The laser beams used in the example was multi-beam two dimentional array comprising five rows along the main scanning direction and three rows along the by-scanning direction.

Laser power: 110 mW

Drum rotation speed: 500 rpm

By-scanning pitch: 6.35 μm

Circumferential temperature condition:

20° C. 40%, 23° C. 50%, 26° C. 65%

The diameter of exposure drum is preferably 360 mm or more, specifically 380 mm was used.

The size of the image was 515 mm×728 mm, and the definition was 2,600 dpi.

The laminate finished laser recording was detached from the drum and heat transfer sheet K was released from the image-receiving sheet by hands. It was confirmed that only the irradiated domain of the image-forming layer of heat transfer sheet K had been transferred from heat transfer sheet K to the the image-receiving sheet.

In the same manner as above, the image was transferred to the image-receiving sheet from each of heat transfer sheet Y, heat transfer sheet M and heat transfer sheet C. The transferred images of four colors were further transferred to a recording paper and a multicolor image was formed. Even when high energy laser recording was performed under different temperature humidity conditions with laser beams of multi-beam two dimentional array, a multicolor image having excellent image quality and stable transfer density could be formed.

In the stage of transfer to the actual paper, the heat transfer unit having a dynamic friction coefficient against insert platform of polyethylene terephthalate of from 0.1 to 0.7 and traveling speed of from 15 to 50 mm/sec was used. The Vickers hardness of the heat roller of the heat transfer unit is preferably from 10 to 100, and specifically the heat roller having Vickers hardness of 70 was used.

Every image under three different circumstances of temperature humidity conditions was good.

As the optical density, the reflection optical density of each color of Y, M, C, K of the image transferred to Tokuryo art paper was measured in Y, M, C, K mode with a densitometer X-rite 938 (manufactured by X-rite Co.).

Optical density, optical density/image-forming layer thickness ($\mu$m) of each color are shown in Table 1 below.

TABLE 1

| Color | Optical Density | Optical Density/ Image-Forming Layer Thickness |
|---|---|---|
| Y | 1.01 | 2.40 |
| M | 1.51 | 3.97 |
| C | 1.59 | 3.53 |
| K | 1.82 | 3.03 |

COMPARATIVE EXAMPLE 1

The same procedure as in Example 1 was repeated except for changing the amount of the infrared absorbing dye in the light-to-heat converting layer coating solution from 7.6 parts to 3.8 parts and the amount of the polyimide resin from 29.3 parts to 96.7 parts. The optical density $OD_{LH}$ was 0.45 and the layer thickness was 1.0 $\mu$m on average.

The image transferred to the actual paper by the above system constitution was evaluated. The results of the evaluation are shown in Table 2 below with OD/layer thickness of the light-to-heat converting layer.

The evaluation of the image was performed as follows.
Evaluation of Black Image

Using the above four color heat transfer sheet, the image quality of the solid part and the line image part of black of the transfer image was observed with an optical microscope. The evaluation was performed according to the following criteria.
Solid Part
○: Time lag in recording time and transfer failure were not observed.
_: Time lag in recording time and transfer failure were observed partially.
×: Time lag in recording time and transfer failure were observed all over the surface.
Line Image Part
○: The edge of the line image part was sharp and good definition was shown.
_: The edge of the line image part was jagged and bridging occurred partially.
×: Bridging occurred entirely.

The sample in Example 1 was evaluated as follows.
Dot Shape

Figure 13:
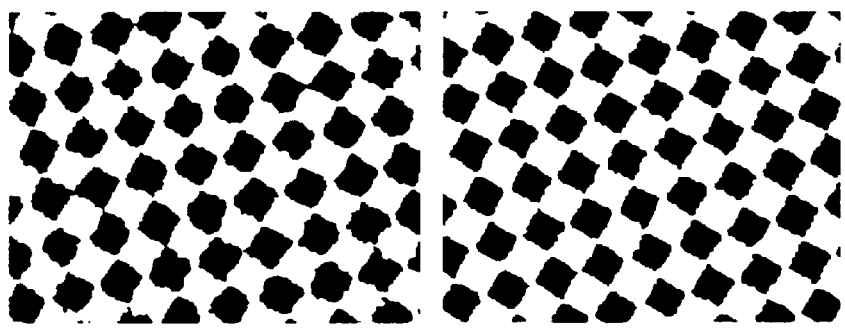
FIG. 13 shows the shapes of the dots of the image obtained in the Example below. The center distance of dots is 125 μm.
Figure 14:
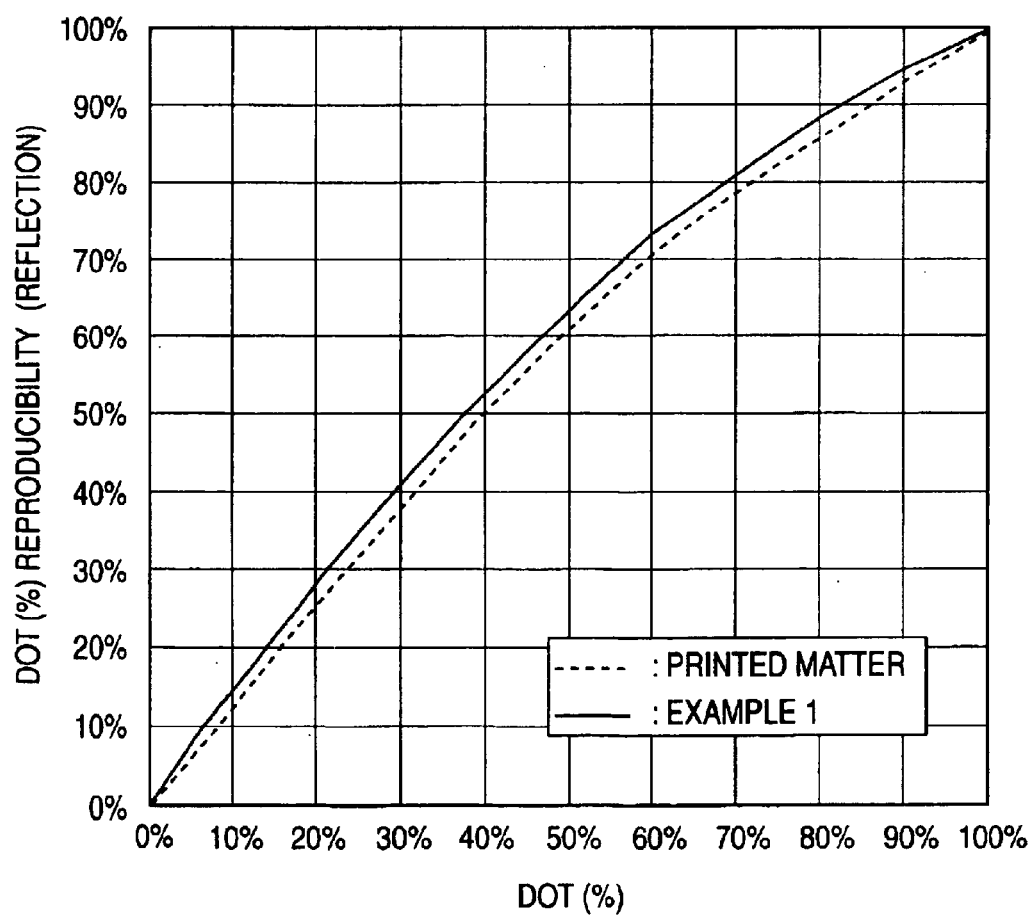
FIG. 14 shows the reproducibility of the dots of the image obtained in the Example below. The axis of ordinate shows the dot area rate computed from the reflection density, and the axis of abscissa shows the dot area rate of the inputted signal.
Figure 15:
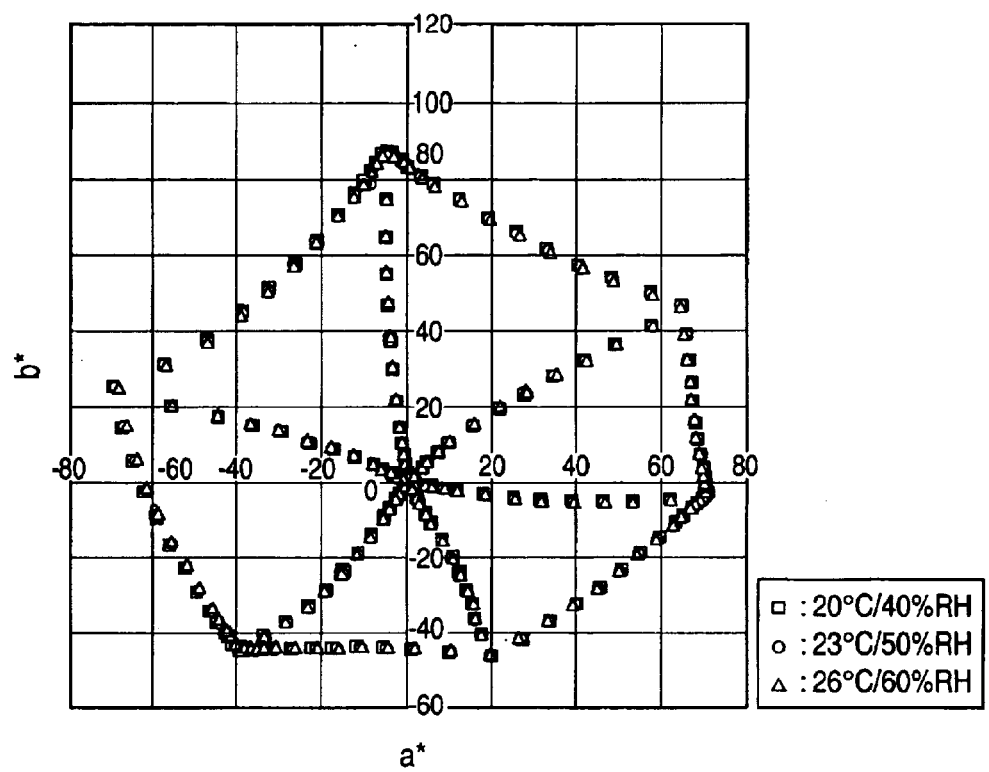
FIG. 15 shows the repeating reproducibility of the image obtained in the Example below in a*b* plane surface of L*a*b* color specification.
Figure 16:
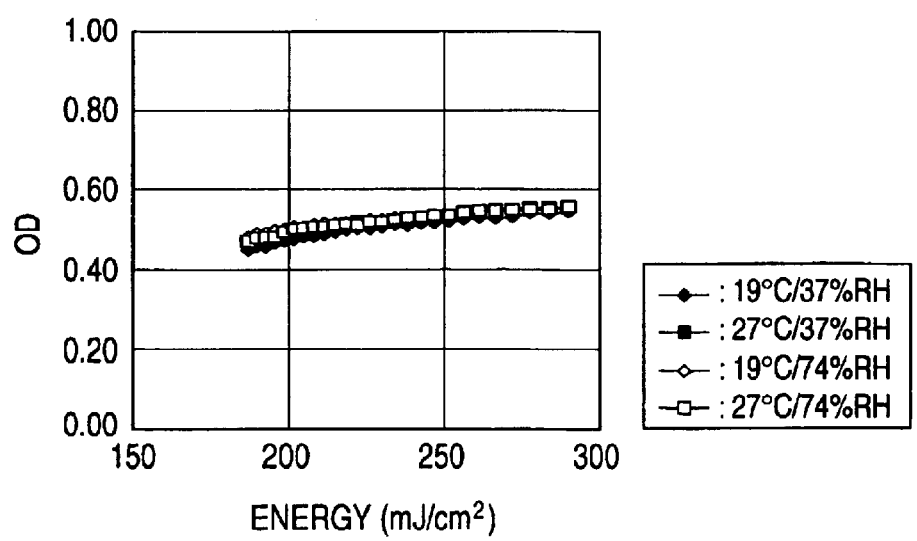
FIG. 16 shows the repeating reproducibility of the image obtained in the Example below.

The image obtained in Example 1 formed the dot image corresponding to print line number of definition of from 2,400 to 2,540 dpi. Since each dot is almost free of blur and chip and the shape is very sharp, dots of a wide range from highlight to shadow can be clearly formed (FIGS. 5 to 12). As a result, output of dots of high grade having the same definition as obtained by an image setter and CTP setter is possible, and dots and gradation which are excellent in approximation to the printed matter can be reproduced (FIGS. 13 and 14). The sample also showed good results with definition of 2,600 dpi or higher.
Repeating Reproducibility Since the heat transfer image obtained in Example 1 is sharp in dot shape, dots corresponding to laser mean can be faithfully reproduced, further recording characteristics are hardly influenced by the environmental temperature and humidity, repeating reproducibility stable in hue and density can be obtained under wide circumstances of temperature and humidity (FIGS. 15 and 16). A transfer image to the actual paper was obtained in the same manner as in Example 1 using the image-forming material in Example 1 except for changing the circumferential temperature and humidity to 19° C. 37% RH, 27° C. 37% RH, 19° C. 74% RH and 27° C. 74% RH, and the irradiated laser energy to 180 to 290 mJ/cm$^2$, and the OD was shown in the axis of ordinate in FIG. 6. From FIG. 6, it can be seen that according to the present invention, a stable image can be obtained under wide circumstances of temperature and humidity even if the laser energy load varies somewhat.
Color Reproduction Pigments used in printing inks are used as the coloring material in the heat transfer sheet in the Example, and since

TABLE 2

| | | | Evaluation (black) | |
|---|---|---|---|---|
| Example No. | Constitution Light-to-Heat Converting Layer OD/Layer Thiskness | Image Transfer Rate (%) | Image Quality, Solid Part | Image Quality, Line Image Part |
| Example 1 | 3.44 | 2.1 | ○ | ○ |
| Comparative Example 1 | 0.45 | 6.7 | — | × | the heat transfer sheet is excellent in repeating reproducibility, highly minute CMS can be realized. The heat transfer image can almost coincide with the hues of the printed matters of Japan-Color, and the colors appear similarly to the printed matter even when light sources of illumination are changed, such as a fluorescent lamp, an incandescent lamp.

Quality of Character

Figure 17:
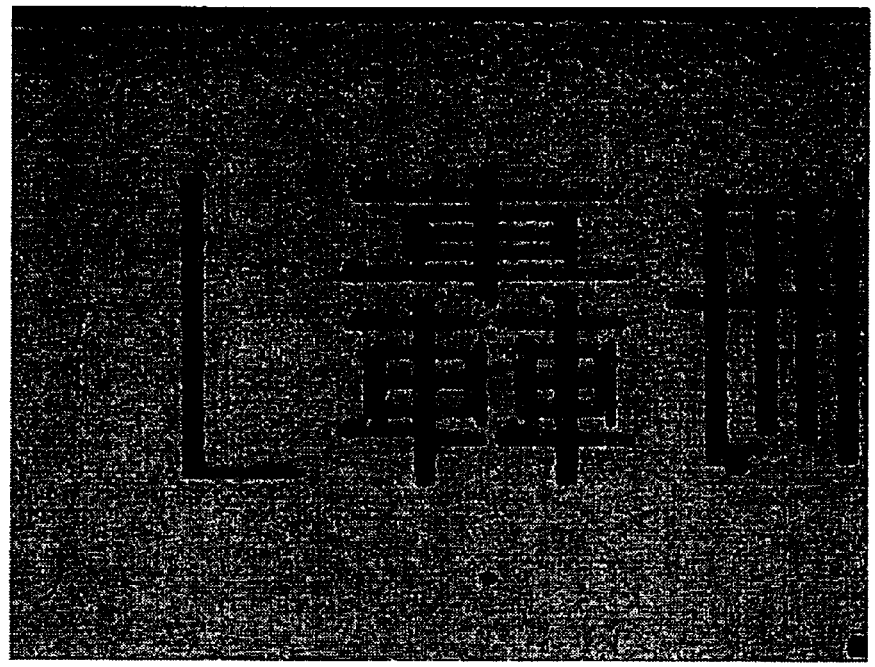
FIG. 17 shows the quality of the character of 2 points of the image (positive image) obtained in the Example below.
Figure 18:
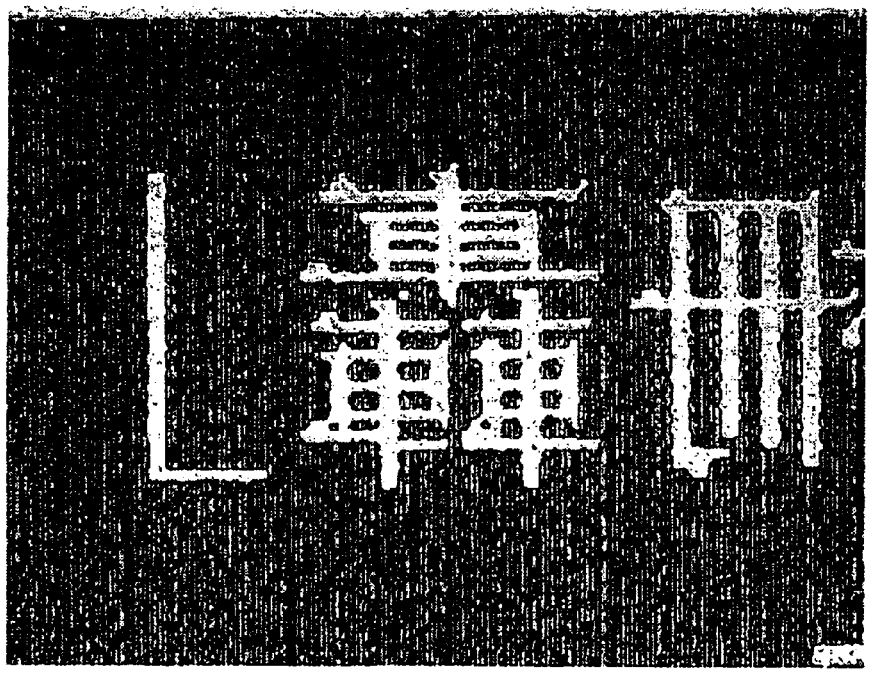
FIG. 18 shows the quality of the character of 2 points of the image (negative image) obtained in the Example below.

Since the image obtained in Example 1 is sharp in dot shape, the fine line of a fine character can be reproduced sharply (FIGS. 17 and 18).

EXAMPLE 2

Preparation of Heat Transfer Sheet K (Black)

Heat transfer sheet K was prepared in the same manner as in Example 1, except that the composition of the light-to-heat converting layer coating solution was changed to light-to-heat converting layer coating solution composition A shown below. The optical density of the light-to-heat converting layer at wavelength of 808 nm was 1.03, and the layer thickness of the light-to-heat converting layer was 0.3 μm.

| Light-to-heat converting layer coating solution composition A | |
| --- | --- |
| Infrared absorbing dye (NK-2014, manufactured by Nippon Kanko Shikiso Co., Ltd.) | 7.6 parts |
| Polyimide resin (Rika Coat SN-20, manufactured by Shin Nihon Rika K.K., heat decomposition temperature: 510° C.) | 29.3 parts |
| N,N-Dimethylformamide | 1,500 parts |
| Methyl ethyl ketone | 360 parts |
| Surfactant (Megafac F-177, manufactured by Dainippon Chemicals and Ink Co., Ltd.) | 0.5 parts |

Each of heat transfer sheet Y, heat transfer sheet M and heat transfer sheet C was prepared using the above light-to-heat converting layer coating solution composition A in the same manner as in Example 1. The same image-receiving sheet as in Example 1 was used.

Formation of Transferred Image

The procedure described in the item of "Formation of transferred image" was repeated. It was confirmed that the image was transferred from heat transfer sheet K to the image-receiving sheet.

In the same manner as above, the image was transferred to the image-receiving sheet from each of heat transfer sheet Y, heat transfer sheet M and heat transfer sheet C. The transferred images of four colors were further transferred to a recording paper and a multicolor image was formed. Even when high energy laser recording was performed under different temperature humidity conditions with laser beams of multi-beam two dimentional array, a multicolor image having excellent image quality and stable transfer density could be formed.

EXAMPLE 3

Heat transfer sheet Y, heat transfer sheet M, heat transfer sheet C and heat transfer K were prepared in the same manner as in Example 2, except for using light-to-heat converting layer coating solution composition B shown below in place of light-to-heat converting layer coating solution composition A, and laser recording was performed in the same manner as in Example 1 to form each transferred image. The same image-receiving sheet as in Example 1 was used.

| Light-to-heat converting layer coating solution composition B | |
| --- | --- |
| Infrared absorbing dye (NK-2014, manufactured by Nippon Kanko Shikiso Co., Ltd.) | 7.6 parts |
| Polyimide resin (Rika Coat SN-20, manufactured by Shin Nihon Rika K.K., heat decomposition temperature: 510° C.) | 29.3 parts |
| N,N-Dimethylformamide | 1,500 parts |
| Methyl ethyl ketone | 360 parts |
| Surfactant (Megafac F-177, manufactured by Dainippon Chemicals and Ink Co., Ltd.) | 0.5 parts |
| Matting agent (Sea Hoster-KE-P150, silica particles, manufactured by Nippon Shokubai Co., Ltd.) | 1.7 parts |

RERERENCE EXAMPLE 1

Heat transfer sheet Y, heat transfer sheet M, heat transfer sheet C and heat transfer K were prepared in the same manner as in Example 3, except that the following light-to-heat converting layer coating solutions C, D and E were used in place of the light-to-heat converting layer coating solution used in the preparation of heat transfer sheet Y, heat transfer sheet M and heat transfer K in Example 3, and each transferred image was prepared by laser irradiation.

Reference example 1 is an example for showing the effect at the time when a relationship between the optical density per unit layer thickness and a layer thickness of the heat-light converting layer is changed.

| Light-to-heat converting layer coating solution composition C | |
| --- | --- |
| Infrared absorbing dye (NK-2014, manufactured by Nippon Kanko Shikiso Co., Ltd.) | 6.9 parts |
| Polyimide resin (Rika Coat SN-20, manufactured by Shin Nihon Rika K.K., heat decomposition temperature: 510° C.) | 29.3 parts |
| N,N-Dimethylformamide | 1,500 parts |
| Methyl ethyl ketone | 360 parts |
| Surfactant (Megafac F-177, manufactured by Dainippon Chemicals and Ink Co., Ltd.) | 0.5 parts |
| Matting agent (Sea Hoster-KE-P150, silica particles, manufactured by Nippon Shokubai Co., Ltd.) | 1.7 parts |

| Light-to-heat converting layer coating solution composition D | |
| --- | --- |
| Infrared absorbing dye (NK-2014, manufactured by Nippon Kanko Shikiso Co., Ltd.) | 7.2 parts |
| Polyimide resin (Rika Coat SN-20, manufactured by Shin Nihon Rika K.K., heat decomposition temperature: 510° C.) | 29.3 parts |
| N,N-Dimethylformamide | 1,500 parts |
| Methyl ethyl ketone | 360 parts |
| Surfactant (Megafac F-177, manufactured by Dainippon Chemicals and Ink Co., Ltd.) | 0.5 parts |
| Matting agent (Sea Hoster-KE-P150, silica particles, manufactured by Nippon Shokubai Co., Ltd.) | 1.7 parts |

-continued

Light-to-heat converting layer coating solution composition E

| | |
|---|---|
| Infrared absorbing dye (NK-2014, manufactured by Nippon Kanko Shikiso Co., Ltd.) | 6.5 parts |
| Polyimide resin (Rika Coat SN-20, manufactured by Shin Nihon Rika K.K., heat decomposition temperature: 510° C.) | 29.3 parts |
| N,N-Dimethylformamide | 1,500 parts |
| Methyl ethyl ketone | 360 parts |
| Surfactant (Megafac F-177, manufactured by Dainippon Chemicals and Ink Co., Ltd.) | 0.5 parts |
| Matting agent (Sea Hoster-KE-P150, silica particles, manufactured by Nippon Shokubai Co., Ltd.) | 1.7 parts |

REFERENCE EXAMPLE 2

Heat transfer sheet Y, heat transfer sheet M, heat transfer sheet C and heat transfer K were prepared in the same manner as in Example 3, except that the following light-to-heat converting layer coating solutions F, G and H were used in place of the light-to-heat converting layer coating solution used in the preparation of heat transfer sheet Y, heat transfer sheet M and heat transfer K in Example 3, and each transferred image was prepared by laser irradiation.

Reference example 2 is an example for showing the effect at the time when a relationship between the optical density per unit layer thickness and a layer thickness of the heat-light converting layer is changed.

Light-to-heat converting layer coating solution composition F

| | |
|---|---|
| Infrared absorbing dye (NK-2014, manufactured by Nippon Kanko Shikiso Co., Ltd.) | 7.6 parts |
| Polyimide resin (Rika Coat SN-20, manufactured by Shin Nihon Rika K.K., heat decomposition temperature: 510° C.) | 29.3 parts |
| N,N-Dimethylformamide | 1,500 parts |
| Methyl ethyl ketone | 360 parts |
| Surfactant (Megafac F-177, manufactured by Dainippon Chemicals and Ink Co., Ltd.) | 0.5 parts |
| Matting agent (Sea Hoster-KE-P150, silica particles, manufactured by Nippon Shokubai Co., Ltd.) | 1.5 parts |

Light-to-heat converting layer coating solution composition G

| | |
|---|---|
| Infrared absorbing dye (NK-2014, manufactured by Nippon Kanko Shikiso Co., Ltd.) | 7.6 parts |
| Polyimide resin (Rika Coat SN-20, manufactured by Shin Nihon Rika K.K., heat decomposition temperature: 510° C.) | 29.3 parts |
| N,N-Dimethylformamide | 1,500 parts |
| Methyl ethyl ketone | 360 parts |
| Surfactant (Megafac F-177, manufactured by Dainippon Chemicals and Ink Co., Ltd.) | 0.5 parts |
| Matting agent (Sea Hoster-KE-P150, silica particles, manufactured by Nippon Shokubai Co., Ltd.) | 1.6 parts |

-continued

Light-to-heat converting layer coating solution composition H

| | |
|---|---|
| Infrared absorbing dye (NK-2014, manufactured by Nippon Kanko Shikiso Co., Ltd.) | 7.6 parts |
| Polyimide resin (Rika Coat SN-20, manufactured by Shin Nihon Rika K.K., heat decomposition temperature: 510° C.) | 29.3 parts |
| N,N-Dimethylformamide | 1,500 parts |
| Methyl ethyl ketone | 360 parts |
| Surfactant (Megafac F-177, manufactured by Dainippon Chemicals and Ink Co., Ltd.) | 0.5 parts |
| Matting agent (Sea Hoster-KE-P150, silica particles, manufactured by Nippon Shokubai Co., Ltd.) | 1.4 parts |

The image obtained from the thus-obtained multicolor image-forming material was evaluated as follows, and the results obtained are shown in Table 3 below.

Evaluation of Image

Solid Part

○: Image-forming layer was clearly transferred.

_: Image-forming layer was not transferred and blank areas were partially seen.

×: Image-forming layer was deformed by heat and the reflection density was lowered, or a part of the light-to-heat converting layer was transferred to the image-receiving layer together with the image-forming layer.

Line Image Part

○: The line was transferred clearly.

_: part of the line became thin.

×: The non-image area was transferred.

TABLE 3

| | | Characteristics of Each Heat Transfer Sheet | | | | Evaluation of Image | | | |
|---|---|---|---|---|---|---|---|---|---|
| | | | | | | Solid Part | | Line Part | |
| | | Y | M | C | K | | | | |
| Ex. 2 | Absorbance (808 nm) | 1.10 | 1.13 | 1.20 | 1.03 | Y | ○ | Y | ○ |
| | Layer thickness (μm) | 0.32 | 0.33 | 0.35 | 0.30 | M | ○ | M | ○ |
| | Matting agent ratio* | No | No | No | No | C | ○ | C | ○ |
| | Light-to-heat conveerting Layer coating solution | A | A | A | A | K | ○ | K | ○ |
| Ex. 3 | Absorbance (808 nm) | 1.10 | 1.13 | 1.20 | 1.03 | Y | ○ | Y | ○ |
| | Layer thickness (μm) | 0.32 | 0.33 | 0.35 | 0.30 | M | ○ | M | ○ |
| | Matting agent ratio* | 1.0 | 1.0 | 1.0 | 1.0 | C | ○ | C | ○ |
| | Light-to-heat conveerting Layer coating solution | B | B | B | B | K | ○ | K | ○ |
| Ref. Ex. 1 | Absorbance (808 nm) | 1.10 | 1.13 | 1.20 | 1.03 | Y | ○ | Y | ○ |
| | Layer thickness (μm) | 0.35 | 0.35 | 0.35 | 0.35 | M | ○ | M | ○ |
| | Matting agent ratio* | 1.0 | 1.0 | 1.0 | 1.0 | C | ○ | C | ○ |

TABLE 3-continued

|  |  | Characteristics of Each Heat Transfer Sheet | | | | Evaluation of Image | | | |
|---|---|---|---|---|---|---|---|---|---|
|  |  | | | | | Solid Part | | Line Part | |
|  |  | Y | M | C | K | | | | |
| Ref. Ex. 2 | Light-to-heat conveerting Layer coating solution | C | D | B | E | K | — | K | — |
|  | Absorbance (808 nm) | 1.20 | 1.20 | 1.20 | 1.20 | Y | — | Y | — |
|  | Layer thickness (μm) | 0.35 | 0.35 | 0.35 | 0.35 | M | ○ | M | ○ |
|  | Matting agent ratio* | 0.90 | 0.95 | 1.0 | 0.86 | C | ○ | C | ○ |
|  | Light-to-heat conveerting layer coating solution | F | G | B | H | K | — | K | — |

* In the above Table 3, "matting agent ratio" means the relative ratio when the amount of matting agent/layer thickness of the light-to-heat converting layer prepared using light-to-heat converting layer coating solution B was taken as 1.

EXAMPLE 4

Preparation of Heat Transfer Sheet (Magenta)

1) Preparation of Light-to-heat Converting Layer Coating Solution

The following components were mixed with stirring by a stirrer and the light-to-heat converting layer coating solution was prepared.

| Composition of light-to-heat converting layer coating solution | |
|---|---|
| Infrared absorbing dye (S0121, manufactured by Hue Chemical Co., Ltd.) | 0.15 parts |
| Polyamide (AQ Nylon P-70, manufactured by Toray Industries Inc.) | 0.60 parts |
| Methanol | 17 parts |
| Distilled water | 17 parts |
| Matting agent (Sea Hoster-KE-P150, silica particles, manufactured by Nippon Shokubai Co., Ltd.) | 0.03 parts |

2) Formation of Light-to-heat Converting Layer on Support Surface

The above light-to-heat converting layer coating solution was coated with a wire bar coater on one surface (central line average surface roughness: 0.04 μm) of a polyethylene terephthalate film (support) having a thickness of 75 μm and a width of 65 cm, and the coated product was dried in an oven at 120° C. for 2 minutes, thus a light-to-heat converting layer was formed on the support. The optical density of the thus-obtained light-to-heat converting layer at wavelength of 808 nm measured was 1.18, and the layer thickness was 0.3 μm.

3) Preparation of Coating Solution of Magenta Image-forming Layer

The following components were put in a kneading mill, and pre-treatment was performed with adding a small amount of solvent and applying a shear force. A solvent was further added to the dispersion so as to reach the following composition, dispersion was performed for 2 hours with a paint shaler (manufactured by Toyo Seiki Co., Ltd.), thereby the mother solution of a pigment dispersion was obtained.

| Composition of magenta pigment dispersion mother solution | |
|---|---|
| Polyvinyl butyral (Eslec B BL-SH, manufactured by Sekisui Chemical Industries, Ltd.) | 12.6 parts |
| Magenta pigment (Symuler Brilliant Carmine 6B-229, manufactured by Dainippon Chemicals and Ink Co., Ltd.) | 15.0 parts |
| Dispersion assistant (Solspers S-20000, manufactured by ICI) | 0.6 parts |
| n-Propyl alcohol | 79.4 parts |

The following components were mixed with stirring by a stirrer to prepare a magenta image-forming layer coating solution.

| Composition of coating solution of magenta image-forming layer | |
|---|---|
| Above magenta pigment dispersion mother solution | 163 parts |
| Polyvinyl butyral (Eslec B BL-SH, manufactured by Sekisui Chemical Industries, Ltd.) | 12.6 parts |
| Wax-based compound | |
| Stearic acid amide (Newtron 2, manufactured by Nippon Seika Co., Ltd.) | 1.0 parts |
| Behenic acid amide (Diamid BM, (manufactured by Nippon Kasei Co., Ltd.) | 1.0 parts |
| Lauric acid amide (Diamid Y, (manufactured by Nippon Kasei Co., Ltd.) | 1.0 parts |
| Palmitic acid amide (Diamid KP, (manufactured by Nippon Kasei Co., Ltd.) | 1.0 parts |
| Erucic acid amide (Diamid L-200, (manufactured by Nippon Kasei Co., Ltd.) | 1.0 parts |
| Oleic acid amide (Diamid O-200, (manufactured by Nippon Kasei Co., Ltd.) | 1.0 parts |
| Nonionic surfactant (Chemistat 1100, manufactured by Sanyo Chemical Industries, Co., Ltd.) | 0.7 parts |
| Rosin (KE-311, (manufactured by Arakawa Kagaku Co., Ltd.) | 4.6 parts |
| Pentaerythritol tetraacrylate (NK ester A-TMMT, manufactured by Shin-Nakamura Kagaku Co., Ltd.) | 2.5 parts |
| Surfactant (Megafac F-176PF, solid content: 20%, manufactured by Dainippon Chemicals and Ink Co., Ltd.) | 1.3 parts |
| n-Propyl alcohol | 848 parts |
| Methyl ethyl ketone | 246 parts |

It was found that the particles in the thus-obtained magenta image-forming layer coating solution had an average particle size of 0.25 μm, and the ratio of the particles having a particle size of 1 μm or more was 0.5% from the measurement by particle size distribution measuring apparatus of laser scattering system.

4) Formation of Magenta Image-forming Layer on Light-to-heat Converting Layer

The above magenta image-forming layer coating solution was coated for 1 minute with a wheeler on the light-to-heat converting layer, and the coated product was dried in an oven at 100° C. for 2 minutes, thus a magenta image-forming layer was formed on the light-to-heat converting layer. By the above procedure, a heat transfer sheet M comprising a support having thereon a light-to-heat converting layer and a magenta image-forming layer in this order was prepared.

The transmittance optical density of the magenta image-forming layer of the thus-obtained heat transfer sheet was 0.73 measured by Macbeth densitometer TD-904 (W filter), and the layer thickness of the magenta image-forming layer was 0.38 µm on average.

By the above procedure, a heat transfer sheet M comprising a support having thereon a light-to-heat converting layer and a magenta image-forming layer in this order was prepared.

EXAMPLE 5

A heat transfer sheet was prepared in the same manner as in Example 4 except for changing the light-to-heat converting layer coating solution composition to the composition shown below.

| Light-to-heat converting layer coating solution composition | |
|---|---|
| Infrared absorbing dye (NK-2014, manufactured by Nippon Kanko Shikiso Co., Ltd.) | 0.15 parts |
| Vinyl chloride (Zeon Resin 40 × 150 M, manufactured by Nippon Zeon Co., Ltd.) | 0.60 parts |
| Methyl ethyl ketone | 17 parts |
| Cyclohexanone | 17 parts |
| Matting agent (Sea Hoster-KE-P150, silica particles, manufactured by Nippon Shokubai Co., Ltd.) | 0.03 parts |

REFERENCE EXAMPLE 3

A heat transfer sheet was prepared in the same manner as in Example 4 except for changing the light-to-heat converting layer coating solution composition to the composition shown below.

Reference example 3 is an example for showing the effect at the time when the half value width of the maximum absorbance at wavelength of 700 to 1,200 nm of the light-to-heat converting layer is changed.

| Light-to-heat converting layer coating solution composition | |
|---|---|
| Infrared absorbing dye (NK-2014, manufactured by Nippon Kanko Shikiso Co., Ltd.) | 0.15 parts |
| Polyester (Vylon 2000, manufactured by Toyo Boseki Co., Ltd.) | 0.60 parts |
| Methyl ethyl ketone | 17 parts |
| Cyclohexanone | 17 parts |
| Matting agent (Sea Hoster-KE-P150, silica particles, manufactured by Nippon Shokubai Co., Ltd.) | 0.03 parts |

REFERENCE EXAMPLE 4

A heat transfer sheet was prepared in the same manner as in Example 4 except for changing the light-to-heat converting layer coating solution composition to the composition shown below.

Reference example 4 is an example for showing the effect at the time when the half value width of the maximum absorbance at wavelength of 700 to 1,200 nm of the light-to-heat converting layer is changed.

| Light-to-heat converting layer coating solution composition | |
|---|---|
| Infrared absorbing dye (NK-2014, manufactured by Nippon Kanko Shikiso Co., Ltd.) | 0.15 parts |
| Polyester (Desmocol 1400, manufactured by Sumitomo Bayer Urethane Co., Ltd.) | 0.60 parts |
| Methyl ethyl ketone | 17 parts |
| Cyclohexanone | 17 parts |
| Matting agent (Sea Hoster-KE-P150, silica particles, manufactured by Nippon Shokubai Co., Ltd.) | 0.03 parts |

REFERENCE EXAMPLE 5

A heat transfer sheet was prepared in the same manner as in Example 4 except for changing the light-to-heat converting layer coating solution composition to the composition shown below.

Reference example 5 is an example for showing the effect at the time when the half value width of the maximum absorbance at wavelength of 700 to 1,200 nm of the light-to-heat converting layer is changed.

| Light-to-heat converting layer coating solution composition | |
|---|---|
| Infrared absorbing dye (S0121, manufactured by Hue Chemical Co., Ltd.) | 0.15 parts |
| Polyvinyl butyral (Eslec KX-1, manufactured by Sekisui Chemical Industries, Ltd.) | 0.60 parts |
| Methanol | 17 parts |
| Distilled water | 17 parts |
| Matting agent (Sea Hoster-KE-P150, silica particles, manufactured by Nippon Shokubai Co., Ltd.) | 0.03 parts |

Formation of Transferred Image

An image-receiving sheet (56 cm×79 cm, Final Proof Receiver, manufactured by Fuji Photo Film Co., Ltd.) was wound around the rotary drum having a diameter of 38 cm, provided with vacuum section holes having a diameter of 1 mm (surface density of 1 hole in the area of 3 cm×8 cm) and vacuum sucked. Subsequently, each of the above-prepared heat transfer sheet (heat transfer sheets of Examples 4 and and Reference Examples 3 to 5) cut into a size of 61 cm×84 cm was superposed on the image-receiving sheet so as to deviate uniformly, squeezed by a squeeze roller, and adhered and laminated so that air was sucked by section holes. The degree of pressure reduction in the state of section holes being covered was −150 mmHg per 1 atm (_81.13 kPa). The drum was rotated and semiconductor laser beams of the wavelength of 808 nm were condensed from the outside on the surface of the laminate on the drum so that the laser beams became a spot of a diameter of 7 µm on the surface of the light-to-converting layer, and laser image recording (line image) was performed on the laminate by moving the laser beam at a right angle (by-scanning) to the rotary direction of the drum (main scanning direction). The condition of irradiation was as follows. The laser beams used in the example was multi-beam two dimentional array comprising five rows along the main scanning direction and three rows along the by-scanning direction.

Laser power: 110 mW

Linear velocity (main scanning velocity): 7.5 m/sec

By-scanning pitch: 6.35 µm

The laminate finished laser recording was detached from the drum and the heat transfer sheet was released from the image-receiving sheet by hands. It was confirmed that only the irradiated domain of the image-forming layer of the heat transfer sheet had been transferred from the heat transfer sheet to the the image-receiving sheet.

Measurement of Half Value Width

The absorption spectrum of each of the samples in Examples 4 and 5 and Reference Examples 3 to 5, which were provided with only a light-to-converting layer, was measured using a spectrophotometer (UV2100, manufactured by Shimadzu Seisakusho Co. Ltd.). The half value width of the maximum absorbance of each sample was obtained from the spectrum.

Evaluation of Recording Sensitivity

It was revealed from the observation with an optical microscope that the irradiated area with laser beams was recorded in linear state. The recorded line width was measured, and sensitivity was obtained from the recorded line width by the following equation: Sensitivity (mJ/cm$^2$)= (laser power P (mW))/(line width d (cm)×linear velocity v (cm/s)).

The results obtained are shown in Table 4 below together with the half value width.

TABLE 4

| | Half Value Width (nm) | Recording Sensitivity (mJ/cm$^2$) |
| --- | --- | --- |
| Example 4 | 166 | 255 |
| Example 5 | 178 | 270 |
| Reference Example 3 | 271 | 460 |
| Reference Example 4 | 234 | 425 |
| Reference Example 5 | 225 | 395 |

EXAMPLE 6

Preparation of Heat Transfer Sheet (Magenta)

Formation of Backing Layer

The first backing layer was provided on the same polyethylene terephthalate support as used in Example 1 using the same first backing layer coating solution as in Example 1 in the same thickness and the same condition.

| Preparation of second backing layer coating solution | |
| --- | --- |
| Polyolefin (Chemipearl S-120, 27 mass%, manufactured by Mitsui Petrochemical Industries, Ltd.) | 3.0 parts |
| Antistatic agent (water dispersion of tin oxide-antimony oxide, average particle size: 0.1 µm, 17 mass %) | 2.0 parts |
| Colloidal silica (Snowtex C, 20 mass %, manufactured by Nissan Chemical Industries, Ltd.) | 2.0 parts |
| Epoxy resin (Dinacole EX-614B, manufactured by Nagase Kasei Co., Ltd.) | 0.3 parts |
| Distilled water to make the total amount | 100 parts |

Formation of Second Backing Layer

The second backing layer coating solution was coated on the first backing layer in dry coating thickness of 0.03 µm, dried at 170° C. for 30 seconds, thereby the second backing layer was prepared.

1) Preparation of Light-to-heat Converting Layer Coating Solution

The following components were mixed with stirring by a stirrer and the light-to-heat converting layer coating solution was prepared.

| Composition of light-to-heat converting layer coating solution | |
| --- | --- |
| Infrared absorbing dye (NK2014, a cyanine dye having the same structure as in Example 1) | 10 parts |
| Vinyl chloride-vinyl acetate copolymer (Solvine CL, manufactured by Nisshin Kagaku Co., Ltd.) | 40 parts |
| Methyl ethyl ketone (MEK) | 2,000 parts |
| Surfactant (Megafac F-176PF, solid content: 20%, manufactured by Dainippon Chemicals and Ink Co., Ltd.) | 1 part |
| Matting agent (Sea Hoster-KE-P150, silica particles, manufactured by Nippon Shokubai Co., Ltd.) | 2 parts |

2) Formation of Light-to-heat Converting Layer on Support Surface

The above light-to-heat converting layer coating solution was coated with a wire bar coater on the above absorption layer, and the coated product was dried in an oven at 100° C. for 2 minutes, thus a light-to-heat converting layer was formed on the support. The optical density of the thus-obtained light-to-heat converting layer at wavelength of 808 nm measured was 1.18, and the layer thickness was 0.3 µm.

3) Preparation of Coating Solution of Magenta Image-forming Layer

The following components were dispersed with a paint shaker (manufactured by Toyo Seiki Co., Ltd.) for 2 hours and glass beads were removed to make a pigment dispersion mother solution.

| Composition of magenta pigment dispersion mother solution | |
| --- | --- |
| Polyvinyl butyral (Eslec B BL-SH, manufactured by Sekisui Chemical Industries, Ltd.) | 12.6 parts |
| Pigment Red 57:1 (C.I. No. 15850:1) (Symuler Brilliant Carmine 6B-229, manufactured by Dainippon Chemicals and Ink Co., Ltd.) | 15.0 parts |
| Dispersion assistant (Solspers S-20000, manufactured by ICI) | 0.6 parts |
| n-Propyl alcohol | 79.4 parts |

Using the above pigment dispersion mother solution, the following components were mixed with stirring by a stirrer to prepare a magenta image-forming layer coating solution.

| Composition of coating solution of magenta image-forming layer | |
| --- | --- |
| Above magenta pigment dispersion mother solution | 163 parts |

-continued

| Composition of coating solution of magenta image-forming layer | |
|---|---|
| Polyvinyl butyral (Eslec B BL-SH, manufactured by Sekisui Chemical Industries, Ltd.) Wax-based compound | 8.6 parts |
| Stearic acid amide (Newtron 2, manufactured by Nippon Seika Co., Ltd.) | 1.0 parts |
| Behenic acid amide (Diamid BM, (manufactured by Nippon Kasei Co., Ltd.) | 1.0 parts |
| Lauric acid amide (Diamid Y, (manufactured by Nippon Kasei Co., Ltd.) | 1.0 parts |
| Palmitic acid amide (Diamid KP, (manufactured by Nippon Kasei Co., Ltd.) | 1.0 parts |
| Erucic acid amide (Diamid L-200, (manufactured by Nippon Kasei Co., Ltd.) | 1.0 parts |
| Oleic acid amide (Diamid O-200, (manufactured by Nippon Kasei Co., Ltd.) | 1.0 parts |
| Nonionic surfactant (Chemistat 1100, manufactured by Sanyo Chemical Industries, Co., Ltd.) | 0.7 parts |
| Rosin (KE-311, (manufactured by Arakawa Kagaku Co., Ltd.) (components: resin acid 80-97%, resin acid components: abietic acid: 30 to 40% neoabietic acid: 10 to 20% dihydroabietic acid: 14% tetrahydroabietic acid: 14%) | 4.6 parts |
| Pentaerythritol tetraacrylate (NK ester A-TMMT, manufactured by Shin-Nakamura Kagaku Co., Ltd.) | 2.5 parts |
| Surfactant (Megafac F-176PF, solid content: 20%, manufactured by Dainippon Chemicals and Ink Co., Ltd.) | 1.3 parts |
| n-Propyl alcohol | 1,000 parts |

It was found that the particles in the thus-obtained magenta image-forming layer coating solution had an average particle size of 0.25 $\mu$m, and the ratio of the particles having a particle size of 1 $\mu$m or more was 0.5% from the measurement by particle size distribution measuring apparatus of laser scattering system.

4) Formation of Magenta Image-forming Layer on Light-to-Heat Converting Layer

The above magenta image-forming layer coating solution was coated for 1 minute with a wire bar coater on the light-to-heat converting layer, and the coated product was dried in an oven at 100° C. for 2 minutes, thus a magenta image-forming layer was formed on the light-to-heat converting layer.

The transmittance optical density of the magenta image-forming layer of the thus-obtained heat transfer sheet was 0.91 measured by Macbeth densitometer TD-904 (W filter), and the layer thickness of the magenta image-forming layer was 0.4 $\mu$m on average.

The obtained image-forming layer had the following physical properties.

The surface roughness Ra of the image-forming layer is preferably 10 g or more when measured with a sapphire needle, and specifically 200 g or more.

The smooth value of the surface of the image-receiving layer at 23° C., 55% RH is preferably from 0.5 to 50 mmHg (=about 0.0665 to 6.65 kPa), and specifically 3.5 mmHg (=about 0.47 kPa).

The coefficient of static friction of the surface of the image-receiving layer is preferably 0.2 or less, and specifically 0.08.

EXAMPLE 7

A heat transfer sheet was prepared in the same manner as in Example 6 except for changing the vinyl chloride-vinyl acetate copolymer in the light-to-heat converting layer coating solution composition to polymethyl methacrylate (Dianal BR88, manufactured by Mitsubishi Rayon Co., Ltd.).

EXAMPLE 8

A heat transfer sheet was prepared in the same manner as in Example 6 except for changing the light-to-heat converting layer coating solution composition to the following composition.

| | |
|---|---|
| Carbon black dispersion (MHI #201, manufactured by Mikuni Shikiso Co., Ltd.) | 10 parts |
| Vinyl chloride-vinyl acetate copolymer (Solvine CL, manufactured by Nisshin Kagaku Co., Ltd.) | 40 parts |
| Methyl ethyl ketone (MEK) | 2,000 parts |
| Surfactant (Megafac F-176PF, solid content: 20%, manufactured by Dainippon Chemicals and Ink Co., Ltd.) | 1 part |
| Matting agent (Sea Hoster-KE-P150, silica particles, manufactured by Nippon Shokubai Co., Ltd.) | 2 parts |

REFERENCE EXAMPLE 6

A light-to-heat converting layer was prepared in the same manner as in Example 6, and coating was performed in the same manner as in Example 6, to thereby obtain a heat transfer sheet.

Reference example 6 is an example for showing the effect of the resin used in each of the light-to-heat converting layer and the image-forming layer.

| | |
|---|---|
| Distilled water | 1,260 parts |
| Polyvinyl alcohol (PVA 205, manufactured by Kurare Co., Ltd.) | 26 parts |
| Magenta pigment dispersion (Himicron GA Magenta 1, manufactured by Mikuni Shikiso Co., Ltd.) | 100 parts |

REFERENCE EXAMPLE 7

A heat transfer sheet was prepared in the same manner as in Example 6 except for changing the light-to-heat converting layer coating solution composition to the following composition.

Reference example 7 is an example for showing the effect of the resin used in each of the light-to-heat converting layer and the image-forming layer.

| | |
|---|---|
| Water | 3,500 parts |
| Polyvinyl alcohol (PVA-C118, manufactured by Kurare Co., Ltd.) | 60 parts |
| Water-soluble infrared absorbing dye (NK-3261, manufactured by Hayashibara Seibutsu Kagaku Kenkyu-Sho) | 17 parts |

-continued

| | |
|---|---|
| Matting agent (Sea Hoster-KE-P150, silica particles, manufactured by Nippon Shokubai Co., Ltd.) | 2 parts |

Preparation of Image-receiving Sheet

Image-Receiving Sheet 1

The cushioning layer coating solution and the image-receiving layer coating solution each having the following composition were prepared.

| 1) Cushioning layer coating solution | |
|---|---|
| Vinyl chloride-vinyl acetate copolymer (main binder, MRP-TSL, manufactured by Nisshin Kagaku Co., Ltd.) | 20 parts |
| Plasticizer (Paraplex G-40, manufactured by CP. HALL. COMPANY) | 10 parts |
| Surfactant (fluorine surfactant, coating assistan, Megafac F-177, manufactured by Dainippon Chemicals and Ink Co., Ltd.) | 0.5 parts |
| Antistatic agent (quaternary ammonium salt, SAT-5 Supper (IC), manufactured by Nippon Junyaku Co., Ltd.) | 0.3 parts |
| Methyl ethyl ketone | 60 parts |
| Toluene | 10 parts |
| N,N-Dimethylformamide | 3 parts |
| 2) Image-receiving layer coating solution | |
| Polyvinyl butyral (Eslec B BL-SH, manufactured by Sekisui Chemical Industries, Ltd.) | 10 parts |
| Antistatic agent Sanstat 2012A, manufactured by Sanyo Chemical Industries, Co., Ltd.) | 0.7 parts |
| Surfactant (Megafac F-177, manufactured by Dainippon Chemicals and Ink Co., Ltd.) | 1.0 part |
| n-Propyl alcohol | 500 parts |
| Methanol | 20 parts |
| 1-Methoxy-2-propanol | 50 parts |

The above-prepared cushioning layer coating solution was coated on a white PET support (Lumiler #130E58, manufactured by Toray Industries Inc., thickness: 130 μm) using a narrow-broad coater and the coated layer was dried, and then the image-receiving layer coating solution was coated and dried. The coating amounts were controlled so that the layer thickness of the cushioning layer after drying became about 20 μm and the layer thickness of the image-receiving layer became about 2 μm. The white PET support was a void-containing plastic support of a laminate (total thickness: 130 μm, specific gravity: 0.8) comprising a void-containing polyethylene terephthalate layer (thickness: 116 μm, void ratio: 20%), and titanium oxide-containing polyethylene terephthalate layers provided on both sides there of (thickness: 7 μm, titanium oxide content: 2%). The prepared material was wound in a roll, stored at room temperature for one week, then used in the image recording by laser beam as shown below.

The obtained image-receiving layer had the following physical properties.

The surface roughness Ra is preferably from 0.4 to 0.01 μm, and specifically 0.02 μm.

The undulation of the image-receiving layer is preferably 2 μm or less, and specifically 1.2 μm.

The smooth value of the surface of the image-receiving layer at 23° C., 55% RH is preferably from 0.5 to 50 mmHg (=about 0.0665 to 6.65 kPa), and specifically 0.8 mmHg (=about 0.11 kPa).

The coefficient of static friction of the surface of the image-receiving layer is preferably 0.8 or less, and specifically 0.3.

Image-Receiving Sheet 2

An image receiving sheet was prepared in the same manner as above except for changing the image-receiving layer coating solution composition of image-receiving sheet 1 to the following composition.

| | |
|---|---|
| Polyvinyl alcohol (PVA205, manufactured by Kurare Co., Ltd.) | 10 parts |
| Distilled water | 500 parts |

Image-receiving Sheet 3

An image receiving sheet was prepared in the same manner as above except for changing the image-receiving layer coating solution composition of image-receiving sheet 1 to the following composition.

| | |
|---|---|
| Vinyl chloride-vinyl acetate copolymer (Solvine CL, manufactured by Nisshin Kagaku Co., Ltd.) | 10 parts |
| Antistatic agent Sanstat 2012A, manufactured by Sanyo Chemical Industries, Co., Ltd.) | 0.7 parts |
| Surfactant (Megafac F-176P, manufactured by Dainippon Chemicals and Ink Co., Ltd.) | 1.0 part |
| n-Propyl alcohol | 500 parts |
| Methanol | 20 parts |
| 1-Methoxy-2-propanol | 50 parts |

Formation of Transferred Image

Each transferred image was formed as follows using the heat transfer sheets in Examples 6 to 8 and heat transfer sheets in Reference Examples 6 and 7. The image-receiving sheet was prepared using the same resin which was used in the image-forming layer of each heat transfer sheet to be combined with.

Image transfer operation was performed in the same condition as described in the item of "Formation of transferred image" in Example 1. The condition of irradiation was as follows. The laser beams used in the example was multi-beam two dimentional array comprising five rows along the main scanning direction and three rows along the by-scanning direction.

Laser power: 300 mW

Main scanning velocity: 5 m/sec

By-scanning pitch: 6.35 μm

The diameter of exposure drum is preferably 360 mm or more, specifically 380 mm was used.

The size of the image was 515 mm×728 mm, and the definition was 2,600 dpi.

The laminate finished laser recording was detached from the drum and the heat transfer sheet was released from the image-receiving sheet by hands. It was confirmed that only the irradiated domain of the image-forming layer of the heat transfer sheet had been transferred from the heat transfer sheet to the the image-receiving sheet.

Evaluation

Humidity Dependenty

Recording of flat dots was performed under the subcumstances of 23° C. 30% RH and 23° C. 70% RH, with Luxel FINALPROOF 560 (manufactured by Fuji Photo Film Co., Ltd.) and the definition of 2,438 dpi. The density of the recorded image was measured with a densitometer X-rite 938 (manufactured by X-rite Co.). The difference in densities due to humidity are shown in Table 5 below.

TABLE 5

| | Resin in Light-to Heat Converting Layer | Solvent | SP Value of Solvent | Light-to Heat Converting Material | Resin in Image-Forming Layer | Solvent | SP Value of Solvent | Difference in Density |
|---|---|---|---|---|---|---|---|---|
| Ex. 6 | vinyl chloride-vinyl acetate copolymer | MEK | 19 | NK2014 | polyvinyl butyral | propyl alcohol | 243 | 0.03 |
| Ex. 7 | polymethyl methacrylate | MEK | 19 | NK2014 | polyvinyl butyral | propyl alcohol | 243 | 0.03 |
| Ex. 8 | vinyl chloride-vinyl acetate copolymer | MEK | 19 | carbon black | polyvinyl butyral | propyl alcohol | 243 | 0.02 |
| Ref. Ex. 6 | vinyl chloride-vinyl acetate copolymer | MEK | 19 | NK2014 | polyvinyl butyral | distilled water | 479 | 0.09 |
| Ref. Ex. 7 | polyvinyl alcohol | distilled water | 479 | NH3261 | polyvinyl butyral | propyl alcohol | 243 | 0.12 |

With respect to SP value of each solvent, *Polymer Handbook*, 3rd Ed., VII/526–539 was referred to.

The recorded image using the heat transfer sheet of the present invention is less in difference in densities due to humidity and excellent in humidity dependency.

The materials for proof developed by the present inventors are based on the membrane transfer technique, and as a result for solving novel problems in laser transfer technique and further improving the image quality, the present inventors have developed a heat transfer recording system by laser irradiation for DDCP which comprises an image-forming material of B2 size or larger having performances of transfer to actual printing paper, reproduction of actual dots and of a pigment type, output driver, and high grade CMS software. Thus, a system capable of sufficiently exhibiting the materials of high definition could be realized. Specifically, the present invention can provide proof corresponding to CTP system and contract proof substituting analog style color proof. By this proof, color reproduction which coincides with the printed matters for obtaining the approval of customers and analog style color proof can be realized. The present invention can provide DDCP system which uses the same pigment materials as used in the printing inks, effects transfer to actual paper and generates no moire. The present invention can also provide a large sized high grade DDCP (A2/ B2 or more) capable of transfer to actual paper and capable of using the same pigment materials as used in the printing inks. The system of the present invention is a system adopting laser membrane transfer, using pigment coloring materials and capable of transferring to actual paper by real dot recording. According to the multicolor image-forming system according to the present invention, even when laser recording by high energy using multi-beam two dimentional array under different temperature humidity conditions is performed, an image having good image quality and stable transfer density can be formed on the image-receiving sheet.

While the invention has been described in detail and with reference to specific examples thereof, it will be apparent to one skilled in the art that various changes and modifications can be made therein without departing from the spirit and scope thereof.

The entire disclosure of each and every foreign patent application from which the benefit of foreign priority has been claimed in the present application is incorporated herein by reference, as if fully set forth.

What is claimed is:

1. A multicolor image-forming material comprising:
an image-receiving sheet having an image-receiving layer; and
at least four thermal transfer sheets each including a support, a light-to-heat converting layer and an image-forming layer, in which each of the thermal transfer sheets has a different color,
wherein an image is formed by: superposing the image-forming layer in each of the at least four thermal transfer sheets on the image-receiving layer in the image-receiving sheet, in which the image-forming layer is opposed to the image-receiving layer; irradiating the image-forming layer in each of the at least four thermal transfer sheets with a laser beam having an output of 50 mW or more at a linear velocity of 7 m/s or more; and transferring the irradiated area of the image-forming layer onto the image-receiving layer in the image-receiving sheet,
each of the light-to-heat converting layers in the at least four thermal transfer sheets has a ratio of an optical density (OD) to a layer thickness; OD/layer thickness (urn unit) of 0.57 or more, and
wherein the transferred image has a resolution of 2,400 dpi or more,
the recording area of the multicolor image is a size of 515 mm or more multiplying 728 mm or more.
each of the image-forming layers in the at least four thermal transfer sheets has a ratio of an optical density (OD) to a layer thickness: OD/layer thickness ($\mu$m unit) of 1.50 or more,
the image-forming layer is provided directly on the light-to-heat converting layer, and
the light-to-heat converting layer contains a matting agent having a particle size of 0.3 to 30 $\mu$m, wherein the at least four thermal transfer sheets have four or more colors including yellow, magenta, cyan and black, and each of the at least four thermal transfer sheets has a different color, and each of the light-to-heat converting layers in the at least four thermal transfer sheets has a different optical density per the light-to-heat converting layer, in which each of the light-to-heat converting layers in the at least four thermal transfer sheets each having a different color has the same optical density per unit thickness of the light-to-heat converting layer and has a different layer thickness.

2. The multicolor image-forming material as claimed in claim 1, wherein each of the light-to-heat converting layers in the at least four thermal transfer sheets each having a different color is formed with the same coating solution.

3. The multicolor image-forming material as claimed in claim 1, wherein the light-to-heat converting layer in the black thermal transfer sheet has the lowest optical density in the at least four thermal transfer sheets.

4. The multicolor image-forming material as claimed in claim 1, wherein the image-receiving sheet includes a support, and each of the light-to-heat converting layers in the at least four thermal transfer sheets each having a different color contains a matting agent in a different amount.

5. The multicolor image-forming material as claimed in claim 4, wherein each of the light-to-heat converting layers in the at least four thermal transfer sheets each having a different color has the same content of the matting agent per unit thickness of the light-to-heat converting layer and has a different layer thickness.

6. The multicolor image-forming material as claimed in claim 4, wherein each of the light-to-heat converting layers in the at least four thermal transfer sheets each having a different color is formed with the same coating solution.

7. The multicolor image-forming material as claimed in claim 4, wherein the light-to-heat converting layer in the black thermal transfer sheet has the lowest content of the matting agent in the at least four thermal transfer sheets.

8. The multicolor image-forming material as claimed in claim 1, wherein the light-to-heat converting layer has an optical density of from 0.80 to 1.49 at peak wavelength of the laser beam.

9. The multicolor image-forming material as claimed in claim 1, wherein the light-to-heat converting layer contains a light-to-heat converting agent and the light-to-heat converting agent is a compound other than carbon black, graphite and colloidal silver.

10. The multicolor image-forming material as claimed in claim 9, wherein the light-to-heat converting agent is a cyanine dye.

11. The multicolor image-forming material as claimed in claim 1, wherein the light-to-heat converting layer contains a light-to-heat converting material and a resin, and the half value width of the maximum absorbance at wavelength of 700 to 1,200 nm of the light-to-heat converting layer is 200 nm or less.

12. The multicolor image-forming material as claimed in claim 11, wherein the thermal transfer sheet includes an intermediate layer between the light-to-heat converting layer and the image-forming layer.

13. The multicolor image-forming material as claimed in claim 11, wherein the light-to-heat converting material is an infrared absorbing dye.

14. The multicolor image-forming material as claimed in claim 13, wherein the infrared absorbing dye is a cyanine dye.

15. The multicolor image-forming material as claimed in claim 1, wherein each of the light-to-heat converting layer and the image-forming layer contains a water-insoluble resin and the recorded image has a resolution of 2,400 dpi or more.

16. The multicolor image-forming material as claimed in claim 15, wherein the resin in the light-to-heat converting layer is soluble in a hydrophobic solvent having an SP value of from 16 to 22.

17. The multicolor image-forming material as claimed in claim 15, wherein the resin in the image-forming layer is soluble in a nonaqueous solvent having an SP value of from 16 to 30.

18. The multicolor image-forming material as claimed in claim 15, wherein a hydrophobic solvent is used for dissolving the resin when the light-to-heat converting layer is provided, and a nonaqueous solvent is used for solving the resin when the image-forming layer is provided.

19. The multicolor image-forming material as claimed in claim 15, wherein the light-to-heat converting material in the light-to-heat converting layer has the solubility of 1 weight % or less in a coating solvent for forming the image-forming layer.

20. The multicolor image-forming material as claimed in claim 15, wherein the resin in the light-to-heat converting layer has the solubility of 1 weight % or less in a coating solvent for forming the image-forming layer.

21. The multicolor image-forming material as claimed in claim 15, wherein the resin in the light-to-heat converting layer has the solubility of 0.1 weight % or more in the coating solvent for forming the light-to-heat converting layer.

22. The multicolor image-forming material as claimed in claim 15, wherein the light-to-heat converting material has the solubility of 0.1 weight % or more in the coating solvent for forming the light-to-heat converting layer.

23. The multicolor image-forming material as claimed in claim 15, wherein the light-to-heat converting material is an infrared absorbing dye.

24. The multicolor image-forming material as claimed in claim 15, wherein the resin of the image-forming layer has the solubility of 0.1 weight % or more in the coating solvent for forming the image-forming layer.

25. The multicolor image-forming material as claimed in claim 15, wherein the thermal transfer sheet includes an intermediate layer between the light-to-heat converting layer and the image-forming layer.

26. The multicolor image-forming material as claimed in claim 1, wherein the transferred image has a resolution of 2,600 dpi or more.

27. The multicolor image-forming material as claimed in claim 1, wherein the recording area of the multicolor image is a size of 594 mm or more multiplying 841 mm or more.

28. The multicolor image-forming material as claimed in claim 1, wherein the OD/layer thickness ($\mu$m unit) of each of the image forming layers in the at least four thermal transfer sheets is 1.80 or more.

29. The multicolor image-forming material as claimed in claim 28, wherein the OD/layer thickness of each of the image-forming layers in the at least four thermal transfer sheets ($\mu$m unit) is 2.50 or more.

30. The multicolor image-forming material as claimed in claim 1, wherein the image-forming layer in each of the at least four thermal transfer sheets and the image-receiving layer in the image-receiving sheet each has a contact angle with water of from 7.0 to 120.0°.

31. The multicolor image-forming material as claimed in claim 1, wherein the ratio of an optical density (OD) of the image-forming layer in each of the at least four thermal transfer sheets to a thickness of the image-forming layer: OD/layer thickness ($\mu$m unit) is 1.80 or more and the image-receiving layer in the image-receiving sheet has a contact angle with water of 860° or less.

32. A method for manufacturing the multicolor image-forming material as claimed in claim 1, which comprises performing a successive coating.

* * * * *